(12) United States Patent
Cheah et al.

(10) Patent No.: US 11,028,471 B2
(45) Date of Patent: Jun. 8, 2021

(54) SAPPHIRE THIN FILM COATED SUBSTRATE

(71) Applicant: HKBU R&D LICENSING LIMITED, Hong Kong (HK)

(72) Inventors: Kok Wai Cheah, Hong Kong (HK); Wing Yui Lam, Hong Kong (HK); Yu Wai Chan, Hong Kong (HK)

(73) Assignee: HKBU R&D LICENSING LIMITED, Hong Kong (HK)

( * ) Notice: Subject to any disclaimer, the term of this patent is extended or adjusted under 35 U.S.C. 154(b) by 0 days.

(21) Appl. No.: 16/339,377

(22) PCT Filed: Sep. 27, 2017

(86) PCT No.: PCT/CN2017/103698
§ 371 (c)(1),
(2) Date: Apr. 4, 2019

(87) PCT Pub. No.: WO2018/064947
PCT Pub. Date: Apr. 12, 2018

(65) Prior Publication Data
US 2019/0242004 A1    Aug. 8, 2019

Related U.S. Application Data

(63) Continuation of application No. 15/597,170, filed on May 17, 2017, now Pat. No. 9,932,663, which is a
(Continued)

(51) Int. Cl.
C23C 14/02 (2006.01)
C23C 14/08 (2006.01)
(Continued)

(52) U.S. Cl.
CPC .............. *C23C 14/081* (2013.01); *C03C 3/06* (2013.01); *C03C 17/245* (2013.01); *C03C 17/36* (2013.01);
(Continued)

(58) Field of Classification Search
CPC ....... C23C 3/06; C23C 14/024; C23C 14/081; C23C 14/10; C23C 14/30; C23C 14/34;
(Continued)

(56) References Cited

U.S. PATENT DOCUMENTS 5,885,712 A    3/1999    Otani et al.
2010/0060979 A1*    3/2010    Harris ................... G02B 1/115
                                                                        359/359
(Continued)

FOREIGN PATENT DOCUMENTS

CN    101095063 A    12/2007
CN    102409293 A    4/2012
(Continued)

OTHER PUBLICATIONS

P. Winkowski, Konstanty W. Marszalek, "Wide band antireflective coatings Al2O3 / HfO2 / MgF2 for UV region ," Proc. SPIE 8902, Electron Technology Conference 2013, 890228 (Jul. 25, 2013). (Year: 2013).*
(Continued)

*Primary Examiner* — Bijan Ahvazi
(74) *Attorney, Agent, or Firm* — Idea Intellectual Limited; Margaret A. Burke; Sam T. Yip

(57) ABSTRACT

A composition of AR layer that is aimed to match the refractive index of the underlying substrate e.g. glass, chemically strengthened glass, plastics etc., so as maximum light is transmitting through it. For a device with an sapphire film for anti-scratch protection, because sapphire has a different refractive index to that of the substrate, therefore
(Continued)

existing AR layer will not function as well as it should; not only the transmitted light is reduced in quantity, its transmitted range will be changed such that imaging or display color is compromised. Therefore an integrated AR with sapphire film with the top most AR layer as $Al_2O_3$ which also acts as anti-scratching layer will eliminate this problem. This claim involves replacing one of the materials for AR layer is $Al_2O_3$ such that the top most AR layer as $Al_2O_3$ which also acts as anti-scratching layer.

19 Claims, 46 Drawing Sheets

Related U.S. Application Data continuation-in-part of application No. 14/642,742, filed on Mar. 9, 2015, now Pat. No. 9,695,501, and a continuation-in-part of application No. 14/849,606, filed on Sep. 10, 2015, now Pat. No. 10,072,329, which is a continuation-in-part of application No. 14/642,742, filed on Mar. 9, 2015, now Pat. No. 9,695,501, and a continuation-in-part of application No. 13/726,127, filed on Dec. 23, 2012, now Pat. No. 9,610,754, and a continuation-in-part of application No. 13/726,183, filed on Dec. 23, 2012, now Pat. No. 9,227,383.

(60) Provisional application No. 62/405,215, filed on Oct. 6, 2016, provisional application No. 62/409,352, filed on Oct. 17, 2016, provisional application No. 62/339,074, filed on May 19, 2016, provisional application No. 62/375,433, filed on Aug. 15, 2016, provisional application No. 62/049,364, filed on Sep. 12, 2014, provisional application No. 62/183,182, filed on Jun. 22, 2015, provisional application No. 61/579,668, filed on Dec. 23, 2011.

(51) Int. Cl.
| | | |
|---|---|---|
| C23C 14/10 | (2006.01) | |
| C23C 14/22 | (2006.01) | |
| C23C 14/30 | (2006.01) | |
| C23C 14/34 | (2006.01) | |
| C23C 14/58 | (2006.01) | |
| C03C 3/06 | (2006.01) | |
| C03C 17/36 | (2006.01) | |
| C03C 17/245 | (2006.01) | |

(52) U.S. Cl.
CPC ...... *C03C 17/3639* (2013.01); *C03C 17/3644* (2013.01); *C03C 17/3649* (2013.01); *C23C 14/024* (2013.01); *C23C 14/10* (2013.01); *C23C 14/221* (2013.01); *C23C 14/30* (2013.01); *C23C 14/34* (2013.01); *C23C 14/3464* (2013.01); *C23C 14/5806* (2013.01); *C03C 2217/214* (2013.01); *C03C 2218/15* (2013.01); *C03C 2218/32* (2013.01); *C03C 2218/328* (2013.01); *C03C 2218/33* (2013.01)

(58) Field of Classification Search
CPC .............. C23C 14/221; C23C 14/3464; C23C 14/5806; C23C 17/36; C23C 17/245; C23C 17/3639; C23C 17/3644; C23C 17/3649; C23C 2217/214; C23C 2218/15; C23C 2218/32; C23C 2218/33; C23C 2218/328; G02B 1/11; C03C 3/06; C03C 17/36; C03C 17/245; C03C 17/3639; C03C 17/3644; C03C 17/3649; C03C 2217/214; C03C 2218/15; C03C 2218/32; C03C 2218/33; C03C 2218/328

See application file for complete search history.

(56) References Cited

U.S. PATENT DOCUMENTS

| | | | | |
|---|---|---|---|---|
| 2011/0203663 A1* | 8/2011 | Prather | ............... | G02B 5/1861 |
| | | | | 136/259 |
| 2013/0168018 A1 | 7/2013 | Casimiro et al. | | |
| 2014/0133074 A1 | 5/2014 | Zahler et al. | | |
| 2014/0272298 A1* | 9/2014 | Memering | ............. | C23C 28/04 |
| | | | | 428/142 |

FOREIGN PATENT DOCUMENTS

| | | |
|---|---|---|
| CN | 104044307 A | 9/2014 |
| CN | 204795193 U | 11/2015 |
| JP | 59111999 A | 6/1984 |
| JP | 04232250 A | 8/1992 |
| JP | 04301084 A | 10/1992 |
| JP | 05127004 A | 5/1993 |
| JP | 05294796 A | 11/1993 |
| JP | 098690 A | 1/1997 |
| JP | 1046323 A | 2/1998 |
| JP | 10261244 A | 9/1998 |
| JP | 2003149406 A | 5/2003 |
| JP | 2003273014 A | 9/2003 |
| JP | 2004085231 A | 3/2004 |
| JP | 2006114552 A | 4/2006 |
| JP | 2009060102 A | 3/2009 |
| JP | 2009073071 A | 4/2009 |
| JP | 2011006793 A | 1/2011 |
| KR | 10-2015-0118760 A | 10/2015 |
| WO | 2002/075026 A1 | 9/2002 |
| WO | 2013091582 A1 | 6/2013 |
| WO | 2015081987 A1 | 6/2015 |
| WO | 2015137950 A1 | 9/2015 |
| WO | 2016037590 A1 | 3/2016 |

OTHER PUBLICATIONS

Nemo Biluš Abaffy, Peter Evans, Gerry Triani, Dougal McCulloch, "Multilayer alumina and titania optical coatings prepared by atomic layer deposition," Proc. SPIE 7041, Nanostructured Thin Films, 704109 (Sep. 10, 2008) (Year: 2008).*
C. Li, F. Shahriarian, and M. S. Goorskya,Determination of Atomic-Layer-Deposited Multilayer Antireflection Coating Parameters Using a Novel X-Ray Reflectivity Approach, ECS Transactions, 75 (6) 155-163 (2016) (Year: 2016).*
Search Report of China Patent Application No. 2015800529431 dated Jun. 22, 2018.
Search Report of Taiwan Patent Application No. 106133170 dated Nov. 21, 2018.
Office Action of Japan Patent Application No. 2018-107626 dated Mar. 12, 2019.
Ashok Chaudhari et al., Crystalline Al2O3 on buffered soda-lime glass by e-beam, Materials Letters, Dec. 1, 2014, pp. 407-410, vol. 136, Elsevier, Amsterdam, Netherlands.
Office Action of Korean Patent Application No. 10-2018-7032102 dated Jan. 11, 2019.
Office Action of Korean Patent Application No. 10-2018-7032102 dated May 24, 2019.
European Search Report of corresponding European Patent Application No. 17857828.2 dated May 26, 2020.
Office Action issued in corresponding Korean patent application No. 10-2019-7012386 dated Dec. 23, 2020.

* cited by examiner

| Mohs hardness | Mineral | Chemical formula | Absolute hardness | Image |
|---|---|---|---|---|
| 1 | Talc | $Mg_3Si_4O_{10}(OH)_2$ | 1 | 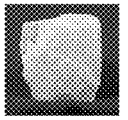 |
| 2 | Gypsum | $CaSO_4 \cdot 2H_2O$ | 3 |  |
| 3 | Calcite | $CaCO_3$ | 9 |  |
| 4 | Fluorite | $CaF_2$ | 21 |  |
| 5 | Apatite | $Ca_5(PO_4)_3(OH^-,Cl^-,F^-)$ | 48 | 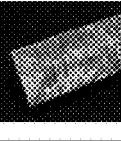 |
| 6 | Feldspar | $KAlSi_3O_8$ | 72 |  |
| 7 | Quartz | $SiO_2$ | 100 |  |
| 8 | Topaz | $Al_2SiO_4(OH^-,F^-)_2$ | 200 |  |
| 9 | Corundum/Sapphire | $Al_2O_3$ | 400 |  |
| 10 | Diamond | C | 1600 |  |
Figure 1 (Prior Art)

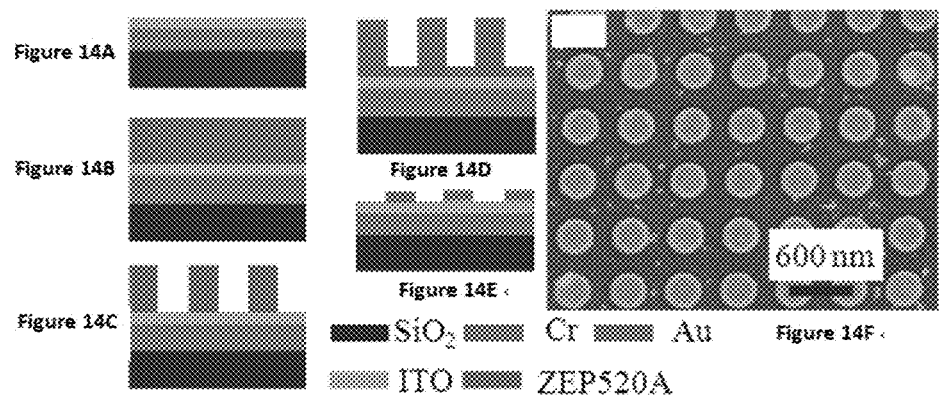
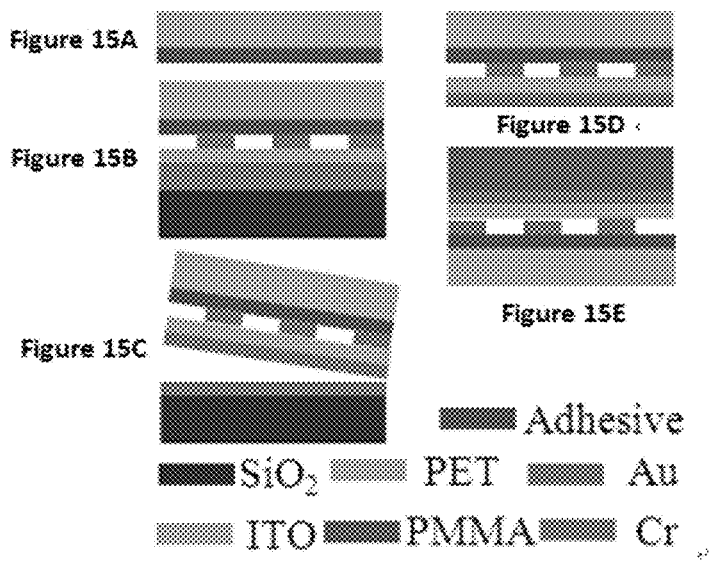

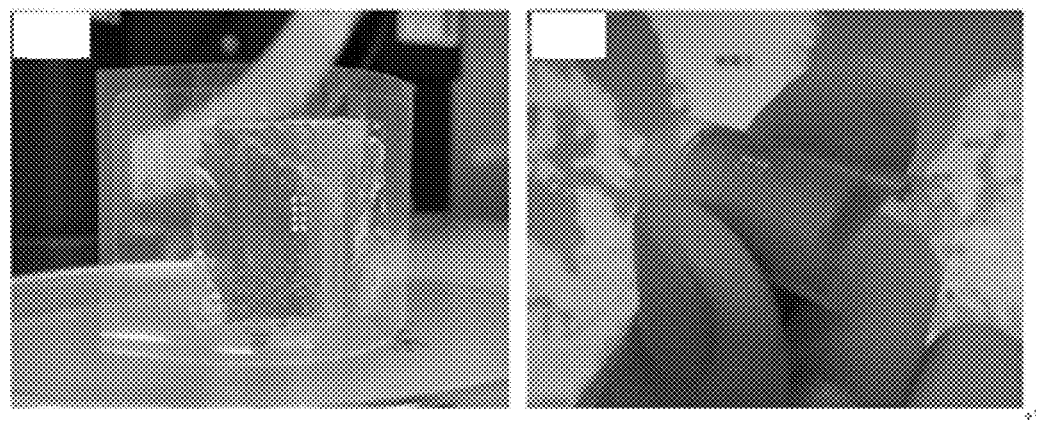
Figure 16A                    Figure 16B
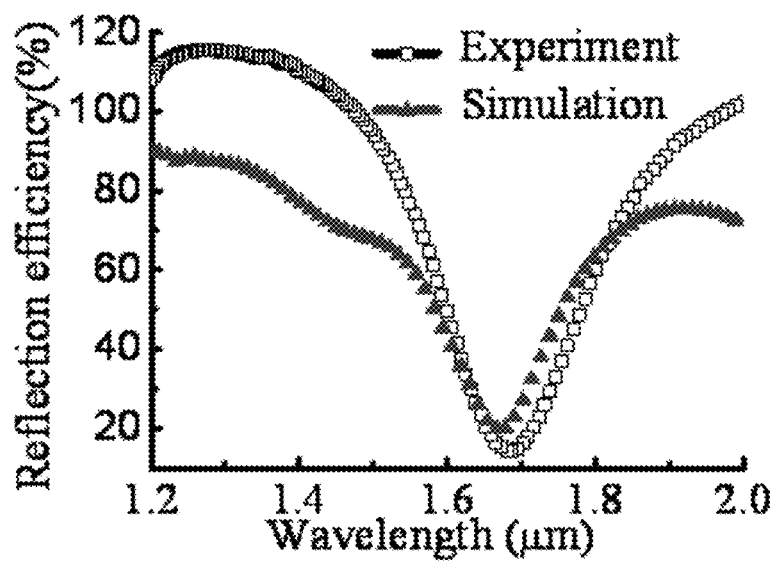
Figure 17

SAPPHIRE THIN FILM COATED SUBSTRATE

CROSS-REFERENCE TO RELATED APPLICATIONS

This application claims the benefit of: (1) U.S. Provisional Patent Application Ser. No. 62/405,215 filed on Oct. 6, 2016; (2) U.S. Provisional Patent Application Ser. No. 62/409,352 filed on Oct. 17, 2016; and (3) U.S. Non-Provisional patent application Ser. No. 15/597,170 filed on May 17, 2017, which claims priority from U.S. Provisional Patent Application Ser. No. 62/339,074 filed on May 19, 2016 and U.S. Provisional Patent Application Ser. No. 62/375,433 filed on Aug. 15, 2016, and is a Continuation-in-part of U.S. Non-Provisional patent application Ser. No. 14/849,606 filed on Sep. 10, 2015, which claims priority from U.S. Provisional Patent Application Ser. No. 62/183,182 filed on Jun. 22, 2015, and is a Continuation-in-part of U.S. Non-Provisional patent application Ser. No. 14/642,742 filed on Mar. 9, 2015, which claims priority from U.S. Provisional Patent Application Ser. No. 62/049,364 filed on Sep. 12, 2014, and is a Continuation-in-part of U.S. Non-Provisional patent application Ser. No. 13/726,183 filed on Dec. 23, 2012 and U.S. Non-Provisional patent application Ser. No. 13/726,127 filed on Dec. 23, 2012, which claims priority from U.S. Provisional Patent Application Ser. No. 61/579,668 filed on Dec. 23, 2011; the disclosures of all the above referenced patent applications are hereby incorporated by reference in their entirety.

FIELD OF THE INVENTION

The present invention relates to a composition of anti-reflective (AR) layer that is aimed to match the refractive index of the underlying substrate e.g. glass, chemically strengthened glass, plastics, etc., so as to maximize light transmission through it. For a device with a sapphire film for anti-scratch protection, because sapphire has a different refractive index to that of the substrate, existing AR layer will not function as well as it should. Not only the transmitted light is reduced in quantity, its transmitted range will be changed such that imaging and/or display color are compromised. Therefore, an integrated AR with sapphire film with the top most AR layer as $Al_2O_3$ which also acts as anti-scratching layer will eliminate this problem. Particularly, the present invention relates to methods and apparatuses that replace one of the materials in the AR layer with $Al_2O_3$ such that the top most AR layer is $Al_2O_3$ which also acts as anti-scratching layer.

BACKGROUND OF THE INVENTION

Sapphire is presently being actively considered as screen for smart phones and tablets. It is the second hardest material after diamond so using it as screen would mean the smart phone/tablet has a superior scratch and crack resistant screen. Sapphire screen is already being featured in Apple iPhone 5S TouchID scanner and camera lens on the rear of the phone. Vertu, the luxury smartphone manufacturer, is also developing sapphire screen. However, since sapphire is the second hardest material, it is also difficult to be cut and polished. Coupled by the fact that the growth of a single large size crystal sapphire is time consuming, this results in long fabrication time and high fabrication cost. It is the high fabrication cost and long fabrication time of sapphire screen that limit Apple's use of such sapphire screen to only Apple Watch.

A current popular 'tough' screen material use is the Gorilla Glass made by Corning, which is being used in over 1.5 billion devices. Sapphire is in fact harder to be scratched than Gorilla Glass and this has been verified by several third-party institutes such as Center for Advanced Ceramic Technology at Alfred University's Kazuo Inamori School of Engineering. On the Mohs scale of hardness, the newest Gorilla Glass only scores 6.5 Mohs which is below the Mohs value of mineral quartz. As such, Gorilla Glass is still easy to be scratched by sand and metals. Sapphire is the second hardest naturally occurring material on the planet, behind diamond which scores 10 on the Mohs scale of mineral hardness.

Mohs hardness test is to characterize the scratch resistance of minerals through the ability of a harder material to scratch a softer material. It matches one substance's ability to scratch another, and so it is a better indicator of scratch resistance than shatter resistance. This is shown in FIG. 1.

Following is quotations from 'Display Review' on sapphire screen:

"Chemically strengthened glass can be excellent, but sapphire is better in terms of hardness, strength, and toughness" Hall explained, adding "the fracture toughness of sapphire should be around four times greater than Gorilla Glass—about 3 MPa-m0.5 versus 0.7 MPa-m0.5, respectively."

This comes with some rather large downsides though. Sapphire is both heavier at 3.98 g per cubic cm (compared to the 2.54 g of Gorilla Glass) as well as refracting light slightly more.

So apart from being heavier, sapphire being the second hardest material is also a difficult material to cut and polish. Growing single crystal sapphire is time consuming especially when the diameter size is large (>6 inches), this is technically very challenging. Therefore the fabrication cost is high and fabrication time is long for sapphire screen. It is an objective of the present invention to provide fabrication means of sapphire screen materials that is quick to fabricate and low in cost while having the following advantages:

Harder than any hardened glass;
Less possibility of fragmentation than pure sapphire screen;
Lighter weight than pure sapphire screen;
Higher transparency than pure sapphire screen.

For hardening of sapphire ($Al_2O_3$) thin film deposition, softening/melting temperature of softer substrate should be sufficiently higher than the annealing temperature. Most rigid substrates such as quartz, fused silica can meet this requirement. However, flexible substrate such as polyethylene terephthalate (PET) would not be able to meet the requirement. PET has a melting temperature of about 250° C., which is way below the annealing temperature. PET is one of the most widely used flexible substrates. The ability of transferring a substrate of $Al_2O_3$ (sapphire) thin films on to a softer flexible will significantly broaden its applications from rigid substrates like glass and metals to flexible substrates like PET, polymers, plastics, paper and even to fabrics. Mechanical properties of transferred substrate can then be improved. Therefore, $Al_2O_3$ thin films transfer from rigid substrate to flexible substrate can circumnavigate this problem of the often lower melting temperatures of flexible substrates.

Anti-reflection (AR) layer is commonly used in reducing optical loss or reflection in glass or transparent plastic to improve light collection or brighten display screen. Therefore, the function of AR layer is to improve the efficiency of, for example imaging and information display. AR layer in general composed of at least two optically transparent materials that have a significant difference in refractive index forming a periodic structure from depositing alternate layer of these two materials. Then the interference created within the periodic structure can enhance transmission with a specific transmission range. Nonetheless, the AR layer is susceptible to scratch. Thus, it is an objective of the present invention to design an AR layer which has both the optical properties of a common AR layer and has a scratch-proof sapphire outer thin film coating, forming part of the AR layer.

SUMMARY OF THE INVENTION

In accordance with a first aspect of the present invention, there is provided a method to transfer a layer of harder thin film substrate onto a softer, flexible substrate. In particular, the present invention provides a method to transfer a layer of sapphire thin film onto a softer, flexible substrate e.g. PET, polymers, plastics, paper and even to fabrics. This combination is better than pure sapphire substrate.

In accordance with a second aspect of the present invention, there is provided a method for coating sapphire ($Al_2O_3$) onto a flexible substrate comprising: a first deposition process to deposit at least one first thin film onto at least one first substrate to form at least one first thin film coated substrate; a second deposition process to deposit at least one second thin film onto the at least one first thin film coated substrate to form at least one second thin film coated substrate; a third deposition process to deposit at least one catalyst onto the at least one second thin film coated substrate to form at least one catalyst coated substrate; a fourth deposition process to deposit at least one sapphire ($Al_2O_3$) thin film onto the at least one catalyst coated substrate to form at least one sapphire ($Al_2O_3$) coated substrate; an annealing process wherein said at least one sapphire ($Al_2O_3$) coated substrate annealed under an annealing temperature ranging from 300° C. to less than a melting point of sapphire ($Al_2O_3$) for an effective duration of time to form at least one hardened sapphire ($Al_2O_3$) thin film coated substrate; attaching at least one flexible substrate to the at least one hardened sapphire ($Al_2O_3$) thin film coated substrate on the at least one sapphire ($Al_2O_3$) thin film; a mechanical detachment process detaching the at least one hardened sapphire ($Al_2O_3$) thin film together with the at least one second thin film from the at least one first thin film coated substrate to form at least one second thin film coated hardened sapphire ($Al_2O_3$) thin film on said at least one flexible substrate; and an etching process removing the at least one second thin film from the at least one second thin film coated hardened sapphire ($Al_2O_3$) thin film on said at least one flexible substrate to form at least one sapphire ($Al_2O_3$) thin film coated flexible substrate.

The method according to the second aspect of the present invention, wherein said first and/or said flexible substrate comprises at least one material with a Mohs value less than that of said at least one sapphire ($Al_2O_3$) thin film.

In a first embodiment of the second aspect of the present invention there is provided the method wherein said first and/or second and/or third and/or fourth deposition process (es) comprise(s) e-beam deposition and/or sputtering deposition.

In a second embodiment of the second aspect of the present invention there is provided the method wherein said at least one sapphire ($Al_2O_3$) coated substrate and/or at least one hardened sapphire ($Al_2O_3$) coated substrate and/or at least one second thin film coated hardened sapphire ($Al_2O_3$) thin film on said at least one flexible substrate and/or at least one sapphire ($Al_2O_3$) thin film coated flexible substrate comprise(s) at least one sapphire ($Al_2O_3$) thin film.

In a third embodiment of the second aspect of the present invention there is provided the method wherein a thickness of said at least one first substrate and/or said at least one flexible substrate is of one or more orders of magnitude greater than the thickness of said at least one sapphire ($Al_2O_3$) thin film.

In a fourth embodiment of the second aspect of the present invention there is provided the method wherein the thickness of said at least one sapphire ($Al_2O_3$) thin film is about $\frac{1}{1000}$ of the thickness of said at least one first substrate and/or said at least one flexible substrate.

In a fifth embodiment of the second aspect of the present invention there is provided the method wherein said at least one sapphire ($Al_2O_3$) thin film has the thickness between 150 nm and 600 nm.

In a sixth embodiment of the second aspect of the present invention there is provided the method wherein said effective duration of time is no less than 30 minutes.

In a seventh embodiment of the second aspect of the present invention there is provided the method wherein said effective duration of time is no more than 2 hours.

In an eighth embodiment of the second aspect of the present invention there is provided the method wherein said annealing temperature ranges between 850° C. and 1300° C.

In a ninth embodiment of the second aspect of the present invention there is provided the method wherein said annealing temperature ranges between 1150° C. and 1300° C.

In a tenth embodiment of the second aspect of the present invention there is provided the method wherein said at least one material comprising quartz, fused silica, silicon, glass, toughen glass, PET, polymers, plastics, paper, fabric, or any combination thereof; and wherein said material for the at least one flexible substrate is not etch-able by the at least one etching process.

In an eleventh embodiment of the second aspect of the present invention there is provided the method wherein said attachment between said at least one flexible substrate and said at least one hardened sapphire ($Al_2O_3$) thin film is stronger than the bonding between said at least one first thin film and said second thin film.

In a twelfth embodiment of the second aspect of the present invention there is provided the method wherein the at least one first thin film comprises chromium (Cr) or any material that forms a weaker bond between the at least one first thin film and the at least one second thin film; and wherein said material for the at least one first thin film is not etch-able by the at least one etching process.

In a thirteenth embodiment of the second aspect of the present invention there is provided the method wherein the at least one second thin film comprises silver (Ag) or any material that forms a weaker bond between the at least one first thin film and the at least one second thin film; and wherein said material for the at least one second thin film is etch-able by the at least one etching process.

In a fourteenth embodiment of the second aspect of the present invention there is provided the method wherein said at least one catalyst comprises a metal selected from a group consisting of titanium (Ti), chromium (Cr), nickel (Ni), silicon (Si), silver (Ag), gold (Au), germanium (Ge), and a metal with a higher melting point than that of the at least one first substrate.

In a fifteenth embodiment of the second aspect of the present invention there is provided the method wherein said at least one catalyst coated substrate comprises at least one catalyst film; wherein said at least one catalyst film is not continuous; wherein said at least one catalyst film has a thickness ranging between 1 nm and 15 nm; and wherein said at least one catalyst film comprises a nano-dot with a diameter ranging between 5 nm and 20 nm.

In a third aspect of the present invention there is provided a method for coating sapphire on to a substrate comprising, an e-beam evaporation or sputtering deposition process at room temperature, wherein sapphire is deposited directly on to a substrate selected from quartz, fused silica, silicon, glass, or toughened glass to form a sapphire coated substrate, wherein the substrate during deposition is without external cooling or heating; and an annealing process, wherein said sapphire coated substrate is annealed under an annealing temperature ranging between approximately room temperature and 2040° C. for an effective duration of time.

In a first embodiment of the third aspect of the present invention there is provided the method for coating sapphire on to a substrate wherein said substrate comprises at least one material with a Mohs value less than that of said sapphire.

In a second embodiment of the third aspect of the present invention there is provided the method for coating sapphire on to a substrate wherein said sapphire is deposited as a sapphire thin film on to said substrate.

In a third embodiment of the third aspect of the present invention there is provided the method for coating sapphire on to a substrate wherein said sapphire is deposited as a doped sapphire thin film on to said substrate.

In a fourth embodiment of the third aspect of the present invention there is provided the method for coating sapphire on to a substrate wherein the doped sapphire thin film is doped with doping element comprising one or more of chromium, chromium oxide, magnesium, magnesium oxide, beryllium, beryllium oxide, lithium, lithium oxide, sodium, sodium oxide, potassium, potassium oxide, calcium, calcium oxide, molybdenum, molybdenum oxide, tungsten, and tungsten oxide.

In a fifth embodiment of the third aspect of the present invention there is provided the method for coating sapphire on to a substrate wherein the ratio of sapphire:doping element is in the range of 1:x, wherein x ranges from 1 to 3.

In a sixth embodiment of the third aspect of the present invention there is provided the method for coating sapphire on to a substrate wherein a thickness of said substrate is of one or more orders of magnitude greater than a thickness of said sapphire thin film.

In a seventh embodiment of the third aspect of the present invention there is provided the method for coating sapphire on to a substrate wherein the thickness of said sapphire thin film is about 1/1000 of the thickness of said substrate.

In an eighth embodiment of the third aspect of the present invention there is provided the method for coating sapphire on to a substrate wherein the thickness of said sapphire thin film is between 10 nm and 1000 nm.

In a ninth embodiment of the third aspect of the present invention there is provided the method for coating sapphire on to a substrate wherein said effective duration of time is no less than 30 minutes and no more than 10 hours.

In a tenth embodiment of the third aspect of the present invention there is provided a method for protecting a surface of a substrate by coating said surface with sapphire using the method according to the present invention.

In an eleventh embodiment of the third aspect of the present invention there is provided a screen fabricated by using the method according to the present invention for use in displays.

In a twelfth embodiment of the third aspect of the present invention there is provided a composition of sapphire coating made by the method of the present invention used as a unique identifier of said sapphire coating.

In a thirteenth embodiment of the third aspect of the present invention there is provided a sapphire-coated substrate made by the method according to the present invention.

In a fourth aspect of the present invention there is provided a method for coating sapphire on to a substrate comprising a first e-beam evaporation or sputtering deposition process at room temperature, wherein a buffer layer is deposited directly on to a substrate selected from polymers, plastics, paper, fabrics, PMMA, or PET to form a buffer coated substrate, wherein the substrate during deposition is without external cooling or heating; and a second e-beam evaporation or sputtering deposition process at room temperature, wherein sapphire is deposited directly on to the buffer coated substrate to form a sapphire coated substrate, wherein the buffer coated substrate during deposition is without external cooling or heating; wherein the buffer layer material has a mechanical hardness higher than that of the substrate and lower than that of the sapphire; and wherein the buffer layer material has a refractive index higher than that of the substrate and lower than that of the sapphire.

In a first embodiment of the fourth aspect of the present invention there is provided the method for coating sapphire on to a substrate wherein the mechanical hardness of said buffer layer material ranges from 1 to 5.5 Mohs scale.

In a second embodiment of the fourth aspect of the present invention there is provided the method for coating sapphire on to a substrate wherein the reflective index of said buffer layer material ranges from 1.45 to 1.65.

In a third embodiment of the fourth aspect of the present invention there is provided the method for coating sapphire on to a substrate wherein said buffer layer material is comprising silicon dioxide and $SiO_2$.

In a fourth embodiment of the fourth aspect of the present invention there is provided a method for protecting a surface of a substrate by coating said surface with sapphire using the method according to the present invention.

In a fourth embodiment of the fourth aspect of the present invention there is provided a screen fabricated by using the method according to the present invention use in displays.

In a fifth embodiment of the fourth aspect of the present invention there is provided a sapphire-coated substrate made by the method according to the present invention.

In a fifth aspect of the present invention, there is provided a composition of AR layer that is aimed to match the refractive index of a underlying substrate e.g. glass, chemically strengthened glass, plastics etc., so as to maximize light transmission through it, while having a scratch-proof sapphire thin film coating as its outer most layer. In a second embodiment of the fifth aspect of the present invention, the sapphire thin film is part of the AR layer for the underlying substrate. In a third embodiment of the fifth aspect of the present invention the underlying substrate is comprising flexible materials including plastics and metamaterials.

In a sixth aspect of the present invention, there is provided an AR coating on a substrate comprising a layered structure comprising a topmost AR material layer comprising of sapphire or $Al_2O_3$ on top of one or more AR material layers with a matching refractive index that is higher than the topmost AR material layer; the one or more middle AR material layers, wherein the middle AR material layer immediately below the topmost AR material layer is a second AR material layer and has a matching refractive index that is higher than that of the topmost AR material layer; and a bottommost AR material layer below the one or more middle AR material layers, wherein the bottommost AR material layer is deposited on top of the substrate; wherein the topmost AR material layer, the one or more middle AR material layers, and the bottommost AR material layer have alternatively higher and lower refractive indices in respect with each other.

In a second embodiment of the sixth aspect of the present invention, the second AR material layer has a refractive index in the range of 1.75-1.78 in visible light region; and may comprise $TiO_2$.

In a third embodiment of the sixth aspect of the present invention, the second AR material layer has a refractive index higher than 1.75 in visible light region; and may comprise one or more of YAG, AlAs, $ZnSiAs_2$, AgBr, TlBr, C, $B_4C$, SiC, AgCl, TlCl, BGO, PGO, CsI, KI, Li, NaI, RbI, $CaMoO_4$, $PbMoO_4$, $SrMoO_4$, AlN, GaN, $Si_3N_4$, $LiNbO_3$, $HfO_2$, $Nb_2O_5$, $Sc_2O_3$, $Y_2O_3$, ZnO, $ZrO_2$, GaP, $KTaO_3$, and $BaTiO_3$.

In a fourth embodiment of the sixth aspect of the present invention, the substrate comprises one or more of glass, sapphire, quartz, fused silica, plastics, and PMMA.

In a fifth embodiment of the sixth aspect of the present invention, the bottommost AR material layer of the layered structure deposited on top of the substrate is $Al_2O_3$; the substrate is not sapphire or $Al_2O_3$; the layered structured may comprise three layers of AR material; and the second AR material layer may comprise $TiO_2$.

In a sixth embodiment of the sixth aspect of the present invention, the bottommost AR material layer deposited on top of the substrate is not $Al_2O_3$; the substrate is sapphire or $Al_2O_3$; the layered structured may comprise three layers of AR materials; the second AR material layer may comprise $TiO_2$; and the bottommost AR material layer deposited on top of the substrate may comprise $MgF_2$ or $SiO_2$, which is dependent on the substrate material (e.g. $SiO_2$ is not necessary if the substrate material is glass).

In a seventh embodiment of the sixth aspect of the present invention, the thickness of each of the AR material layers is at least 10 nm.

In an eighth embodiment of the sixth aspect of the present invention, the thickness of each of the AR material layers is no more than 800 nm.

In a nineth embodiment of the sixth aspect of the present invention, each of the AR material layers with a lower refractive index comprises one or more of $MgF_2$, KCl, NaCl, RbCl, $CaF_2$, KF, $LaF_3$, LiF, $LiCaAlF_6$, NaF, RbF, $SrF_2$, $ThF_4$, $YLiF_4$, $GeO_2$, $SiO_2$, $KH_2PO_4$, and $CS_2$.

In a tenth embodiment of the sixth aspect of the present invention, the topmost AR material layer comprises sapphire or $Al_2O_3$; the second AR material layer comprises an AR material with a refractive index higher than that of the topmost AR material layer; the bottommost AR material layer comprises sapphire or $Al_2O_3$ when said substrate is not sapphire or $Al_2O_3$; and the AR material layer immediately on top of the bottommost AR material layer comprises an AR material with a refractive index higher than that of the bottommost AR material layer.

In an eleventh embodiment of the sixth aspect of the present invention, the topmost AR material layer comprises sapphire or $Al_2O_3$; the second AR material layer comprises an AR material with a refractive index higher than that of the topmost AR material layer; the bottommost AR material layer comprises an AR material with a refractive index lower than that of the AR material layer immediately on top of the bottommost AR material layer when said substrate is sapphire or $Al_2O_3$; the AR material layer immediately on top of the bottommost AR material layer comprises an AR material with a refractive index lower than that of the substrate; and the AR material layer immediately on top of the bottommost AR material layer may comprise sapphire or $Al_2O_3$.

In a twelfth embodiment of the sixth aspect of the present invention, the layered structure of AR material layers are fabricated using physical vapor deposition (PVD) methods comprising one or more of electron beam evaporation and sputtering.

In a thirteenth embodiment of the sixth aspect of the present invention, there is provided an AR coating on a substrate comprising a layered structure comprising a topmost AR material layer comprising of sapphire or $Al_2O_3$ on top of a bottommost AR material layer; and the bottommost AR material layer, wherein the bottommost AR material layer is deposited on top of the substrate; wherein the topmost AR material layer and the bottommost AR material layer have alternatively higher and lower refractive indices in respect with each other.

Those skilled in the art will appreciate that the invention described herein is susceptible to variations and modifications other than those specifically described.

The invention includes all such variation and modifications. The invention also includes all of the steps and features referred to or indicated in the specification, individually or collectively, and any and all combinations or any two or more of the steps or features.

Other aspects and advantages of the invention will be apparent to those skilled in the art from a review of the ensuing description.

BRIEF DESCRIPTION OF THE DRAWINGS

The above and other objects and features of the present invention will become apparent from the following description of the invention, when taken in conjunction with the accompanying drawings, in which:

FIG. 1 shows the Mohs scale of mineral hardness;

FIGS. 14A to 14E show the EBL steps in the fabrication of the absorber metamaterials with period of the disc-array device is 600 nm, disc diameter: 365 nm, thickness of gold: 50 nm, and thickness of Cr: 30 nm; FIG. 14A shows that the multilayer plasmonic or metamaterial device is fabricated on chromium (Cr) coated quartz; FIG. 14B shows that a gold/ITO thin film is deposited onto the Cr surface; FIG. 14C shows that a ZEP520A (positive e-beam resist) thin film is spun on top of the ITO/gold/Cr/quartz substrate and a two-dimensional hole array is obtained on the ZEP520A; FIG. 14D shows that a second gold thin film is coated onto the e-beam patterned resist; and FIG. 14E shows that a two-dimensional gold disc-array nanostructures is formed by removing the resist residue;

FIG. 14F shows the scanning electron microscope (SEM) image of the two dimensional gold disc-array absorber metamaterials;

FIGS. 15A to 15E show the schematic diagrams of the flip chip transfer method, the tri-layer absorber metamaterial with an area of 500 µm by 500 µm is transferred to a PET flexible substrate; FIG. 15A shows that a double-sided sticky optically clear adhesive is attached to the PET substrate; FIG. 15B shows that a tri-layer metamaterial device according to an embodiment of the present invention is placed in intimate contact with optical adhesive and sandwiched between the rigid substrate and the optical adhesive; FIG. 15C shows that the Cr thin film on quartz substrate is exposed to the air for several hours after the RF sputtering process, such that there is a thin native oxide film on the Cr surface; FIG. 15D shows that the tri-layer metamaterial nanostructure is peeled off from the Cr coated quartz substrate and transferred to a PET substrate; and FIG. 15E shows that the metamaterial nanostructure is encapsulated by spin-coating a PMMA layer on top of the device;

FIGS. 16A and 16B show the flexible NIR absorber metamaterials on a transparent PET substrate; each separated pattern has an area size of 500 µm by 500 µm;

FIG. 17 shows the relative reflection spectrum of the absorber metamaterials on quartz substrate (gold disc/ITO/gold/Cr/quartz), NIR light was normally focused on the device and the reflection signal and was collected by the 15× objective lens, and blue line is the experimental result and red line is the simulated reflection spectrum using RCWA method;

DETAILED DESCRIPTION OF THE INVENTION

Figure 2:
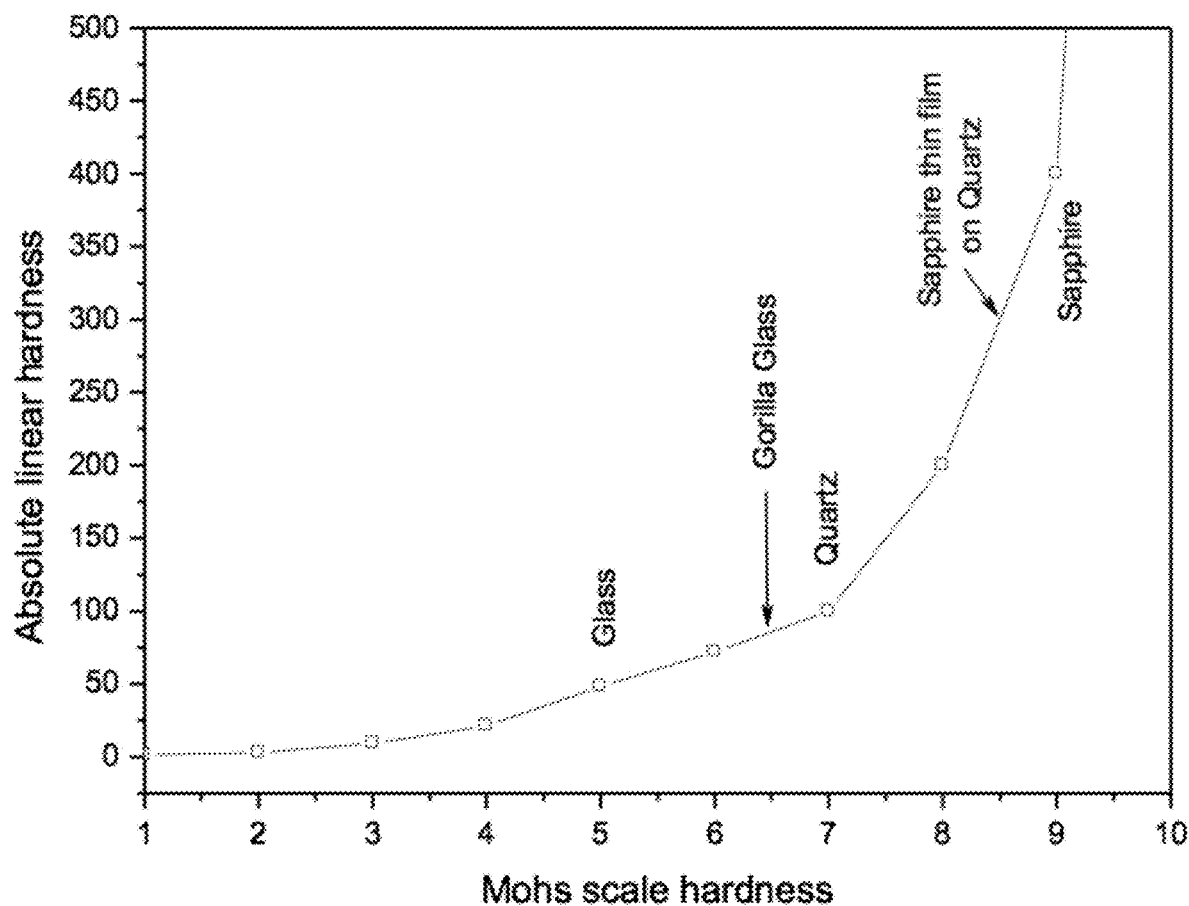
FIG. 2 shows the top-surface hardness of "Sapphire thin film on Quartz" when compared to ordinary glass, Gorilla Glass, quartz and pure sapphire.

The present invention is not to be limited in scope by any of the specific embodiments described herein. The following embodiments are presented for exemplification only.

Without wishing to be bound by theory, the present inventors have discovered through their trials, experimentations and research that to accomplish the task of transferring a layer of harder thin film substrate onto a softer, flexible substrate e.g. PET, polymers, plastics, paper and even to fabrics. This combination is better than pure sapphire substrate. In nature, the harder the materials, the more brittle they are; thus, sapphire substrate is hard to scratch but it is easy to shatter, and the vice versa is also often true wherein quartz substrate is easier to scratch but it is less brittle than sapphire substrate. Therefore, depositing a harder thin film substrate on a softer, flexible substrate gives the best of both worlds. Softer, flexible substrates are less brittle, have good mechanical performance and cost less. The function of anti-scratch is to be achieved by using the harder thin film substrate. For hardening of sapphire (Al$_2$O$_3$) thin film deposition, softening/melting temperature of softer substrate should be sufficiently higher than the annealing temperature. Most rigid substrates such as quartz, fused silica can meet this requirement. However, flexible substrate such as polyethylene terephthalate (PET) would not be able to meet the requirement. PET has a melting temperature of about 250° C., which is way below the annealing temperature. PET is one of the most widely used flexible substrates. The ability of transferring a substrate of Al$_2$O$_3$ (sapphire) thin films on to a softer flexible will significantly broaden its applications from rigid substrates like glass and metals to flexible substrates like PET, polymers, plastics, paper and even to fabrics. Mechanical properties of transferred substrate can then be improved. Therefore, Al$_2$O$_3$ thin films transfer from rigid substrate to flexible substrate can circumnavigate this problem of the often-lower melting temperatures of flexible substrates.

In accordance with a first aspect of the present invention, there is provided a method to coat/deposit/transfer a layer of a harder thin film substrate onto a softer substrate. In particular, the present invention provides a method to deposit a layer of sapphire thin film onto a softer flexible substrate e.g. PET, polymers, plastics, paper and fabrics. This combination is better than pure sapphire substrate.

In accordance with a second aspect of the present invention, there is provided a method for coating sapphire (Al$_2$O$_3$) onto flexible substrate comprising: a first deposition process to deposit at least one first thin film onto at least one first substrate to form at least one first thin film coated substrate; a second deposition process to deposit at least one second thin film onto the at least one first thin film coated substrate to form at least one second thin film coated substrate; a third deposition process to deposit at least one catalyst onto the at least one second thin film coated substrate to form at least one catalyst coated substrate; a fourth deposition process to deposit at least one sapphire (Al$_2$O$_3$) thin film onto the at least one catalyst coated substrate to form at least one sapphire (Al$_2$O$_3$) coated substrate; an annealing process, wherein said at least one sapphire (Al$_2$O$_3$) coated substrate is annealed under an annealing temperature ranging from 300° C. to less than a melting point of sapphire (Al$_2$O$_3$) for an effective duration of time to form at least one hardened sapphire (Al$_2$O$_3$) thin film coated substrate; attaching at least one flexible substrate to the at least one hardened sapphire (Al$_2$O$_3$) thin film coated substrate on the at least one sapphire (Al$_2$O$_3$) thin film; a mechanical detachment process detaching the at least one hardened sapphire (Al$_2$O$_3$) thin film together with the at least one second thin film from the at least one first thin film coated substrate to form at least one second thin film coated hardened sapphire (Al$_2$O$_3$) thin film on said at least one flexible substrate; and an etching process removing the at least one second thin film from the at least one second thin film coated hardened sapphire (Al$_2$O$_3$) thin film on said at least one flexible substrate to form at least one sapphire (Al$_2$O$_3$) thin film coated flexible substrate.

The method according to the present invention, wherein said first and/or said flexible substrate comprises at least one material with a Mohs value less than that of said at least one sapphire ($Al_2O_3$) thin film.

In a first embodiment of the second aspect of the present invention there is provided the method wherein said first and/or second and/or third and/or fourth deposition process comprise(s) e-beam deposition and/or sputtering deposition.

In a second embodiment of the second aspect of the present invention there is provided the method wherein said at least one sapphire ($Al_2O_3$) coated substrate and/or at least one hardened sapphire ($Al_2O_3$) coated substrate and/or at least one second thin film coated hardened sapphire ($Al_2O_3$) thin film on said at least one flexible substrate and/or at least one sapphire ($Al_2O_3$) thin film coated flexible substrate comprise(s) at least one sapphire ($Al_2O_3$) thin film.

In a third embodiment of the second aspect of the present invention there is provided the method wherein a thickness of said at least one first substrate and/or said at least one flexible substrate is of one or more orders of magnitude greater than the thickness of said at least one sapphire ($Al_2O_3$) thin film.

In a fourth embodiment of the second aspect of the present invention there is provided the method wherein the thickness of said at least one sapphire ($Al_2O_3$) thin film is about $1/1000$ of the thickness of said at least one first substrate and/or said at least one flexible substrate.

In a fifth embodiment of the second aspect of the present invention there is provided the method wherein said at least one sapphire ($Al_2O_3$) thin film has the thickness between 150 nm and 600 nm.

In a sixth embodiment of the second aspect of the present invention there is provided the method wherein said effective duration of time is no less than 30 minutes.

In a seventh embodiment of the second aspect of the present invention there is provided the method wherein said effective duration of time is no more than 2 hours.

In an eighth embodiment of the second aspect of the present invention there is provided the method wherein said annealing temperature ranges between 850° C. and 1300° C.

In a ninth embodiment of the second aspect of the present invention there is provided the method wherein said annealing temperature ranges between 1150° C. and 1300° C.

In a tenth embodiment of the second aspect of the present invention there is provided the method wherein said at least one material comprising quartz, fused silica, silicon, glass, toughen glass, PET, polymers, plastics, paper, fabric, or any combination thereof; and wherein said material for the at least one flexible substrate is not etch-able by the at least one etching process.

In an eleventh embodiment of the second aspect of the present invention there is provided the method wherein said attachment between said at least one flexible substrate and said at least one hardened sapphire ($Al_2O_3$) thin film is stronger than the bonding between said at least one first thin film and said second thin film.

In a twelfth embodiment of the second aspect of the present invention there is provided the method wherein the at least one first thin film comprises chromium (Cr) or any material that forms a weaker bond between the at least one first thin film and the at least one second thin film; and wherein said material for the first thin film is not etch-able by the at least one etching process.

In a thirteenth embodiment of the second aspect of the present invention there is provided the method wherein the at least one second thin film comprises silver (Ag) or any material that forms a weaker bond between the at least one first thin film and the at least one second thin film; and wherein said material for the second thin film is etch-able by the at least one etching process.

In a fourteenth embodiment of the second aspect of the present invention there is provided the method wherein said at least one catalyst comprises a metal selected from a group consisting of titanium (Ti), chromium (Cr), nickel (Ni), silicon (Si), silver (Ag), gold (Au), germanium (Ge), and a metal with a higher melting point than that of the at least one first substrate.

In a fifteenth embodiment of the second aspect of the present invention there is provided the method wherein said at least one catalyst coated substrate comprises at least one catalyst film; wherein said at least one catalyst film is not continuous; wherein said at least one catalyst film has a thickness ranging between 1 nm and 15 nm; and wherein said at least one catalyst film comprises a nano-dot with a diameter ranging between 5 nm and 20 nm.

Definitions

For clarity and completeness the following definition of terms used in this disclosure:

The word "sapphire" when used herein refers to the material or substrate that is also known as a gemstone variety of the mineral corundum including those with different impurities in said material or substrate, an aluminium oxide (alpha-$Al_2O_3$), or alumina. Pure corundum (aluminum oxide) is colorless, or corundum with ~0.01% titanium. The various sapphire colors result from the presence of different chemical impurities or trace elements are:

Blue sapphire is typically colored by traces of iron and titanium (only 0.01%).

The combination of iron and chromium produces yellow or orange sapphire.

Chromium alone produces pink or red (ruby); at least 1% chromium for deep red ruby.

Iron alone produces a weak yellow or green.

Violet or purple sapphire is colored by vanadium.

The word "harder" when used herein refers to a relative measure of the hardness of a material when compared to another. For clarity, when a first material or substrate that is defined as harder than a second material or substrate, the Mohs value for the first material or substrate is higher than the Mohs value for the second material or substrate.

The word "softer" when used herein refers to a relative measure of the hardness of a material when compared to another. For clarity, when a first material or substrate that is defined as softer than a second material or substrate, the Mohs value for the first material or substrate is lower than the Mohs value for the second material or substrate.

The word "flexible" when used herein refers to a substrate's mechanical properties of being able to be physically manipulated to change its physical shape using force without breaking said substrate.

The word "screen" when used as a noun herein refers to a cover-glass, cover-screen, cover-window, display screen, display window, cover-surface, or cover plate of an apparatus. For clarity, while in many instances a screen on a given apparatus has a dual function of displaying an interface of the apparatus and protecting the surface of the apparatus, wherein for such instances good light transmittance is a required feature of said screen; this is not a must. In other instances where only the function of providing surface protection is required, light transmittance of the screen is not a must.

In one embodiment of the present invention, there is provided a method to develop a transparent screen which is harder and better than Gorilla Glass and comparable to pure sapphire screen but with the following advantages:

Harder than any hardened glass;
Less possibility of fragmentation than pure sapphire screen;
Lighter weight than pure sapphire screen;
Higher transparency than pure sapphire screen.

In one embodiment of the present invention, there is provided a method to deposit a sapphire thin film on quartz substrate. With post-deposit treatment such as thermal annealing, an embodiment of the present invention has achieved top-surface hardness up to 8-8.5 Mohs, which is close to sapphire single crystal hardness of 9 Mohs. One embodiment of the present invention is herein known as "Sapphire thin film on Quartz". FIG. 2 shows the top-surface hardness of "Sapphire thin film on Quartz" when compared to ordinary glass, Gorilla Glass, quartz and pure sapphire.

Quartz substrate itself is the single crystal of $SiO_2$ with a higher Mohs value than glass. Moreover, its melting point is 1610° C. which can resist high annealing temperatures. Furthermore, the substrate can be cut to the desired size onto which an embodiment of the present invention can then deposit the sapphire thin film. The thickness of the deposited sapphire thin film is just $1/1000$ of the quartz substrate. The cost of synthetic quartz crystal is relatively low (which is only less than US$10/kg at the time the present invention is disclosed herein). So, in an embodiment of the present invention, the fabrication cost and fabrication time are significantly reduced comparing to the fabrication of pure sapphire substrate.

Features and Benefits of One Embodiment of the Present Invention

Higher Hardness than Hardened Glass

In one embodiment of the present invention, the developed Sapphire thin film on Quartz has a maximum value of 8.5 Mohs in top-surface hardness. Recent Gorilla Glass used in smart-phone screen only scores about 6.5 Mohs in hardness value and natural quartz substrate is 7 Mohs in hardness value. Therefore, the present invention has a significant improvement in top-surface hardness comparing to recent technology. The Sapphire thin film on Quartz has a hardness value of 8.5 Mohs, which is very close to pure sapphire's hardness value of 9 Mohs, and the Sapphire thin film on Quartz has the merits of lower fabrication cost and requires a less fabrication time.

Less Fragmented, Lighter than Sapphire

In nature, the harder the materials, the more brittle they are, thus, sapphire substrate is hard to scratch but it is easy to shatter, and the vice versa is also often true. Quartz has comparatively low elastic modulus, making it far more shock resistant than sapphire.

Moreover, in one embodiment of the present invention, the deposited sapphire thin film is very thin compared to quartz substrate wherein the deposited sapphire thin film is only $1/1000$ of the quartz substrate in thickness. Therefore, the overall weight of sapphire thin film on quartz is almost the same as quartz substrate, which is only 66.6% (or $2/3$) of the weight of pure sapphire substrate for the same thickness. This is because the density of quartz is only 2.65 g/cm³ while that of pure sapphire is 3.98 g/cm³ and that of Gorilla Glass is 2.54 g/cm³. In other words, quartz substrate is only heavier than Gorilla Glass by 4.3% but pure sapphire substrate is roughly 1.5 times heavier than Gorilla Glass and quartz. Table 1 shows the comparison among the density of quartz, Gorilla Glass and pure sapphire.

TABLE 1

Comparison of density of Gorilla glass, quartz and pure sapphire, and their percentage differences.

| Materials | Density | Difference |
|---|---|---|
| Gorilla Glass | 2.54 g/cm³ | 100% |
| Quartz | 2.65 g/cm³ | 104.3% |
| Pure Sapphire | 3.98 g/cm³ | 156.7% |

A recently published patent application, U.S. patent application Ser. No. 13/783,262 to Apple Inc., also indicates that it has devised a way to fuse sapphire and glass layers together that creates a sapphire laminated glass to combine the durability of sapphire with the weight and flexibility advantages of glass. However, polishing a larger area (>6 inches) and thin (<0.3 mm) sapphire substrate is very challenging. Therefore, using Sapphire thin film on Quartz is the best combination for screen with lighter weight, higher top-surface hardness, less fragmented substrate.

Higher Transparency than Pure Sapphire

Figure 3:
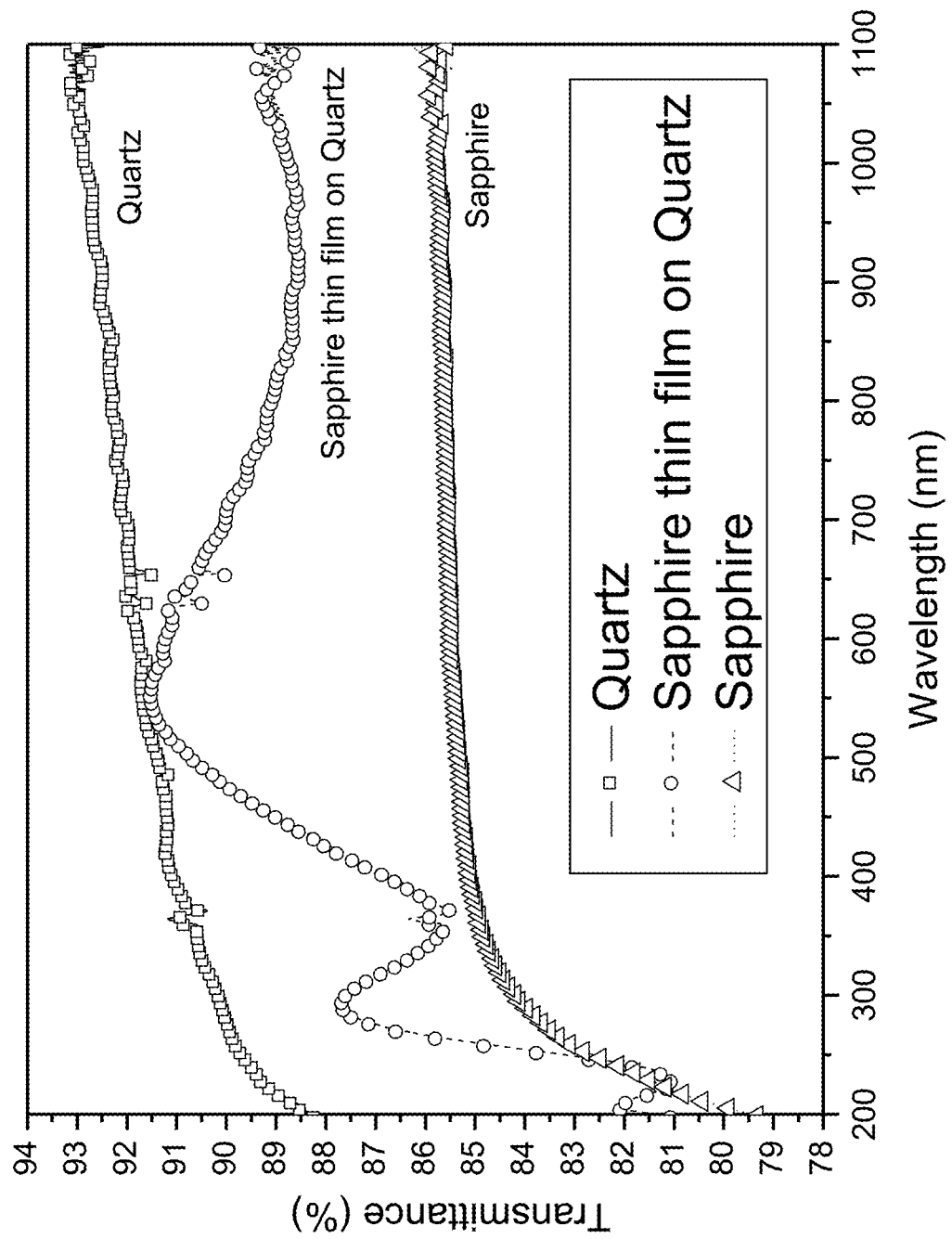
FIG. 3 shows the light transmittance of quartz, Sapphire thin film on Quartz and pure sapphire.

Since the refractive index of sapphire crystal, quartz crystal, and Gorilla Glass are 1.76, 1.54, and 1.5 respectively, the overall light transmission of them are 85%, 91%, and 92% due to the Fresnel's reflection loss. That means there is a small trade-off between light transmission and durability. Sapphire transmits less light which can results in either dimmer devices or shorter device battery life. When more light is transmitted, then more energy is saved and the device battery life would be longer. FIG. 3 shows the light transmittance of quartz, Sapphire thin film on Quartz and pure sapphire.

Most crystals, including sapphire and quartz, have birefringence problem. By comparing their refractive indices of ordinary ray and extraordinary ray ($n_0$ and $n_e$), the magnitude of the difference $\Delta n$ is quantified by the birefringence. Moreover, the values of $\Delta n$ for one embodiment of the present invention are also small such that the birefringence problem is not serious for application with thinner substrate thickness (≤1 mm). For examples, pure sapphire is used as the camera cover lens in Apple iPhone 5S, which is not known to have any blurred image reported. Table 2 shows the refractive index of ordinary ray and extraordinary ray ($n_0$ and $n_e$), and their differences $\Delta n$ in birefringence for quartz and sapphire.

TABLE 2

Refractive indices of ordinary ray and extraordinary ray ($n_0$ and $n_e$), their differences $\Delta n$ for quartz and sapphire.

| Materials | Formula | $n_0$ | $n_e$ | $\Delta n$ |
|---|---|---|---|---|
| Quartz | $SiO_2$ | 1.544 | 1.553 | +0.009 |
| Sapphire | $Al_2O_3$ | 1.768 | 1.760 | −0.008 |

Shorter Fabrication Time and Lower Fabrication Cost than Pure Sapphire

Recently, both synthetic sapphire and quartz single crystals are grown and commercially available. Since sapphire has a higher melting point than quartz, the growth of sapphire is more difficult and in a higher cost. More importantly, the time to grow sapphire is much longer than quartz. Growing sapphire for products larger than 6 inches is also challenging and only a limited number of companies can achieve this. Therefore, it limits the production quantity such that production cost of sapphire substrate is higher than quartz. Table 3 shows the chemical formula, melting point and Mohs hardness value for quartz and sapphire.

TABLE 3

The chemical formula, melting point and Mohs hardness value for quartz and sapphire.

| Materials | Formula | Melting point | Mohs hardness |
|---|---|---|---|
| Quartz | $SiO_2$ | 1610° C. | 7 |
| Sapphire | $Al_2O_3$ | 2040° C. | 9 |

Another challenge in the use of pure sapphire is that sapphire crystal with hardness value of 9 Mohs is very difficult to be cut and polished. Up to now, polishing a larger area (>6 inches) and thin (<0.3 mm) sapphire substrate is very challenging. The successful rate is not very high and this prevents the price of sapphire substrate from any significant reduction even though a larger number of sapphire crystal growth furnaces are now in operation. Corning has claimed that sapphire screen can cost up to 10 times as much as Gorilla Glass. In contrast, quartz possesses a hardness value of 7 Mohs, and it is easier to be cut and polished. Moreover, the cost of synthetic quartz crystal is comparatively less expensive (only costs less than US$10/kg at the time of the present disclosure).

Therefore, the additional cost of Sapphire thin film on Quartz is the deposition of the sapphire thin film on the quartz substrate and the post-treatment of the Sapphire thin film on Quartz. In one embodiment of the present invention, when all conditions are optimized, the process of mass production can be fast and the cost is low.

Figure 4:
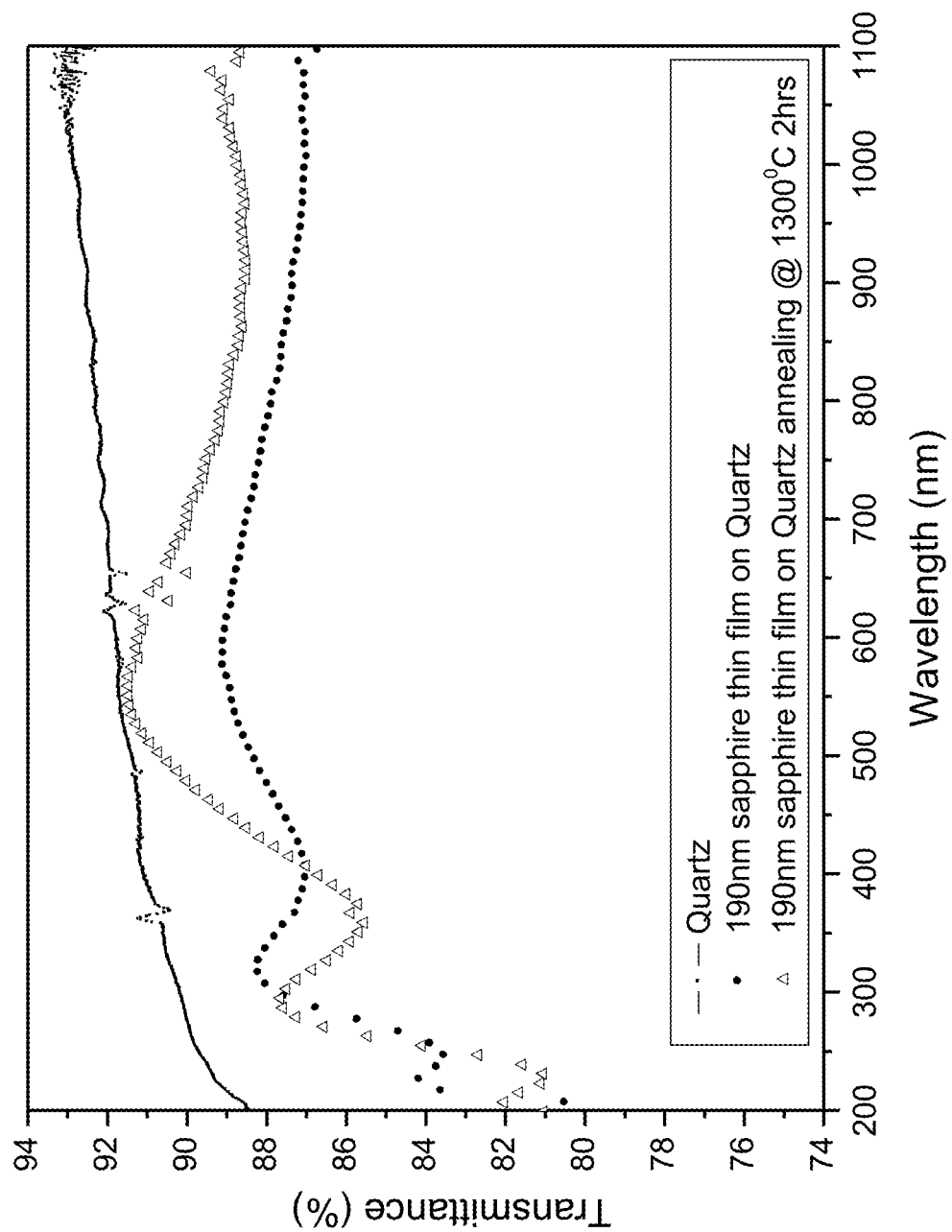
FIG. 4 shows the light transmission of quartz and 190 nm Sapphire thin film on Quartz with and without annealing at 1300° C. for 2 hours.

In one embodiment of the present invention, there is provided a method to deposit a harder sapphire thin film on quartz substrate. The thin film thickness is in the range of 150 nm-1000 nm. With post-deposit treatment such as thermal annealing at 500° C.-1300° C., this embodiment of the present invention has achieved hardness of 8-8.5 Mohs, which is very close to sapphire single crystal hardness of 9 Mohs. In another embodiment of the present invention, there is provided sapphire thin film with thickness of 150 nm-500 nm with an achieved hardness value of 8-8.5 Mohs, which is very close to sapphire single crystal hardness of 9 Mohs, and also possesses good optical performance with low scattering loss. The annealing temperature is from 1150 to 1300° C. FIG. 4 shows the light transmission of quartz and 190 nm Sapphire thin film on Quartz with and without annealing at 1300° C. for 2 hours. Therefore, in terms of hardness, the Sapphire thin film on Quartz is comparable to that of pure sapphire screen, and its weight is almost the same as that of glass/quartz substrate, which is roughly 66.6% the weight of pure sapphire substrate since the density of quartz is only 2.65 g/cm$^3$ while pure sapphire is 3.98 g/cm$^3$. Since one can cut the substrate to the desired size then deposit the sapphire thin film according to the present method, the fabrication cost and time are significantly reduced comparing to that of pure sapphire substrate.

In fact, the value of hardness for sapphire thin film by e-beam deposition is not very high. In one embodiment of the present invention, the value of hardness was measured to be less than 7 Mohs. However, after conducting thermal annealing process, the thin film hardness is significantly improved. In one embodiment of the present invention, it was found that the sapphire thin film was softened as it was subjected to annealing at 1300° C. for 2 hours. The film thickness was shrunk about 10% and the film hardness was improved to 8-8.5 Mohs. Since, the quartz substrate is single crystal of $SiO_2$ with melting point of 1610° C., it can resist the high annealing temperature. Therefore, the hardness of the annealed sapphire thin film on quartz substrate can attain 8.5 Mohs. FIG. 4 shows the transmission of quartz and 190 nm thick Sapphire thin film on Quartz with and without annealing at 1300° C. for 2 hours.

Moreover, in other embodiments of the present invention, the annealing process of sapphire thin film can be conducted on other substrates. For examples, 1000° C. annealed sapphire thin film on fused silica substrate and 500° C. annealed sapphire thin film on glass substrate.

Electron beam (E-beam) and sputtering depositions are two most popular methods to deposit sapphire thin film onto the quartz and other relevant substrates. In some embodiments of the present invention, these two common deposition methods are used.

Sapphire Thin Film by e-Beam Deposition

The summary points on sapphire thin film deposition on a given substrate by e-beam deposition are given as follows:

The deposition of sapphire thin film is using e-beam evaporation since aluminum oxide has a very high melting point at 2040° C. The white pellets or colorless crystal in small size of pure aluminum oxide are used as the e-beam evaporating sources. The high melting point of aluminum oxide also allows for annealing temperatures up to less than the melting point of sapphire (e.g. 2040° C. at atmospheric pressure).

The substrates are perpendicularly stuck on the sample holder far away from the evaporation source in 450 mm. The sample holder is rotated at 1-2 RPM when the deposition takes place.

The base vacuum of evaporation chamber is less than $5 \times 10^{-6}$ torr and the vacuum keeps below $1 \times 10^{-5}$ torr when the deposition takes place.

The thickness of film deposited on substrates is about 150 nm to 1000 nm. The deposition rate is about 1-5 Å/s. The substrate during deposition is without external cooling or heating. The film thicknesses are measured by ellipsometry method and/or scanning electron microscope (SEM).

Higher temperature film deposition is possible from room temperature to 1000° C.

A more detailed description on the process of e-beam deposition for sapphire thin film on another substrate is given as follows:

1) The deposition of sapphire thin film is using e-beam evaporation since aluminum oxide has a high melting point at 2040° C. The aluminum oxide pellets are used as the e-beam evaporation source. The high melting point of aluminum oxide also allows for annealing temperatures up to less than the melting point of sapphire (e.g. 2040° C. at atmospheric pressure).

2) The coated substrates are perpendicularly stuck on the sample holder far away from the evaporation source in 450 mm. The sample holder is rotated at 2 RPM when the deposition takes place.

3) The thickness of film deposited on substrates is about 190 nm to 1000 nm. The deposition rate is about 1 Å/s. The substrate during deposition is without external cooling or heating. The film thicknesses are measured by ellipsometry method.

4) After deposition of sapphire thin film on substrates, they are annealed in a furnace from 500° C. to 1300° C. The temperature raising speed is 5° C./min and the decline speed is 1° C./min. The time ranges from 30 minutes to 2 hours, keeping on the particular thermal annealing temperature.

5) The deposition substrates are including quartz, fused silica and (toughened) glass. Their melting points are 1610° C., 1140° C. and 550° C. respectively. The annealing temperatures of sapphire thin film coated on them are 1300° C., 1000° C. and 500° C. respectively.

6) The transmission of quartz and 190 nm sapphire thin film on quartz with and without annealing at 1300° C. for 2 hours are showed in FIG. 4. The light transmission percentage in whole visible region from 400 nm-700 nm is greater than 86.7% and maximally 91.5% at 550 nm while for pure sapphire substrate the light transmission percentage is only 85-86%. More light transmitted indicates more energy saved from backlight-source of display panel, so such that the device battery life would be longer.

Annealing Process of an Embodiment of the Present Invention

After deposition of sapphire thin film on substrates, they are annealed in a furnace from 500° C. to 1300° C. The temperature raising rate is 5° C./min and the decline rate is 1° C./min. The annealing time is from 30 minutes to 2 hours, maintaining at a particular thermal annealing temperature. Multiple-steps annealing with different temperatures within the aforementioned range are also used to enhance the hardness and also reduce the micro-crack of thin film. Table 4 shows the surface hardness and XRD characteristic peaks at different annealing temperatures prepared by e-beam deposition. The table also shows various crystalline phases of sapphire present in the films; most common phases are alpha ($\alpha$), theta ($\theta$), and delta ($\delta$).

TABLE 4

The surface hardness and XRD characteristic peaks at different annealing temperatures prepared by e-beam deposition.

| Annealing temperature (° C.) | Surface hardness (Mohs) | XRD peaks (phase) |
|---|---|---|
| No annealing | 5.5 | No |
| 500-850 | 6-7 | No |
| 850-1150 | 7-8 | theta & delta |
| 1150-1300 | 8-8.5 | theta & delta |

Table 4 shows the changes of surface hardness of sapphire thin film as a function of annealing temperature varies from 500° C. to 1300° C. In fact, the initial value of hardness of e-beam deposited sapphire thin film without being annealed is about 5.5 Mohs. However, after conducting thermal annealing process, the film hardness is significantly improved. By using annealing temperature in the ranges of 500° C.-850° C., 850° C.-1150° C., and 1150° C.-1300° C., the hardness values of sapphire thin film on quartz are 6-7 Mohs, 7-8 Mohs and 8-8.5 Mohs in hardness scale respectively.

Figure 5:
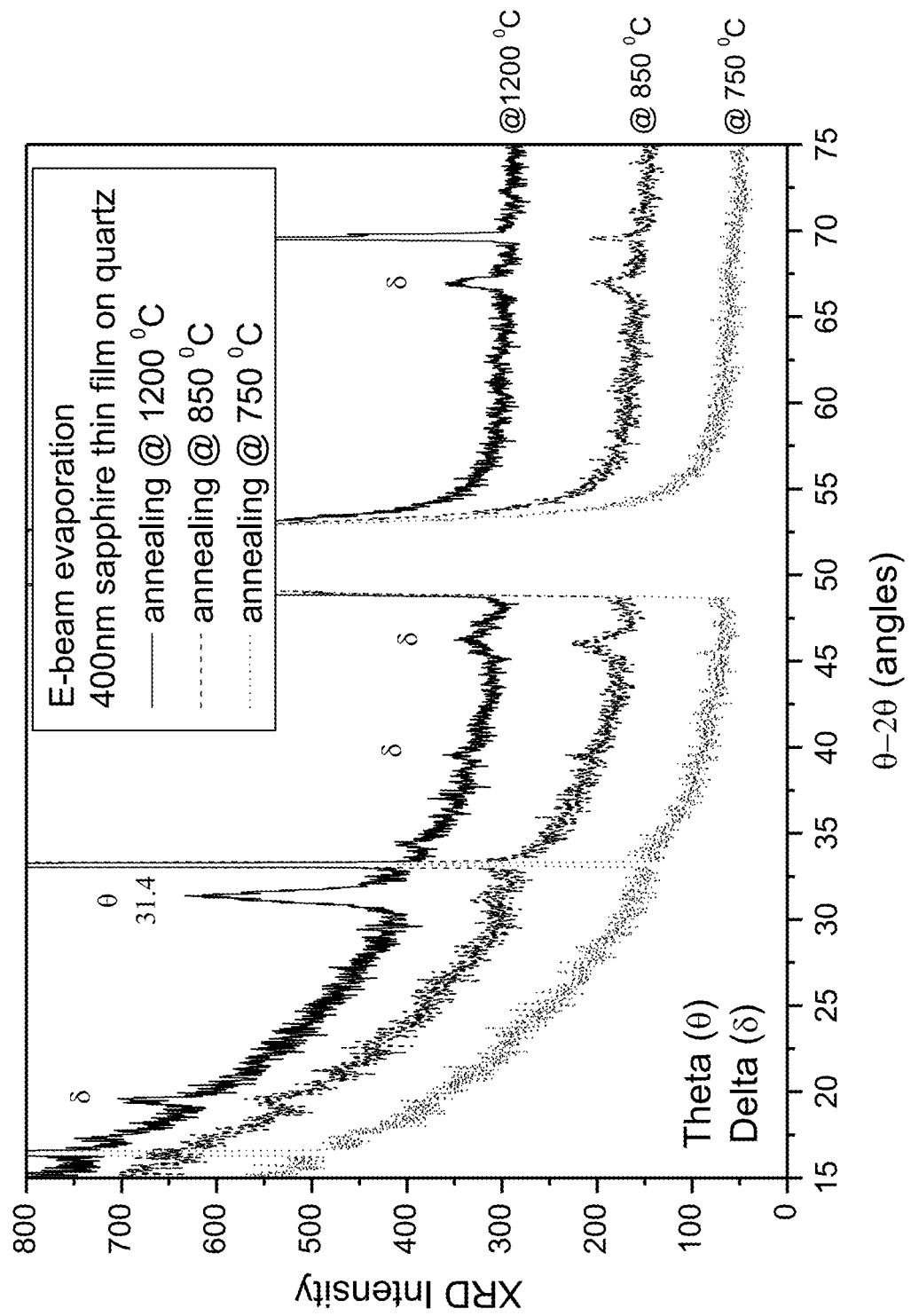
FIG. 5 shows XRD results for the 400 nm sapphire thin film on quartz annealed at 750° C., 850° C., and 1200° C. for 2 hours.

FIG. 5 shows XRD results for the 400 nm sapphire thin film on quartz annealed at 750° C., 850° C. and 1200° C. for 2 hours. When the annealing temperature is greater than 850° C., the film starts to partially crystallize. The appearance of new XRD peaks corresponds to the mixture of theta and delta structural phases of aluminum oxide.

When the annealing temperature is above 1300° C., the film would start to develop some larger crystallites that can significantly scatter visible light; this would reduce the transmission intensity. Moreover, as this large crystallite accumulates more and more, the film would crack and some micro-size pieces would detach from the substrate.

In one embodiment of the present invention, it was found that the sapphire thin film on quartz substrate can be annealed at 1150° C. to 1300° C. within half to two hours. The film thickness would shrink by about 10% and the film hardness is improved to 8-8.5 Mohs. Since the quartz substrate is single crystal $SiO_2$ with a melting point of 1610° C., it can resist such high annealing temperature. Under this annealing temperature, the hardness of annealed sapphire thin film on quartz substrate has achieved 8.5 Mohs.

Figure 6:
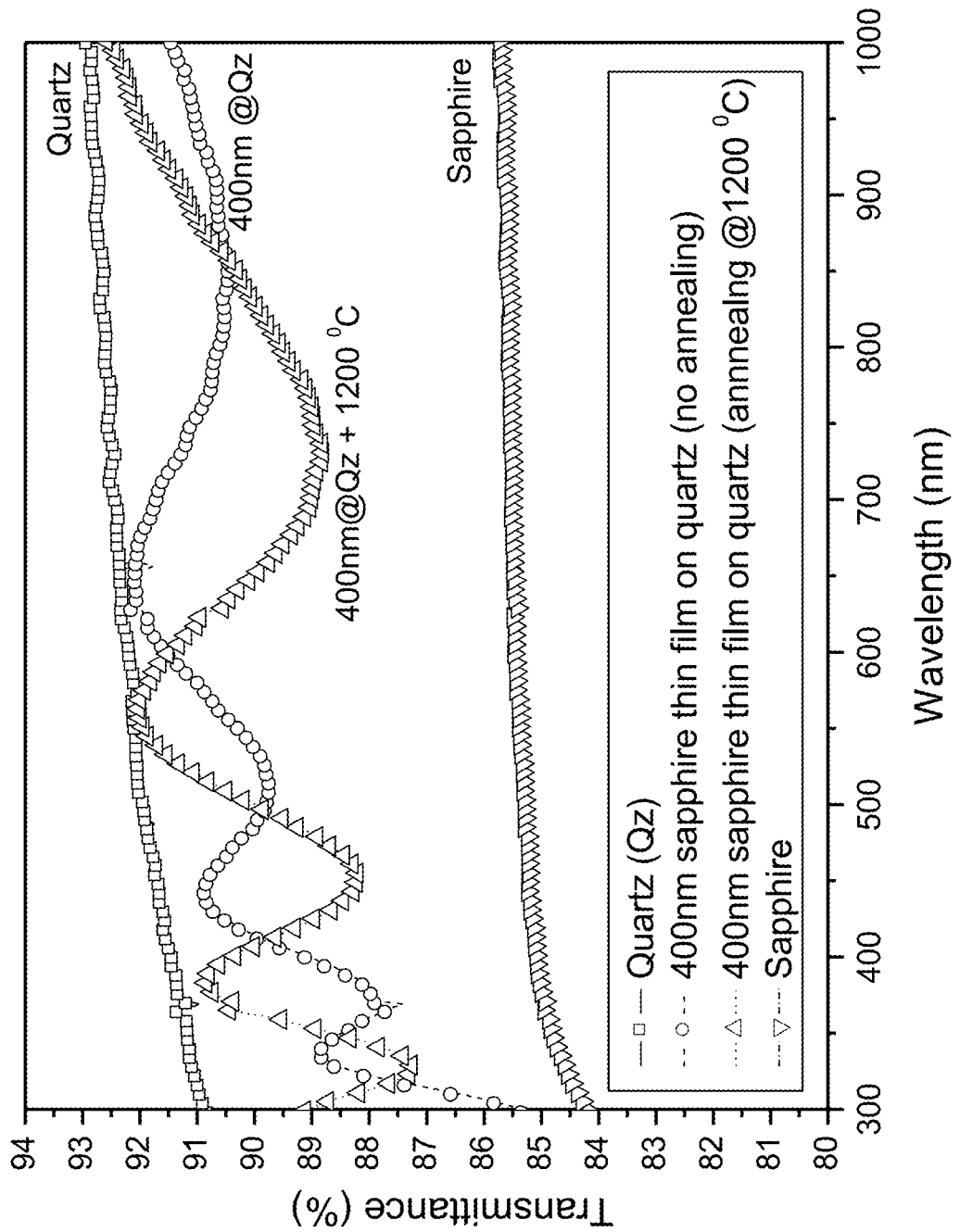
FIG. 6 shows the transmission spectrum of 400 nm sapphire thin film on quartz by e-beam with and without annealing at 1200° C. for 2 hours comparing with quartz and sapphire substrates.

The light transmission of 400 nm Sapphire thin film on Quartz with and without annealing at 1200° C. for 2 hours are shown in FIG. 6 while comparing to quartz and sapphire substrates. The light transmission of Sapphire thin film on Quartz within visible region, from 400-700 nm, is greater than 88% and the maximum is at 550 nm with 92%. The interference pattern is due to the differences in refractive index of the materials and the film thickness. The overall averaging light transmittance is about 90% while pure sapphire substrate is only 85-86%. Moreover, the light transmission spectrum of Sapphire thin film on Quartz coincides with that of quartz substrate at certain wavelength which indicates the optical performance is excellent and low scattering loss. The difference between maximum and minimum intensity of the interference pattern is about 4% only. For real applications, more light transmitted indicates more energy saved from backlight-source of display panel, so such that the device battery life would be longer.

Thickness of Sapphire Thin Film on Quartz

The Sapphire thin film on Quartz with thickness in the range of 150 nm-1000 nm has been tested. In one embodiment of the present invention, there is provided a sapphire thin film with a thickness of 150 nm-500 nm having good optical performance with low scattering loss when annealing temperature is from 1150° C. to 1300° C. However when the thickness is larger than 600 nm, the film would crack causing significant scattering which reduces the transmission intensity.

For the sapphire thin film with thickness of 150 nm-500 nm deposited on quartz after annealing at 1150° C. to 1300° C., the measured hardness can achieve 8-8.5 in Mohs scale, which indicates that even thinner coating film can also act as an anti-scratching layer.

Other Possible Substrates for Anti-Scratch Coating

Apart from quartz substrate, other embodiments of the present invention have also investigated the deposition of sapphire thin film on different substrates such as fused silica and silicon. Other tempered glass or transparent ceramic substrates with a higher annealing or melting temperature, which can resist 850° C. annealing temperature within 30 minutes to 2 hours, are also possible to use as substrates to enhance their surface hardness to 7-8 in Mohs hardness scale. For example, Schott Nextrema transparent ceramics has a short heating temperature at 925° C.; Corning Gorilla glass has a softening temperature up to 850° C.

Figure 7:
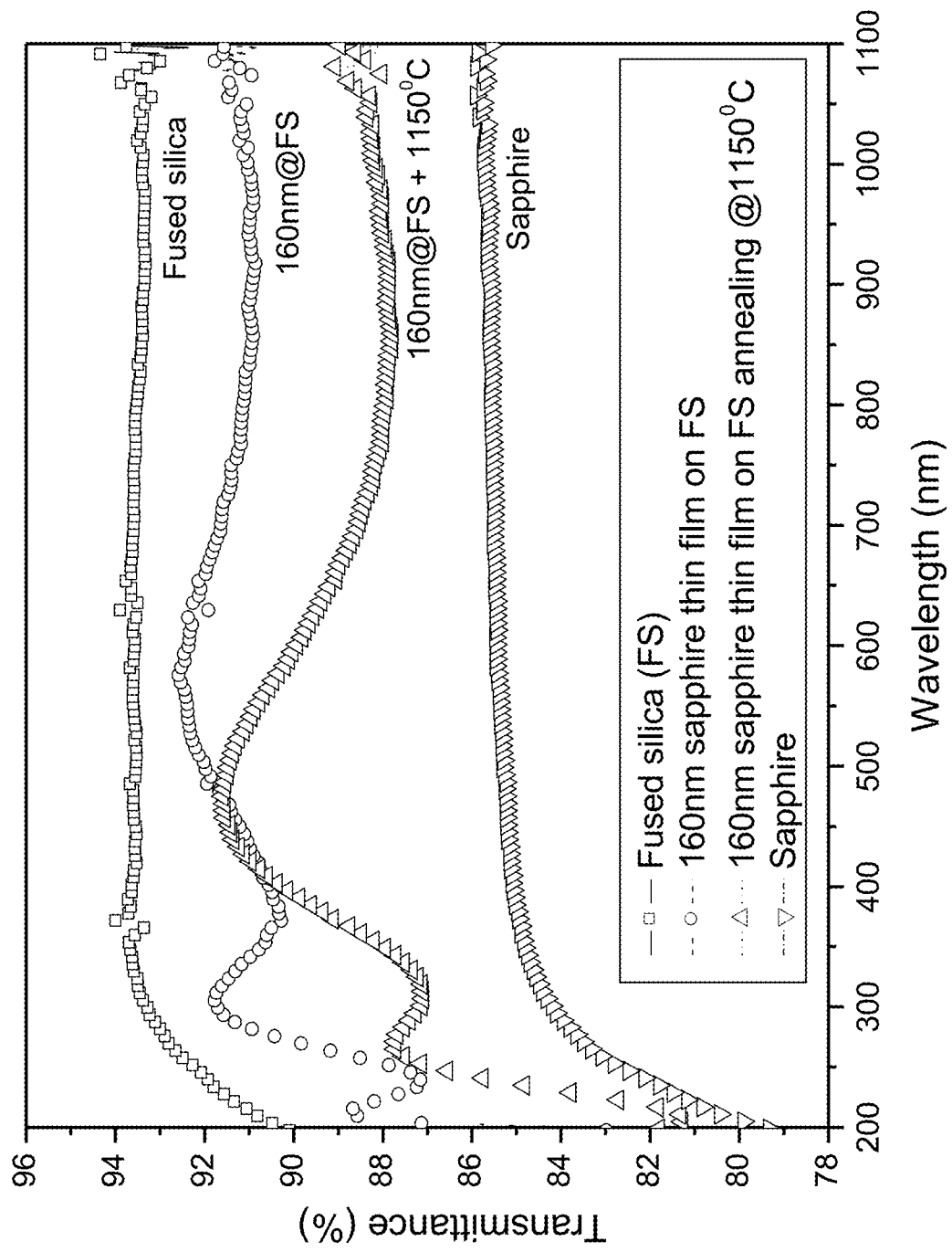
FIG. 7 shows the transmission spectrum of 160 nm sapphire thin film on fused silica by e-beam with and without annealing at 1150° C. for 2 hours comparing with quartz and sapphire substrates.

Since the annealing temperature of fused silica is about 1160° C., it is a good candidate to start investigating its suitability as substrate. However, sapphire thin film on fused silica shows different behaviors compared with sapphire thin film on quartz annealing from 850° C. to 1150° C., even though they are deposited under the same deposition condition. The adhesion of sapphire film on fused silica is not as good as on quartz (due to significant difference in the expansion coefficient); localized delamination and micro-sized crack of the film occur on fused silica substrate. However, using thinner film, these problems, which can lead to light scattering, are substantially mitigated. FIG. 7 showed the transmission of 160 nm sapphire thin film on fused silica annealed at 1150° C. for 2 hours. The transmission of sapphire thin film on fused silica in whole visible region from 400 nm-700 nm is greater than 88.5% and maximally 91.5% at 470 nm. The overall averaging light transmittance percentage is about 90% while pure sapphire substrate is only 85%-86%. Moreover, the measured surface hardness also maintains at above 8 in Mohs scale.

Silicon, which has a melting temperature at about 1410° C., is a non-transparent substrate material. Under the same deposition condition, although sapphire film on silicon substrate shows similar characteristics in Mohs hardness comparing to quartz substrate, they are still divided into the two groups of temperature range. However, because silicon substrate is not a transparent substrate, it cannot be used in transparent cover glass or window applications. Therefore, the sapphire film can only provide the anti-scratch purpose as a protection layer to protect the silicon surface from scratch (silicon has Mohs scale hardness of 7). Such protection layer can potentially eliminate thick glass encapsulation. This would improve the light absorption, thus increasing the light harvesting efficiency. Other inorganic semiconductor-based solar cell that can withstand high temperature treatment can also have similar deposition of the sapphire thin film onto it. From the embodiments of the present invention as described herein, it is envisaged that a person skilled in the art can very well apply the present invention to deposit sapphire thin film on to other substrates such that the sapphire thin film will act as an anti-scratch protection layer to its underlying substrate provided these substrates can withstand the annealing temperatures of the present invention for the applicable duration of time.

Annealed Sapphire Thin Film by Sputtering Deposition

Sapphire Thin Film by Sputtering Deposition

The steps on sapphire thin film deposition on a given substrate by sputtering deposition are provided as follows:

1) The deposition of sapphire thin film can be performed by sputtering deposition using aluminum or aluminum oxide targets.

2) The substrates are attached onto the sample holder which is around 95 mm away from the target. The sample holder is rotated to achieve thickness uniformity when the deposition takes place, example rate is 10 RPM.

3) The base vacuum of evaporation chamber is less than $3 \times 10^{-6}$ mbar and the coating pressure is around $3 \times 10^{-3}$ mbar.

4) The thickness of film deposited on substrates is about 150 nm to 600 nm.

5) Higher temperature film deposition is possible from room temperature to 500° C.

Annealing Process of Another Embodiment of the Present Invention

After deposition of sapphire thin film on substrates, they are annealed in a furnace under a varying temperature from 500° C. to 1300° C. The temperature raising rate is 5° C./min and the decline rate is 1° C./min. The time ranges from 30 minutes to 2 hours, maintaining at a particular thermal annealing temperature. Multiple-step annealing at different temperatures are also used to enhance the hardness and also reduce the micro-crack of thin film. This is shown in Table 5.

TABLE 5

The surface hardness and XRD characteristic peaks at different annealing temperatures for the sapphire film on quartz prepared by sputtering deposition.

| Annealing Temperature (° C.) | Thickness (nm) | Surface hardness (Mohs) | XRD peaks (phase) | Transmission |
|---|---|---|---|---|
| No annealing | | 6-6.5 | No | |
| 500-850 | | 6-6.5 | No | |
| 850-1150 | 340-600 | Film delamination | theta & delta | |
| 1150-1300 | 150-300 | 8-8.5 | theta & delta | Low scattering 90% |
| | 300-500 | 8.5-8.8 | alpha & theta; alpha only | High scattering 83-87% |

Table 5 shows the changes of surface hardness of sapphire thin film on quartz as annealing temperature varies from 500° C. to 1300° C. In fact, the initial value of hardness of sapphire thin film without annealing by sputtering deposition is slightly higher than that by e-beam deposition; about 6-6.5 Mohs. After conducting thermal annealing process, the performance of the film in terms of hardness is different from that by e-beam deposition. When annealing temperature is in the range of 500° C.-850° C., the film hardness has no significant change. Within 850° C.-1150° C. range, the thin film coated on quartz is easily delaminated. However, within 1150° C.-1300° C. range, the film forms hard film, with its surface hardness of 8-8.5 Mohs in a thickness of 150 nm-300 nm and of 8.5-8.8 Mohs in a thickness of 300 nm-500 nm.

Figure 8A:
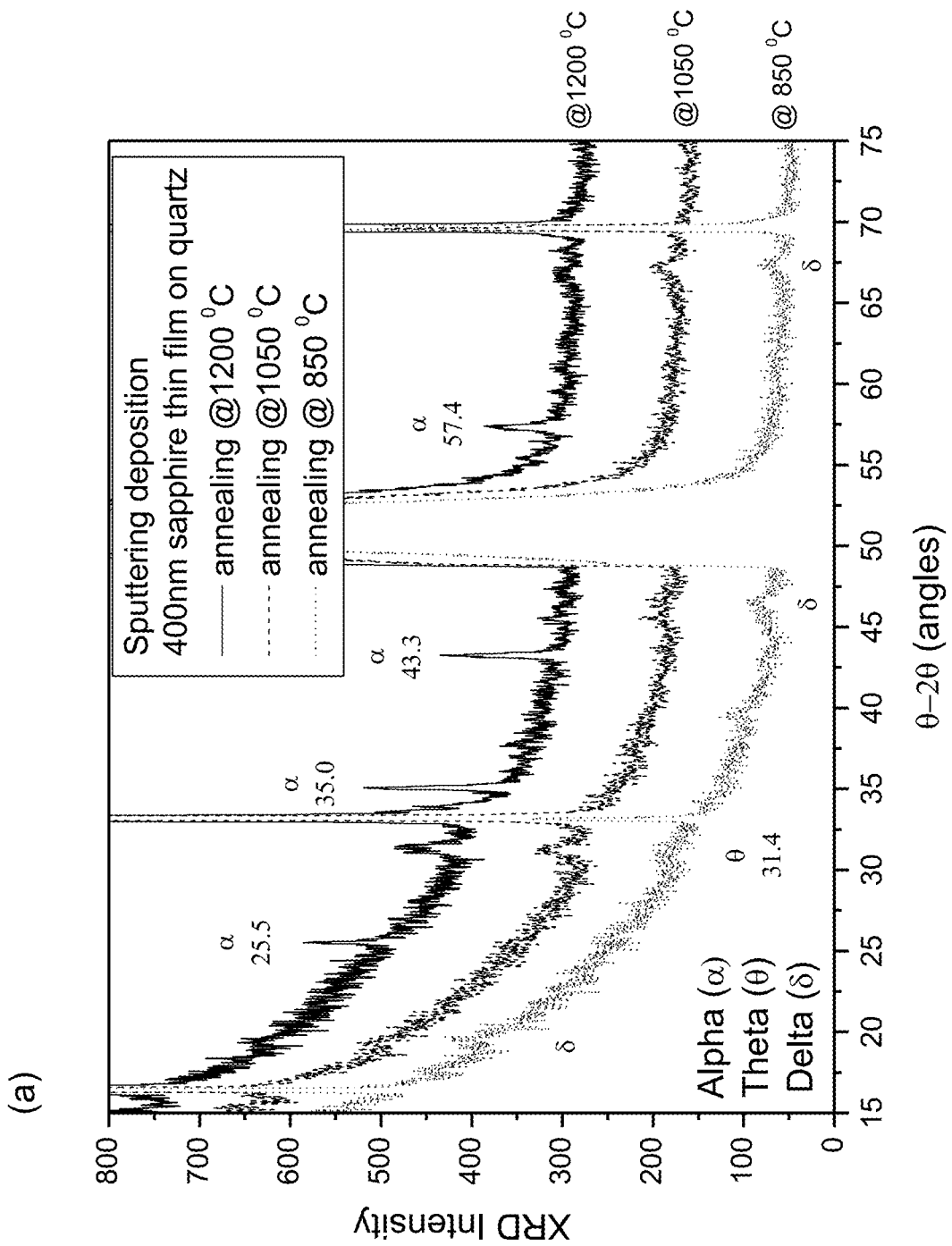
FIG. 8A shows XRD results for the 400 nm sapphire thin film on quartz prepared by sputtering deposition and annealing at 850° C., 1050° C. and 1200° C. for 2 hours.
Figure 8B:
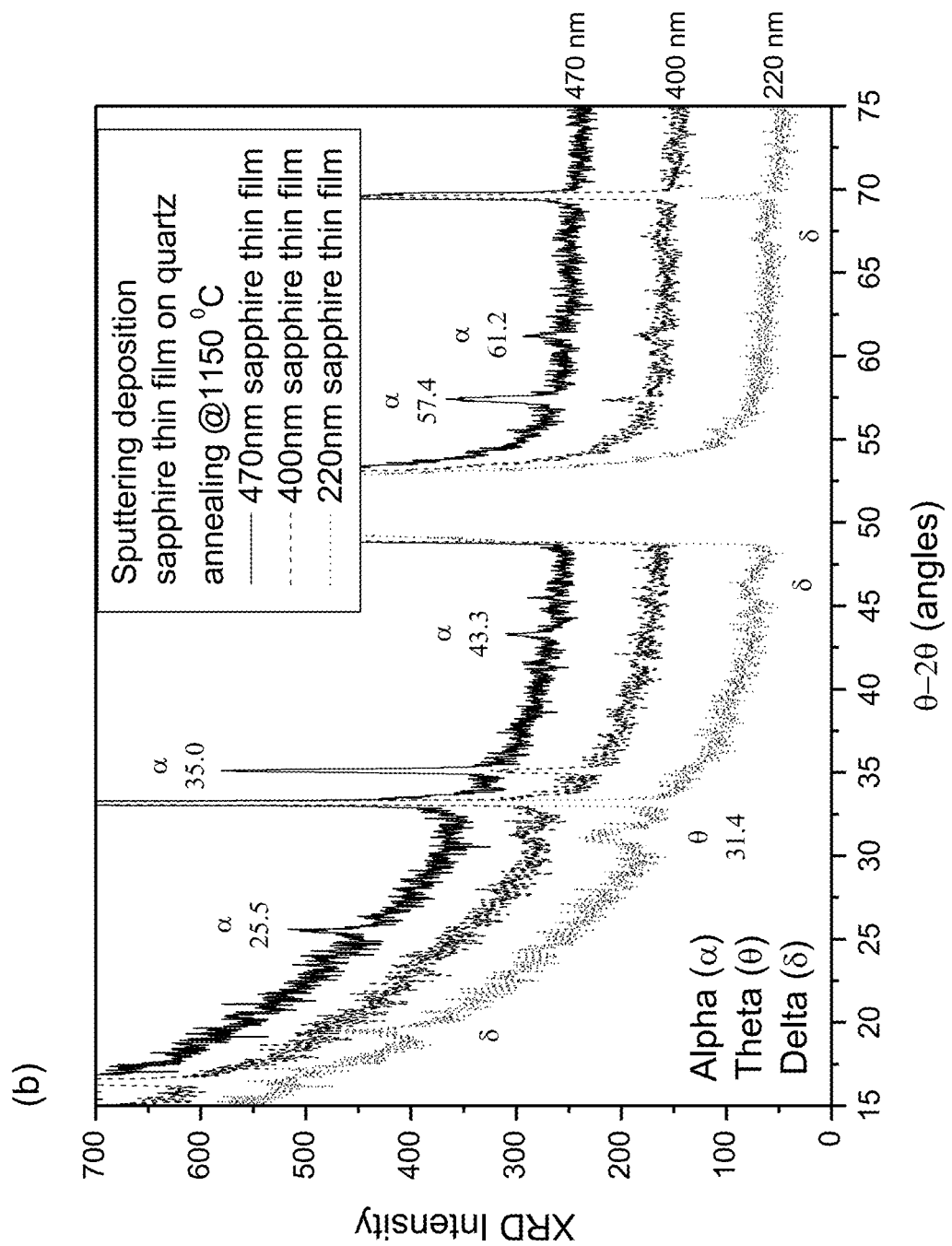
FIG. 8B shows XRD results for the sapphire thin film with thicknesses of 220 nm, 400 nm, and 470 nm on quartz prepared by sputtering deposition and annealing at 1150° C. for 2 hours.

FIG. 8A shows XRD results for the 400 nm sapphire thin films on quartz being annealed at 850° C., 1050° C. and 1200° C. for 2 hours. The occurring XRD peaks are corresponding to the mixing of delta ($\delta$), theta ($\theta$) and alpha ($\alpha$) structural phases of aluminum oxide. Different from e-beam evaporation, the occurrence of alpha phase of aluminum oxide in XRD result by sputtering deposition causes more hardened surface or higher surface hardness, scoring 8.7 Mohs in average. FIG. 8B shows XRD results for the sapphire thin film with thicknesses of 220 nm, 400 nm, and 470 nm on quartz being annealed at 1150° C. for 2 hours. The occurrence of alpha phase starts from the thickness of about 300 nm, and when the thickness of sapphire thin film increases up to 470 nm, the original mixing of structural phases almost converts to alpha phase. The surface hardness is the highest under such conditions. However, further increasing the thickness of sapphire thin film would cause film delamination.

Figure 9:
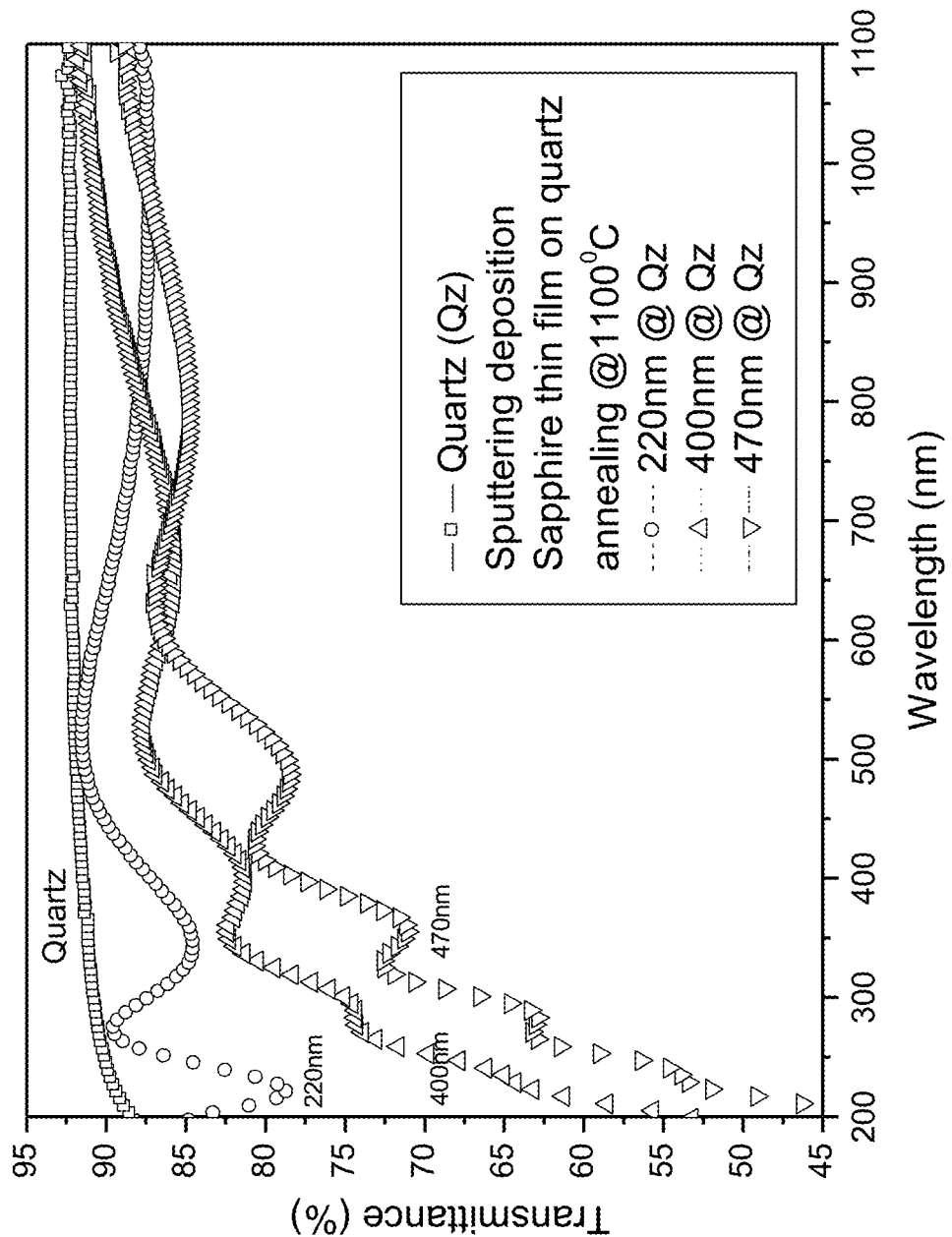
FIG. 9 shows the transmission spectra of 220 nm, 400 nm and 470 nm sapphire thin film on quartz by sputtering deposition and annealing at 1100° C. for 2 hours comparing with quartz substrate.

The light transmission spectra of 220 nm, 400 nm, and 470 nm sapphire thin film on quartz prepared by sputtering deposition being annealed at 1100° C. for 2 hours are shown in FIG. 9 while comparing to quartz substrate. For annealed 220 nm thick sapphire thin film on quartz, the optical performance is excellent and with a little scattering loss. The transmission in whole visible region from 400 nm-700 nm is greater than 87% and maximally 91.5% at 520 nm. The overall averaging transmittance is about 90.2%. The difference between the maximum and minimum intensities of the interference pattern is about 4.5% only.

However, when the thickness of sapphire thin film is greater than 300 nm, the light transmittance intensity starts to drop, especially in UV range, indicating that Rayleigh scattering starts to dominate. The strong wavelength dependence of Rayleigh scattering applies to the scattering particle with particle size, which is less than 1/10 wavelength. This is due to the formation of alpha phase in sapphire thin film with sub-100 nm crystalline size. Therefore, the surface hardness becomes higher but the transmission becomes worse.

For annealed 400 nm and 470 nm sapphire thin film on quartz, the light transmission percentage in whole visible region from 400 nm-700 nm is within 81%-88% and 78%-87% respectively. Their overall averaging transmittance values are about 85.7% and 83.0% respectively.

However, when the thickness of sapphire thin film is greater than 500 nm, larger crystallite accumulates with micro-cracks form, the film would crack and some micro-size pieces would detach from the substrate.

Sapphire Thin Film on Fused Silica by Sputtering Deposition

Apart from quartz substrate, low cost fused silica is a potential candidate for sapphire thin film coated substrates since the annealing temperature of fused silica is about 1160° C.

Table 6 showed the surface hardness of sapphire thin film on fused silica as annealing temperature varies from 750° C. to 1150° C. In fact, the initial value of hardness of sapphire thin film on fused silica without annealing by sputtering deposition is slightly lower than that on quartz; about 5.5-6 Mohs. For 850° C.-1150° C. range, the hardness is even worse, less than 5 Mohs for all 150 nm-600 nm thick sapphire thin films. However, at 1150° C., the film can form hard film again, which its surface hardness has 8-8.5 for all 150 nm-600 nm sapphire thin films.

TABLE 6

The surface hardness and XRD characteristic peaks at different annealing temperatures for the sapphire film on fused silica prepared by sputtering deposition.

| Annealing Temperature (° C.) | Thickness (nm) | Surface hardness (Mohs) | XRD peaks (phase) | Transmission |
|---|---|---|---|---|
| No annealing | 150-600 | 5.5-6 | No | |
| 850-1150 | 150-600 | <5 | theta & delta | |
| 1150-1300 | 150-300 | 8-8.5 | theta & delta | Low scattering 91% |
| | 300-600 | 8-8.5 | alpha & theta; alpha only | High scattering 74-82% |

Figure 10:
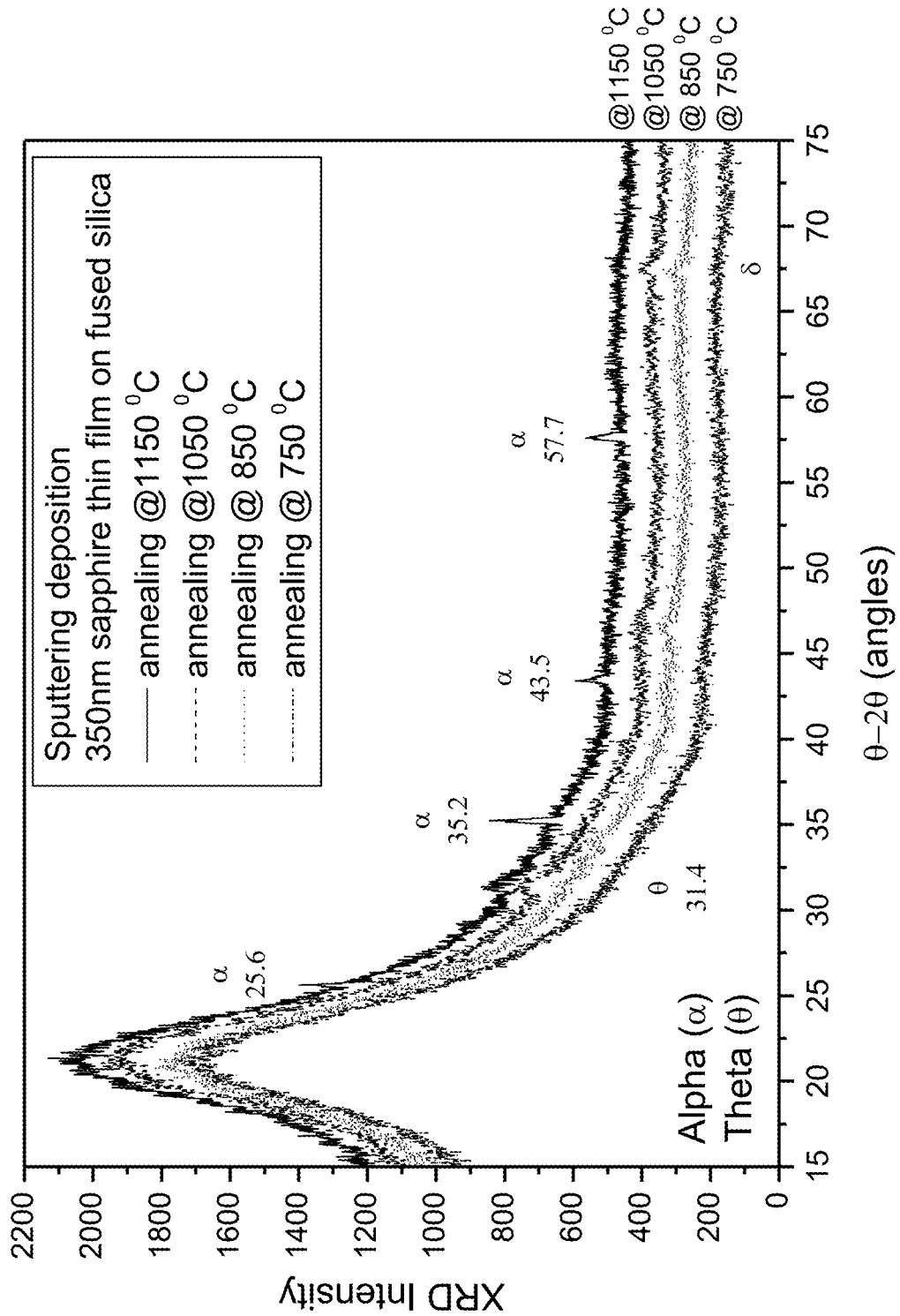
FIG. 10 shows XRD results for the 350 nm sapphire thin film on fused silica prepared by sputtering deposition and annealing at 750° C., 850° C., 1050° C., and 1150° C. for 2 hours.

FIG. 10 shows XRD results for the 350 nm thick sapphire thin film on fused silica prepared by sputtering deposition and annealing at 750° C., 850° C., 1050° C. and 1150° C. for 2 hours. XRD results show the mixing of theta and alpha structural phases of aluminum oxide co-exist on the fused silica substrate. Therefore, the sapphire thin film has a hard surface with 8-8.5 Mohs, whereas fused silica substrate has only scores 5.3-6.5.

Figure 11:
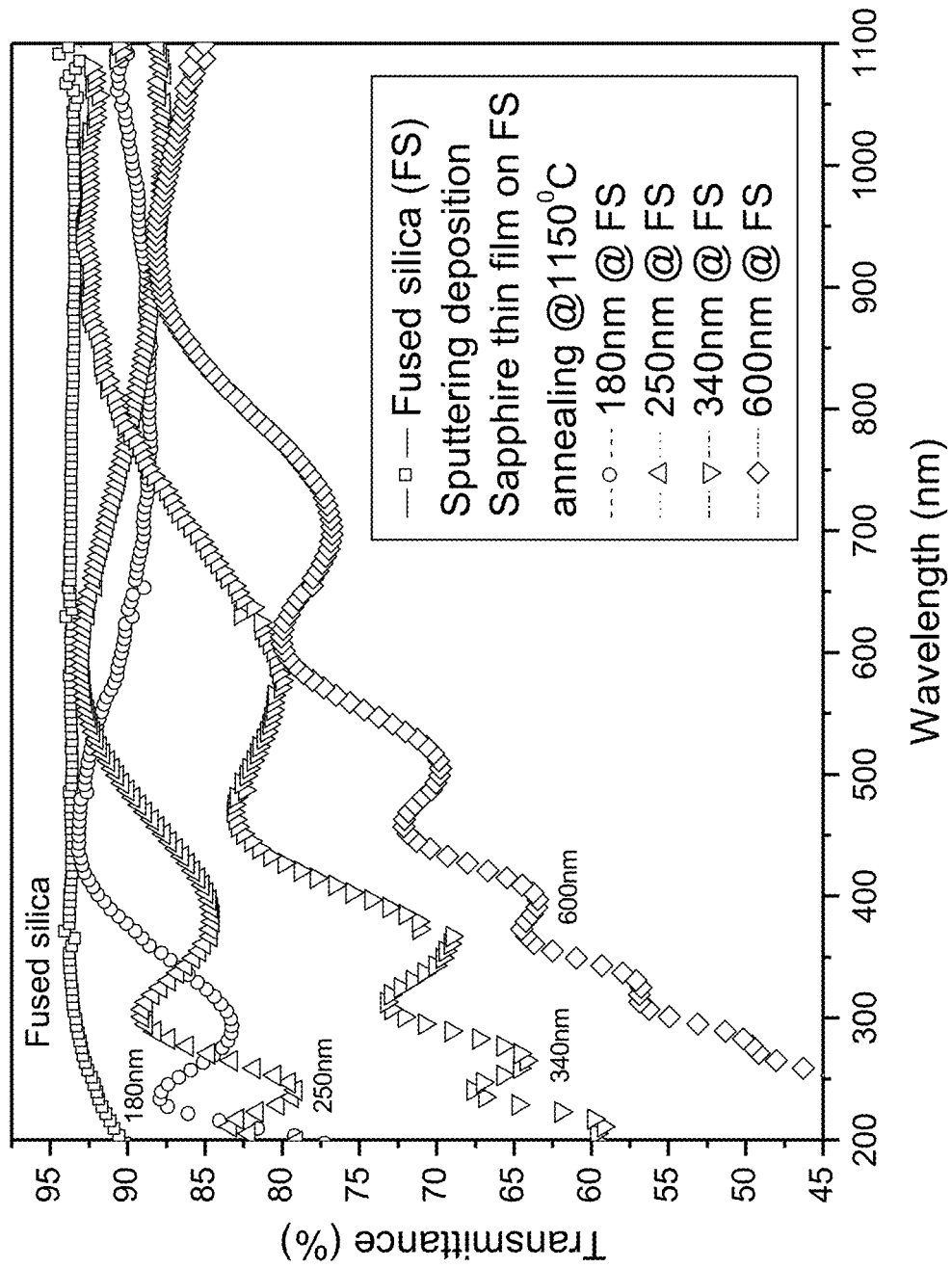
FIG. 11 shows the transmission spectra of 180 nm-600 nm sapphire thin film on fused silica by sputtering deposition and annealing at 1150° C. for 2 hours comparing with fused silica substrate.

The transmission spectra of 180 nm-600 nm thick sapphire thin film on fused silica prepared by sputtering deposition annealing at 1150° C. with 2 hours showed in FIG. 11 compared to fused silica substrate.

For annealed 180 nm and 250 nm thick sapphire thin film on fused silica, the optical performance is excellent and with a little scattering loss. The transmission of sapphire thin film in whole visible region from 400-700 nm is within 88.9%-93.1% and 84.8%-92.8% respectively. Their overall averaging transmittance values are about 91.3% and 90.7% respectively.

For annealed 340 nm and 600 nm thick sapphire thin film on fused silica, the transmission across visible region from 400 nm-700 nm is within 75%-86% and 64%-80% respectively. Their overall averaging transmittance is about 81.7% and 74.1% respectively.

Therefore, annealed sapphire thin film on fused silica at 1150° C. with a thickness of 150 nm-300 nm has good optical performance with about 91% transmittance and also has strong surface hardness with >8 Mohs.

Low Temperature Annealing Process

A current popular 'toughened' screen material is Gorilla Glass from Corning, which is being used in over 1.5 billion devices. On the Mohs scale of hardness, the latest Gorilla Glass only scores 6.5-6.8, which is below mineral quartz such that it is still easy to scratch by sand. Therefore, another approach is to deposit harder thin film on glass substrate. However, for most of common cover glasses, the allowed maximum annealing temperatures are in the range of 600° C.-700° C. At this temperature range, the previous hardness of annealed sapphire thin film can only reach 6-7 Mohs, which is close to that of glass substrate itself. Therefore, a new technology is developed to push the Mohs hardness of annealed sapphire thin film to over 7 using annealing temperature below 700° C.

In another embodiment of the present invention, a layer or multilayer of higher hardness thin film of sapphire is deposited onto a weaker hardness substrate (e.g. Gorilla glass, toughened glass, soda-lime glass, etc.) with maximum allowed annealing temperature below 850° C. Therefore, a harder anti-scratch thin film can be coated onto glass. This is the quickest lower cost way to improve their surface hardness.

In yet another embodiment of the present invention, by applying a nano-layer of metal, such as Ti and Ag, it is shown that polycrystalline sapphire thin film can be grown at lower temperature. This catalytic enhancement can be induced at temperature considerably lower than when the nano-metal catalyst is not used. The enhancement comes from enabling crystallization established once there is sufficient kinetic energy to allow deposited atoms to aggregate and this annealing temperature can start at 300° C. Embodiments of the present invention wherein the low temperature annealing starting from 300° C. is presented in Table 7.

TABLE 7

Embodiments with structure of Substrate/Ti catalyst/Sapphire film with no annealing (Room Temperature, i.e. RT), annealing temperatures of 300° C., 400° C., and 500° C.

| Substrate type | Annealing temperature | Annealing time | Ti catalyst thickness | Sapphire film thickness | Knoop hardness (HK0.01) | Increment in Knoop hardness |
|---|---|---|---|---|---|---|
| Fused silica | RT | / | / | / | 1100 | / |
| Fused silica | 300° C. | 2 hrs | 1.5 nm | 250 nm | 1101 | +0.09% |
| Fused silica | 400° C. | 2 hrs | 1.5 nm | 250 nm | 1250 | +13.64% |

TABLE 7-continued

Embodiments with structure of Substrate/Ti catalyst/Sapphire film with no annealing (Room Temperature, i.e. RT), annealing temperatures of 300° C., 400° C., and 500° C.

| Substrate type | Annealing temperature | Annealing time | Ti catalyst thickness | Sapphire film thickness | Knoop hardness (HK0.01) | Increment in Knoop hardness |
|---|---|---|---|---|---|---|
| Fused silica | 500° C. | 2 hrs | 1.5 nm | 250 nm | 1301 | +18.27% |
| Fused silica | 300° C. | 2 hrs | 3.0 nm | 250 nm | 1182 | +7.45% |
| Fused silica | 400° C. | 2 hrs | 3.0 nm | 250 nm | 1276 | +16.00% |
| Fused silica | 500° C. | 2 hrs | 3.0 nm | 250 nm | 1278 | +16.18% |
| Soda lime glass | RT | / | / | / | 788 | / |
| Soda lime glass | 300° C. | 2 hrs | 7.5 nm | 230 nm | 904 | +14.72% |
| Soda lime glass | 400° C. | 2 hrs | 7.5 nm | 230 nm | 977 | +23.98% |
| Soda lime glass | 500° C. | 2 hrs | 7.5 nm | 230 nm | 1052 | +33.50% |

Figure 13A:
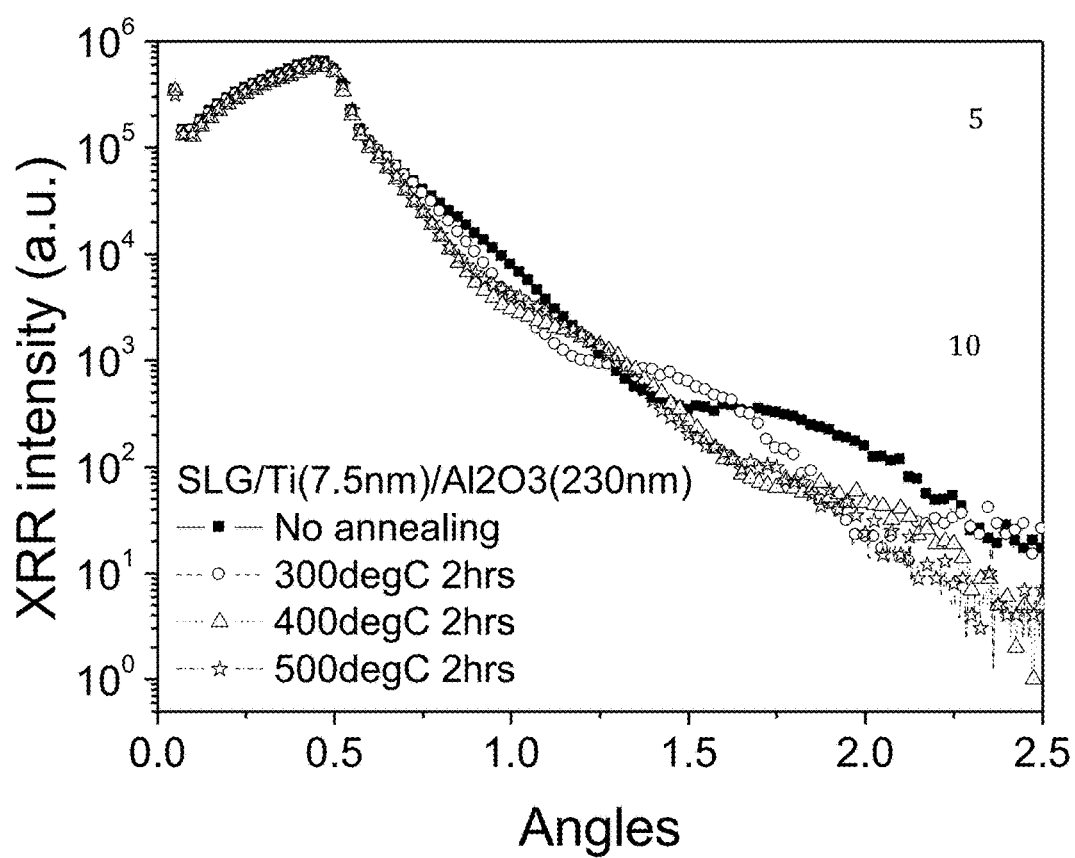
FIG. 13A shows the X-ray reflectivity (XRR) measurement results for different samples with different annealing conditions.
Figure 13B:
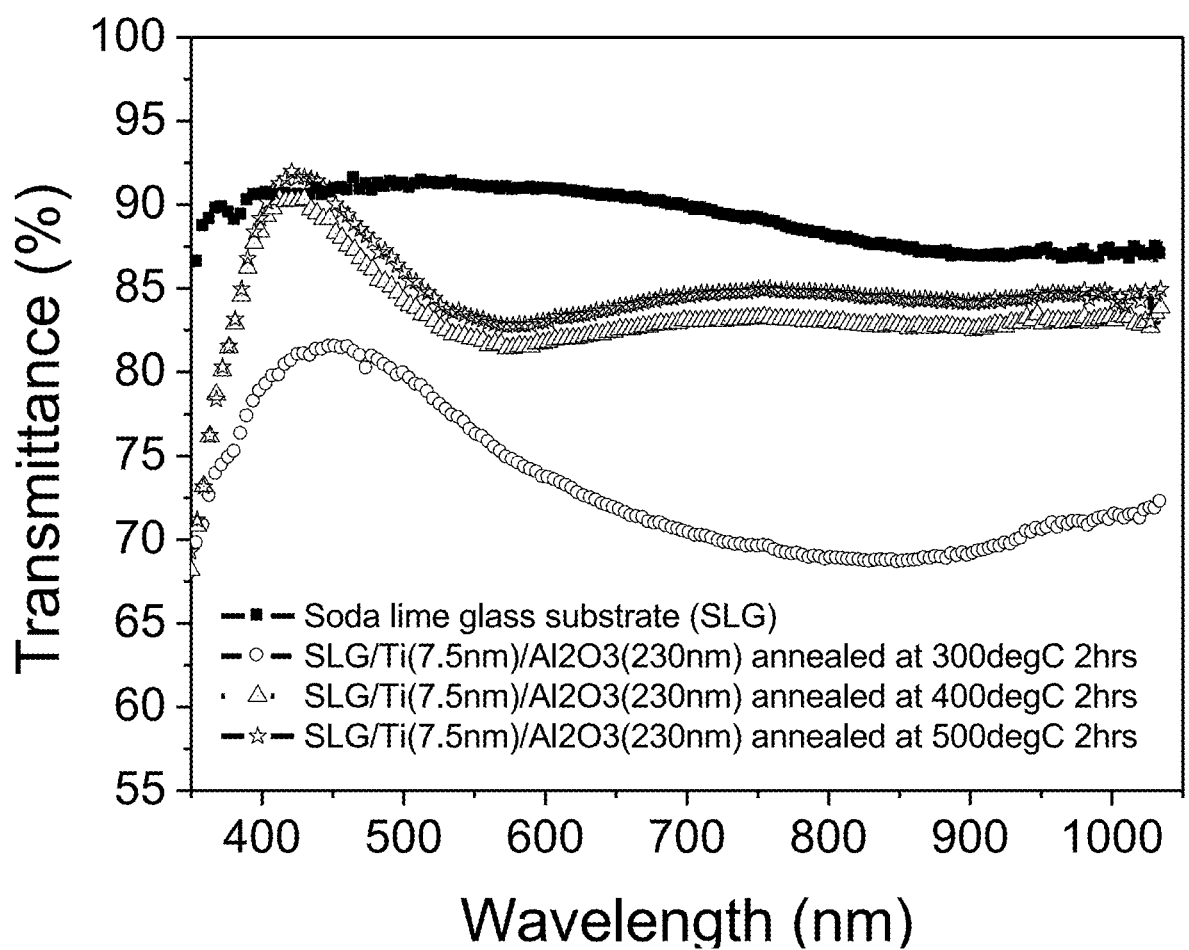
FIG. 13B shows the optical transmittance spectra for different samples with different annealing conditions.

FIG. 13A shows the X-ray reflectivity (XRR) measurement results for different samples with different annealing conditions as per embodiment in Table 7, while FIG. 13B shows the optical transmittance spectra for different samples with different annealing conditions as per embodiment in Table 7.

In one embodiment, a method is developed to deposit a very thin 'discontinuous' metal catalyst and a thicker sapphire film on glass substrate. With post-deposit treatment such as thermal annealing at 600-700° C., hardness of 7-7.5 Mohs is achieved, which is higher than that of most glasses.

The nano-metal catalyst should have a thickness between 1-15 nm deposited by deposition system such as e-beam evaporation or sputtering. This catalyst is not a continuous film, as shown by SEM. The deposited metal can have a nano-dot (ND) shape with (5-20 nm) diameter. The metals include Titanium (Ti), and silver (Ag). The thicker sapphire film is in the range of 100-1000 nm.

In fact, the hardness value of sapphire thin film by e-beam or sputtering deposition is not very high, which is about 5.5-6 Mohs only. However, after thermal annealing process, the film hardness is significantly improved. Without nano-metal catalyst, the film hardness is about 6-7 Mohs with annealing temperature 600-850° C. After adding the nano-metal catalyst, the film hardness is improved to 7-7.5 Mohs with annealing temperature of 600-700° C. and achieved with a hardness of 8.5 to 9 Mohs with annealing temperature of 701-1300° C.

This is a great improvement of surface hardness on glass substrate and in particular it is below the glass softening temperature at this annealing temperature. This means that glass will not deform during the annealing. Thus, the role of metal catalyst not only enhances the adhesion between sapphire thin film and glass substrate but also induces the hardening of the sapphire thin film. The surface hardness of sapphire thin film with and without nano-metal catalyst at different annealing temperature ranges prepared by e-beam deposition is shown in Table 8.

TABLE 8

The surface hardness of sapphire thin film with and without nano-metal catalyst at different annealing ranges prepared by e-beam deposition.

| Annealing temperature (° C.) | Surface hardness without nano-metal catalyst (Mohs) | Surface hardness with nano-metal catalyst (Mohs) |
|---|---|---|
| No annealing | 5.5 | 5.5-6 |
| 500/600-850 | 6-7 | 7-7.5 |
| 850-1150 | 7-8 | 7.5-8.5 |
| 1150-1300 | 8-8.5 | 8.5-8.8 |

The summary points on sapphire thin film deposited on a glass substrate by e-beam deposition are given as follows:

1) The base vacuum of evaporation chamber is less than $5\times10^{-6}$ torr and the deposited vacuum keeps below $1\times10^{-5}$ torr when the deposition takes place.

2) The substrates are attached onto the sample holder at a distance from the evaporation source, for example 450 mm. The sample holder is rotated at 1-2 RPM when the deposition takes place.

3) The deposition of nano-metals with higher melting points such as Ti, Cr, Ni, Si, Ag, Au, Ge and etc., is using deposition system such as e-beam evaporation and sputtering. The thickness of metal catalyst directly deposited on substrates is about 1-15 nm monitoring by QCM sensor. The deposition rate of nano-metal catalyst is about 0.1 Å/s. The substrate during deposition is without external cooling or heating. The film morphology was measured by SEM top-view and cross-section view.

4) The deposition of sapphire thin film is using e-beam evaporation since it has very high melting point at 2040° C. The white pellets or colorless crystal in small size of pure aluminum oxide are used as the e-beam evaporating sources. The high melting point of aluminum oxide also allows for annealing temperatures up to less than the melting point of sapphire (e.g. 2040° C. at atmospheric pressure).

5) The thickness of sapphire thin film deposited on substrates is about 100 nm to 1000 nm. The deposition rate is about 1-5 Å/s. The substrate during deposition is at room temperature and active temperature is not essential. The film thicknesses can be measured by ellipsometry method or other appropriate methods with similar or better accuracy.

6) After deposition of sapphire thin film on substrates, they are annealed in a furnace with a temperature varying from 500° C. to 1300° C. The temperature raising gradient should be gradual for example 5° C./min and the decline gradient should also be gradual for example 1-5° C./min. The annealing time ranges from 30 minutes to 10 hours within the specified thermal annealing temperature range.

Multiple-steps annealing with different temperatures within the aforementioned range can also be used to enhance the hardness and also reduce the micro-crack of thin film.

Figure 12:
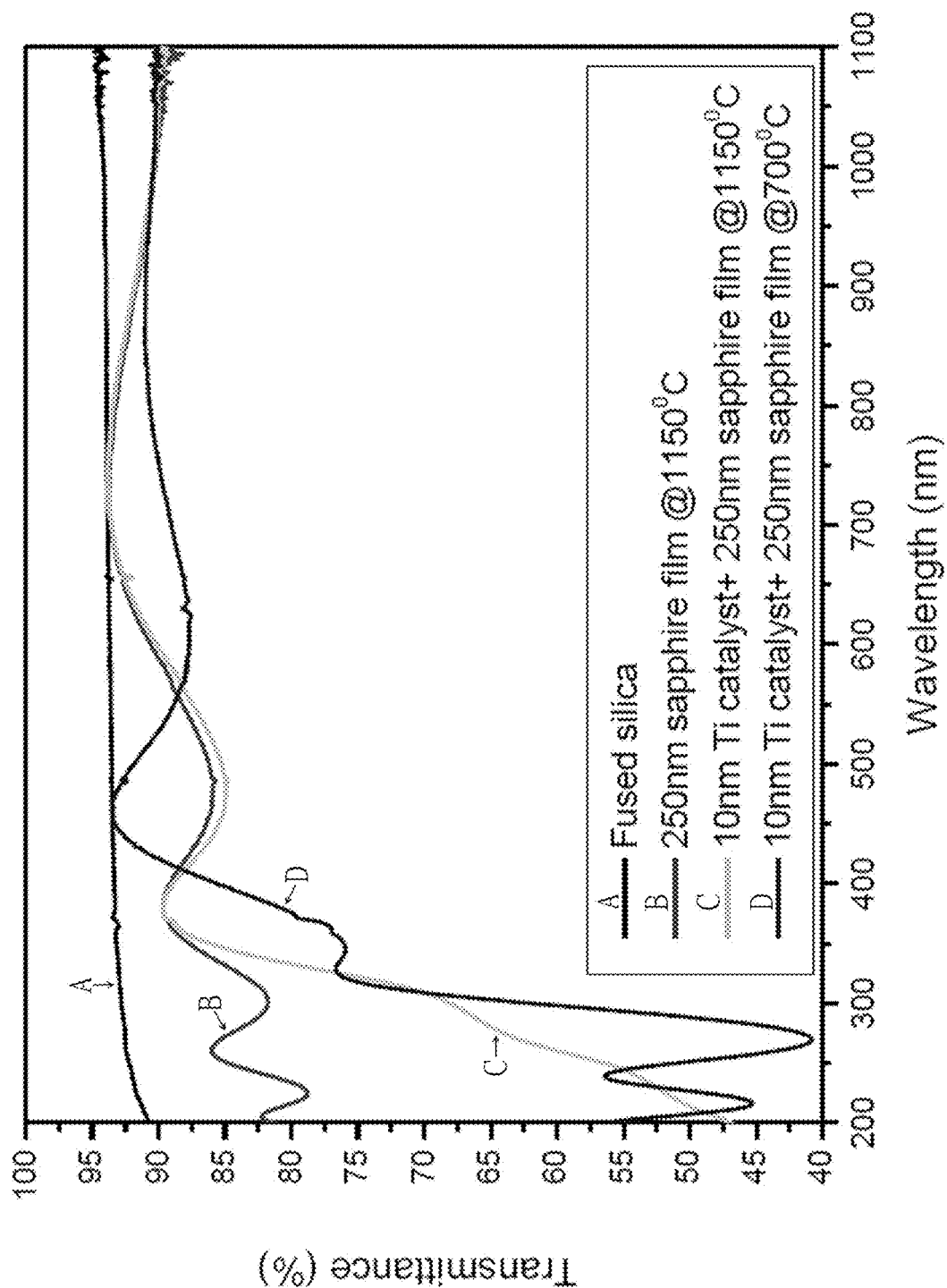
FIG. 12 shows the transmission of fused silica and 250 nm annealed sapphire thin film with or without 10 nm Ti catalyst on fused silica annealing at 700° C. and 1150° C. for 2 hours.

The transmission of fused silica and 250 nm annealed sapphire thin film with or without 10 nm Ti catalyst on fused silica annealing at 700° C. and 1150° C. for 2 hours are shown in FIG. 12. For 700° C. annealing result, the averaged transmission percentage in visible region from 400-700 nm is greater than 89.5% and reaches a maximum of 93.5% at 462 nm while fused silica substrate has an average transmission of 93.5%.

Thin Film Transfer Process

Another embodiment of present invention provides a method and apparatus of fabrication of a multilayer flexible metamaterial using flip chip transfer (FCT) technique. Such metamaterial includes a thin film harder substrate transferred onto a softer flexible substrate. This technique is different from other similar techniques such as metal lift off process, which fabricates the nanostructures directly onto the flexible substrate or nanometer printing technique. It is a solution-free FCT technique using double-side optical adhesive as the intermediate transfer layer and a tri-layer metamaterial nanostructures on a rigid substrate can be transferred onto adhesive first. Another embodiment of the present invention is the fabrication method and apparatus that allows the transfer of the metamaterial from a rigid substrate such as glass, quartz and metals onto a flexible substrate such as plastic or polymer film. Thus, a flexible metamaterial can be fabricated independent of the original substrate used.

Device Fabrication

A schematic fabrication process of multilayer metamaterials is shown in FIG. 14. First, the multilayer plasmonic or metamaterial device is fabricated on chromium (Cr) coated quartz using conventional EBL process. The 30 nm thick Cr layer is used as a sacrificial layer. Then a gold/ITO (50 nm/50 nm) thin film is deposited onto the Cr surface using thermal evaporation and RF sputtering method respectively. Next, a ZEP520A (positive e-beam resist) thin film with a thickness of about 300 nm is spun on top of the ITO/gold/Cr/quartz substrate and a two-dimensional hole array is obtained on the ZEP520A using the EBL process. To obtain the gold nanostructure (disc pattern), a second 50 nm thick gold thin film is coated onto the e-beam patterned resist. Finally, a two-dimensional gold disc-array nanostructures is formed by removing the resist residue. The area size of each metamaterial pattern is 500 μm by 500 μm, and the period of the disc-array is 600 nm with disc diameter of ~365 nm.

Flip Chip Transfer (FCT) Technique

Transfer process of flexible absorber metamaterial is shown in FIG. 15, double-sided sticky optically clear adhesive (50 μm thick; e.g. a commercially available product manufactured by 3M) is attached to the PET substrate (70 μm thick). Thus, the tri-layer metamaterial device is placed in intimate contact with optical adhesive and sandwiched between the rigid substrate and the optical adhesive. Note that the Cr thin film on quartz substrate is exposed to the air for several hours after the RF sputtering process, such that there is a thin native oxide film on the Cr surface. Hence the surface adhesion between Cr and gold is much weaker than that of gold/ITO/gold disc/optical adhesive bounding. This allows the tri-layer metamaterial nanostructure to be peeled off from the Cr coated quartz substrate. Once the metamaterial nanostructure is transferred onto the PET substrate, it possesses sufficient flexibility to be bended into various shapes. Finally, the metamaterial nanostructure is encapsulated by spin-coating a 300 nm thick PMMA layer on top of the device.

In another embodiment, the present invention provides a novel NIR metamaterial device that can be transformed into various shapes by bending the PET substrate.

FIG. 16(a) shows the flexible absorber metamaterial sandwiched by the transparent PET and PMMA thin film. Several absorber metamaterial nanostructures with area size of 500 μm by 500 μm are fabricated on flexible substrate. In fact, using the flexibility property of the PET layer, the absorber metamaterial device can be conformed into many shape e.g. cylindrical shape (FIG. 16(b)). The minimum radius of the cylindrical substrate is about 3 mm, not obvious defect on the metamaterial device can be observed after 10 times of repeatable bending tests.

Optical Characterization and Simulation

The tri-layer metal/dielectric nanostructure discussed above is an absorber metamaterial device. The design of the device is such that the energy of incident light is strongly localized in ITO layer. The absorbing effects of the NIR tri-layer metamaterial architecture could be interpreted as localized surface plasmon resonance or magnetic resonance. The absorbing phenomenon discussed here is different from the suppression of transmission effect in metal disc arrays, in which the incident light is strongly absorbed due to resonance anomaly of the ultrathin metal nanostructure. To characterize the optical property of gold disc/ITO/gold absorber metamaterial, Fourier Transform infrared spectrometer (FTIR) is used to measure the reflection spectrum of the absorber metamaterial. By combining the infrared microscope with the FTIR spectrometer, transmission and reflection spectra from micro-area nanophotonic device can be measured. In FIG. 17, the reflection spectrum (Experiment line plot) from air/metamaterial interface was measured with sampling area of 100 μm by 100 μm. At the absorption peak with wavelength of ~1690 nm, reflection efficiency is about 14%, i.e. the absorber metamaterial works at this wavelength. In RCWA simulation (Simulation line plot), the real optical constants in E. D. Palik, Handbook of optical constants of solids, Academic Press, New York, 1985 is used; the content of which is incorporated herein by reference in its entirety. At resonant wavelength, the experiment and calculation agree well with each other.

Figure 18A:
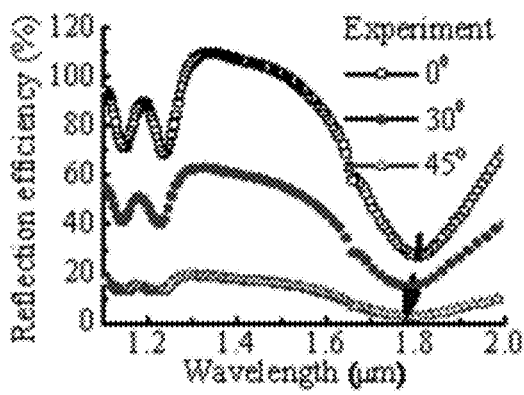
FIG. 18A shows that Angle resolved back reflection spectra measured on flexible metamaterial (with curved surface), the light being incident from PET side and the back reflection was collected by NIR detector.
Figure 18B:
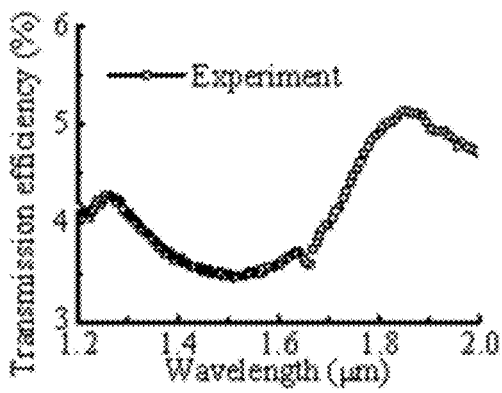
FIG. 18B shows that transmission spectra measured on the flexible absorber metamaterial, the light being incident from the PMMA side was collected from the PET side.
Figure 18C:
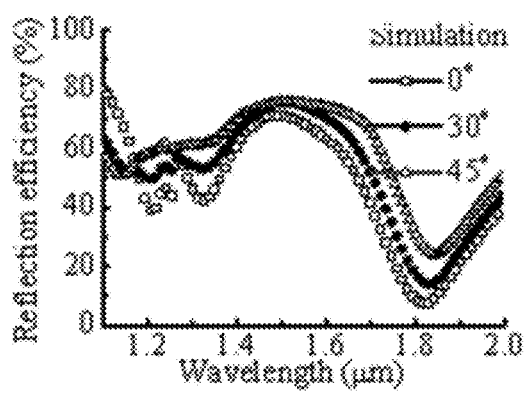
FIG. 18C and FIG. 18D are simulated reflection and transmission spectra, respectively, on flexible absorber metamaterial using RCWA method.
Figure 18D:
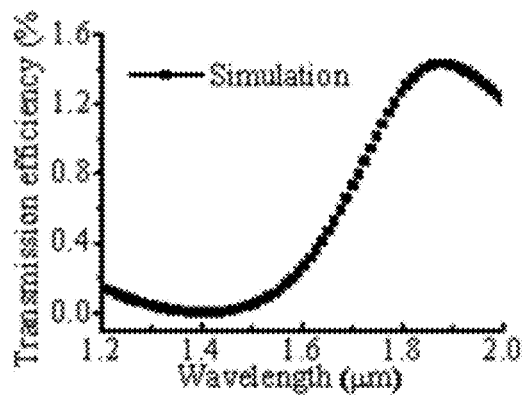

Reflection spectrum of the flexible absorber metamaterial is shown in FIG. 18(a) (0° line plot). Compared to the FTIR result shown in FIG. 17, the absorption dip of the flexible metamaterial has red shifted to ~1.81 μm. This red shift is mainly due to the refractive index change of the surrounding medium (refractive index of optical adhesive and PET is about 1.44). In FIG. 18(c) and FIG. 18(d), three-dimensional rigorous coupled wave analysis (RCWA) method is employed to calculate the reflection and transmission spectra on the absorber metamaterial, and experimentally confirmed parameters of materials of gold, ITO, Cr, $SiO_2$, and PET were used. Resonant absorption at wavelength of ~1.81 μm can also be observed in theoretical simulations. However, there are two resonant dips around 1.2 μm in the measured reflection spectrum. In the RCWA calculation (FIG. 18(c)), the double dips are reproduced and ascribed to two localized resonant modes, as they are not very sensitive to incident angles. For the angle dependent calculation, TE polarized light is used (electric field is perpendicular to incident plane) to fit the experimental result. While the incident angle is changed from 0 to 45 degree, reflection efficiency shows an increasing trend as light cannot be efficiently localized under large angle incidence. However, the back-reflection efficiency in experiment (FIG. 18(a)) decreases obviously. This is because the current experimental setup (discussed in next section) only allows the collection of the back-reflection signal (incident and collection direction are same as each other), and the collection efficiency is very low for large incident angles. In FIG. 18(*b*), transmission spectrum of the flexible metamaterial was measured using the same FTIR setup, the main difference is light was incident from the air/PMMA interface. A Fano-type transmission peak is observed at wavelength ~1.85 µm. At resonant wavelength, the transmission efficiency from experiment is higher than that in the theoretical simulation (FIG. 18(*d*)). This could be due to defects on gold planar film and the two-dimensional disc arrays, which enhances the efficiency of leakage radiation and thus contribute to the higher transmission efficiency in the measured results.

Figure 19:
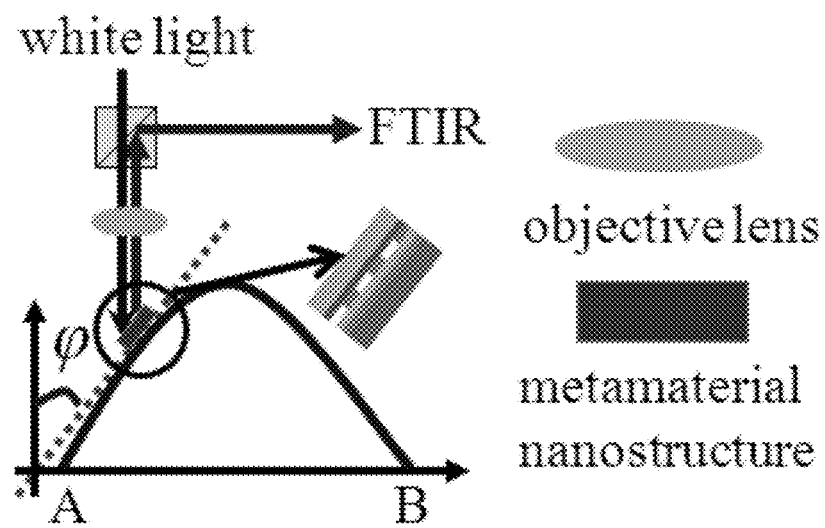
FIG. 19 shows experiment diagram of measuring the reflection spectrum of metamaterial device under different bending condition; the flexible substrate was bent by adjusting the distance between A and B, and the incident angle 90°-ø (varying from 0 to 45 degree) was defined by the slope of PET substrate and direction of incident light.

As shown in FIG. 19, bending PET substrate allows the measurement of the optical response of absorber metamaterial under different curving shape. The shape of the bent PET substrate is controlled by adjusting the distance between substrate ends (A and B). The angle for the resolved back-reflection on the absorber device is measured by varying the bending conditions. From FIG. 19, the incident angle (90°-ø) is determined from the bending slope at the position of the metamaterial device. From FIG. 18(*a*), it is observed that when the incident angle increases from 0 to 45 degree, the intensity of the back reflection becomes weaker and the absorption dip becomes shallower. Nevertheless, it can be shown that the resonant absorption wavelength of the flexible absorber metamaterial is not sensitive to the incident angle of light. Devices made from the metamaterials can be made into highly sensitive sensors. This invention provides a novel technique in fabricating metamaterial devices on a flexible substrate. The flexibility allows the device to bend and stretch, altering the device structure. Since the resonant frequency of each device is a function of the device structure, the resonant frequency can be tuned by the bending and stretching of the substrate. Hence, another embodiment of the present invention is a metamaterial that enables a physical means to change the structure of the material, which leads to a change in its resonant frequency, without the need to change the material composition. As such, an embodiment of the present metamaterial is a flexible plasmonic or metamaterial nanostructure device used as an electromagnetic wave absorber.

According to the aforementioned embodiments of the present invention, a highly flexible tri-layer absorber metamaterial device working at NIR wavelength can be realized. Using the FCT method, a tri-layer gold disc/ITO/gold absorber metamaterial is transferred from quartz substrate to a transparent PET substrate using optically clear adhesive (e.g. a commercially available product manufactured by 3M). Furthermore, the tri-layer absorber metamaterial is encapsulated by PMMA thin film and optical adhesive layer to form a flexible device. A FTIR experiment showed that the absorber metamaterial works well on both the quartz substrate and the highly flexible PET substrate. Angle insensitive absorbing effects and Fano-type transmission resonance can also be observed on this flexible metamaterial.

Moreover, the solution-free FCT technique described in this invention can also be used to transfer other visible-NIR metal/dielectric multilayer metamaterial onto flexible substrate. The flexible metamaterial working at visible-NIR regime has many advantages by manipulating light in three-dimensional space, especially when the metamaterial architecture is designed on curved surfaces. In another embodiment of the present invention, the FCT technique of the present invention can be adopted to transfer a hardened thin film on to a softer, flexible substrate.

Experimental Details on Transferring Thin Film onto Flexible Substrate

A Method is adopted for transferring $Al_2O_3$ thin films from rigid substrate to PET substrate using weak adhesive metal interlayers. This approach is based on the referenced U.S. Non-Provisional patent application Ser. No. 13/726,127 filed on Dec. 23, 2012 and U.S. Non-Provisional patent application Ser. No. 13/726,183 filed on Dec. 23, 2012, both of which claim priority from U.S. Provisional Patent Application No. 61/579,668 filed on Dec. 23, 2011. One embodiment of the present invention is to use transparent polyester tape, applying mechanical stress to separate the $Al_2O_3$ thin films altogether from the sacrificial metal layer. Then, the $Al_2O_3$ thin films are transferred to the PET substrate and the sacrificial metal layer is etched away by acid.

Figure 20:
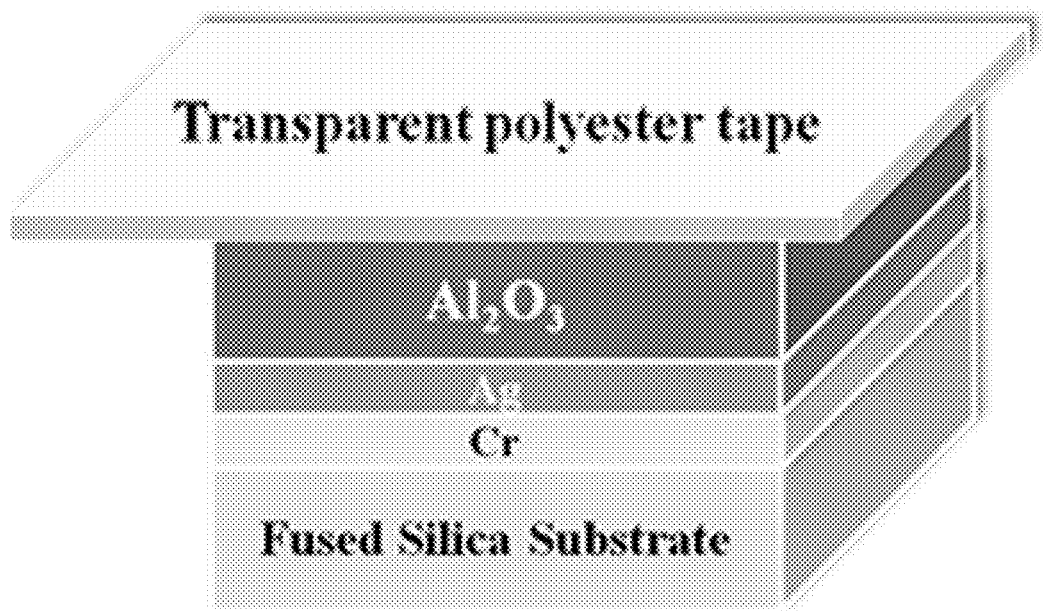
FIG. 20 shows the fabrication structure for $Al_2O_3$ thin film transfer.
Figure 21:
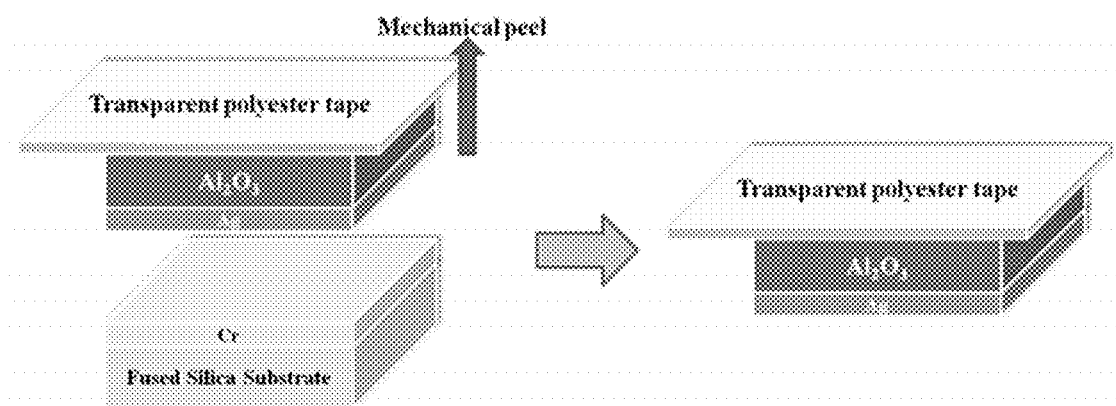
FIG. 21 shows the peeling off of $Al_2O_3$ thin film from the donor substrate.
Figure 22:
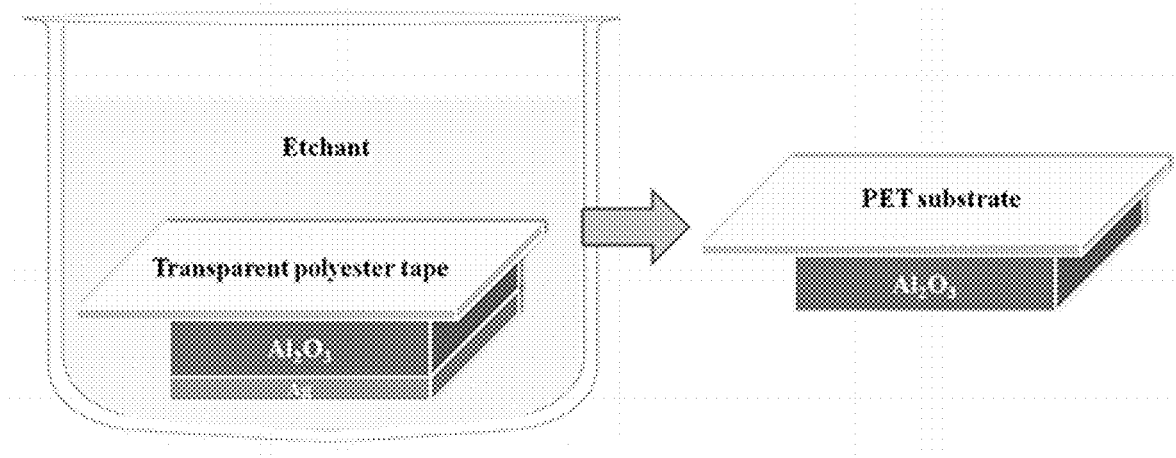
FIG. 22 shows the etching of sacrificial Ag layer to complete the $Al_2O_3$ thin film transfer to PET substrate.

First, a thin (i.e. 30-100 nm-thick) chromium (Cr) film is deposited onto a fused silica substrate followed by a thin (i.e. 30-100 nm-thick) silver (Ag) film being deposited on top of Cr. Then another layer of metal such as Ti film (3-10 nm thick) is deposited and this is for annealing process. Then, a $Al_2O_3$ thin film (e.g. 100-500 nm) is deposited onto the metal layers. Annealing is then performed under the temperature range 300° C.-800° C. per the embodiment of low temperature annealing process of the present invention as disclosed earlier herein. Flexible transparent polyester tape with optical transmission higher than 95% is attached to the $Al_2O_3$ film and the hardened $Al_2O_3$ thin film is mechanically peeled back. The fabrication structure is schematically illustrated in FIG. 20. Due to different surface energies, the adhesion between Cr and Ag is weak and therefore can be easily overcome by applying stress. The applied stress composed of both pure opening stress mode and shear stress mode. These two modes ensure that there is a clean separation between Ag and Cr. Under the applied stress, the hardened $Al_2O_3$ thin film would detach itself from the rigid substrate altogether with the sacrificial Ag layer and flexible transparent polyester tape as shown in FIG. 21. Finally, the sacrificial Ag layer is etched away by immersing the assembly as depicted in FIG. 21 by acid such as diluted $HNO_3$ (1:1). Since the tape and $Al_2O_3$ thin film are acid-resistant, the etchant solution would only etch away the sacrificial Ag layer faster. $Al_2O_3$ is fully transferred to PET substrate depicted in FIG. 22 after Ag thin film is completely etched away.

Results

Figure 23:
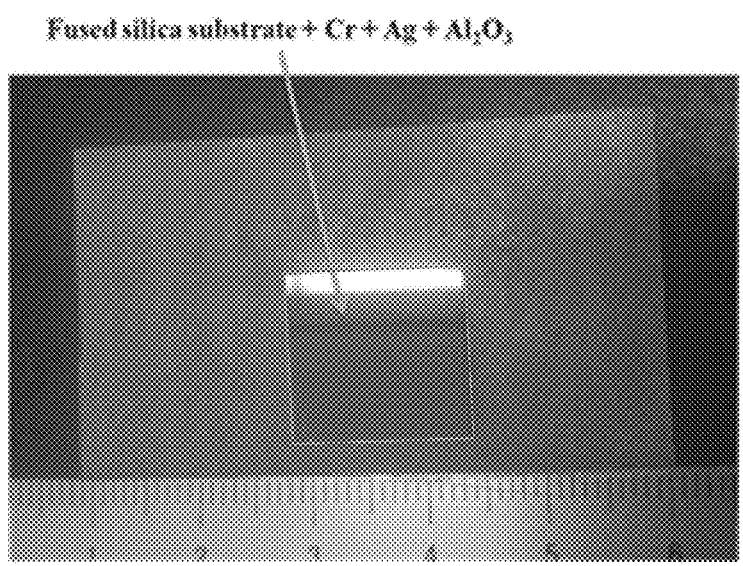
FIG. 23 shows the fabrication sample of $Al_2O_3$ assembly ready for thin film transfer.

FIG. 23 shows the sample fabricated for transfer of $Al_2O_3$ thin film. On the fused silica substrate, Cr was first sputtered onto the substrate with a typical thickness of 50 nm at a sputtering yield at about 5 nm/min. Then, 50 nm Ag was deposited on top of it by e-beam evaporation. Finally, $Al_2O_3$ of about 200 nm thick was deposited to the assembly by e-beam evaporation.

Figure 24:
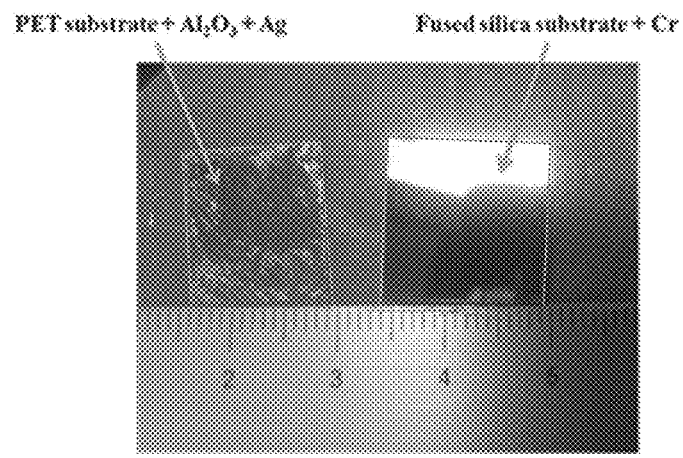
FIG. 24 shows the separation of $Al_2O_3$ from donor substrate.

FIG. 24 shows the peel off of $Al_2O_3$ film from fused silica substrate and Cr after applying mechanical peel with a transparent tape. $Al_2O_3$ detaches from the rigid substrate completely and smoothly without any cracks and bubbles together with Ag film and tape. $Al_2O_3$ is successfully transferred to the flexible PET substrate after etching away the sacrificial Ag layer in acid.

In yet another embodiment of the present invention, the present inventors have discovered through their trials, experimentations and research that to accomplish the task of depositing a layer of higher hardness thin film (of sapphire) onto a weaker hardness substrate e.g. soda lime glass (SLG), quartz and (toughened) glass. This combination is better than bare sapphire substrate. In nature, the higher hardness materials would have worse toughness so sapphire substrate is hard to scratch but it is brittle to break. Therefore, using the weaker hardness substrate with higher hardness thin film coating is best combination. Relative weaker hardness substrates have small fragmentation possibility, good mechanical performance, and lower cost. The function of anti-scratch is to achieve by using the high hardness thin film coating.

In this invention, there is provided a method to deposit a high hardness alumina thin film on quartz substrate. The thin film thickness is in the range of 100-1000 nm. With post-deposit treatment such as thermal annealing at 25° C.-375° C., wherein 25° C. is considered room temperature, this invention has achieved hardness of more than 14 GPa which is harder than uncoated soda lime glass which has typical hardness of 8-8.5 GPa. This technology is called "Sapphire thin film coated substrate". Therefore, in terms of hardness, the sapphire thin film coated substrate is comparable to that of pure sapphire screen, and its weight is almost the same as that of glass/quartz substrate which is roughly 66.6% comparing to pure sapphire substrate since the density of quartz is only 2.65 g/cm$^3$ while sapphire is 3.98 g/cm$^3$. Since one can cut the substrate to the desired size then deposit the sapphire thin film, the fabrication cost and time is significantly reduced comparing to pure sapphire substrate.

It was found that the alumina thin film coated on soda lime glass via sputtering and with thermal annealing at 25° C. for 0.5 hour is harder than uncoated soda lime glass. The film hardness was improved to greater than 14 GPa. Therefore, the hardness of annealed alumina thin film on soda lime glass substrate is greater than the uncoated soda lime glass.

Moreover, under the present invention, the annealing process of alumina thin film on other substrates is conducted at room temperature.

Deposition Process

Deposition substrate e.g. soda lime glass, quartz, glass.

Substrate temperature during deposition: from room temperature –1000° C.

Thin film thickness: 100 nm-1000 nm.

Thermal annealing time: 30 minutes-2 hours.

The deposition of alumina thin film is using sputtering or e-beam.

The thickness of the film deposited on substrates is about 100 to 1000 nm. The deposition rate is about 1 Å/s. The substrate during deposition is without external cooling or heating. The film thicknesses are measured by ellipsometry method.

After deposition of alumina thin film on substrates, they are annealed from 25° C. The time ranges from 30 minutes to 2 hours, keeping on the particular thermal annealing temperature.

The deposition substrates are including soda lime glass.

Figure 25:
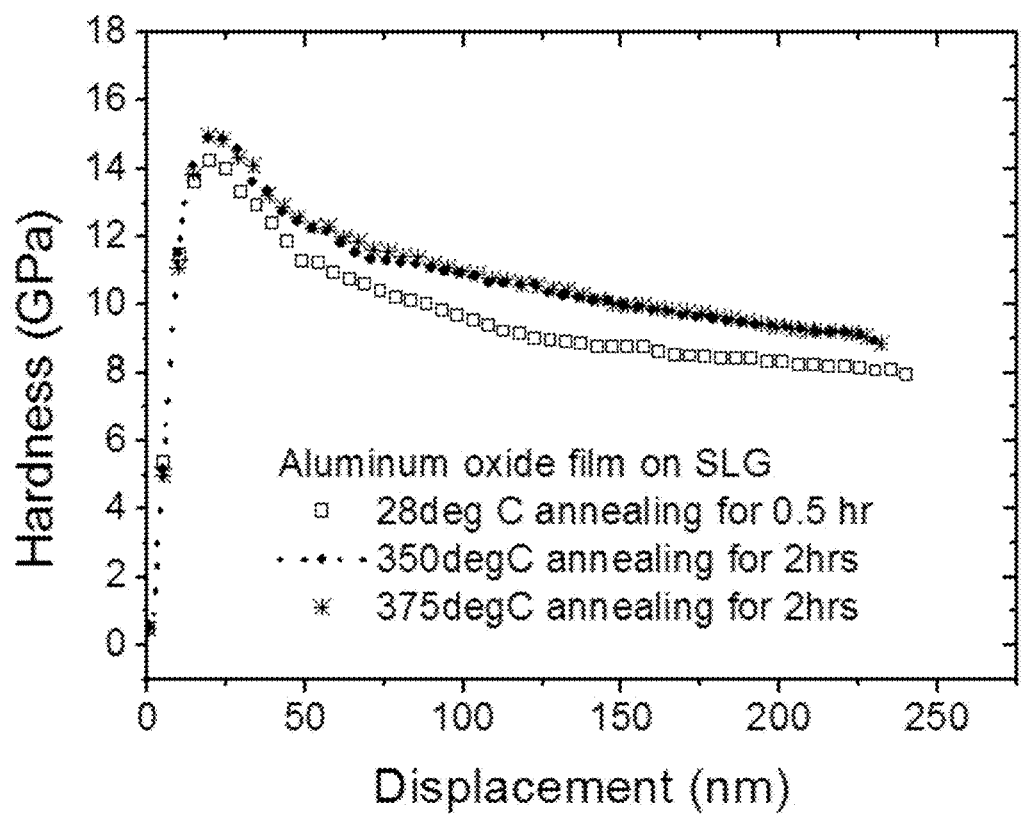
FIG. 25 shows the nanoindentation results of aluminum oxide film on Soda lime glass (SLG) substrate with different post annealing conditions.

The nanoindentation results of aluminum oxide film on Soda lime glass (SLG) substrate with different post annealing conditions are showed in FIG. 25.

Further Embodiments of the Present Invention

Figure 26:
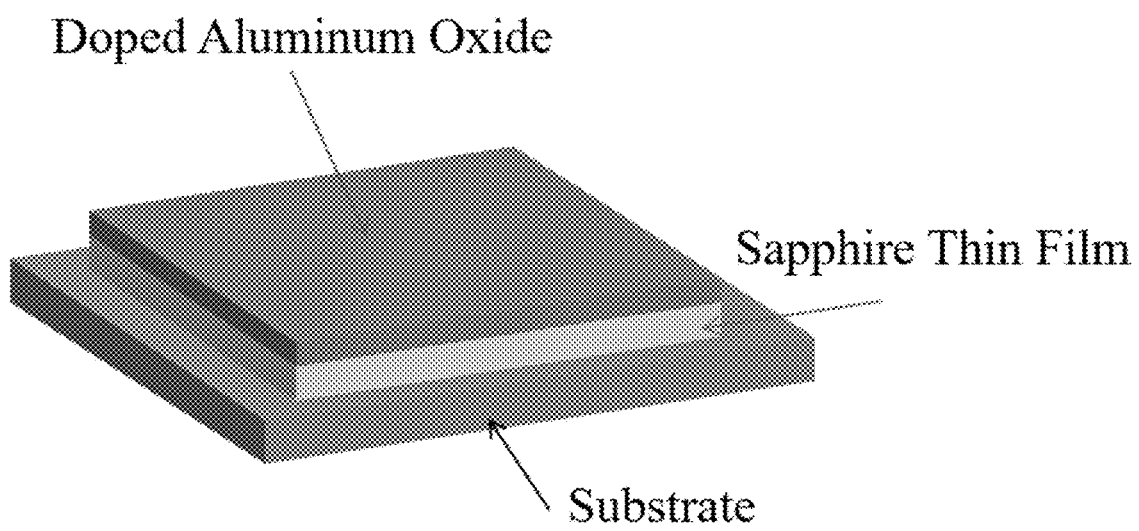
FIG. 26 shows the structure of the sample of a doped aluminum oxide layer deposited on top of sapphire thin film.

In a further embodiment of the present invention, a layer of doped aluminum oxide (sapphire) thin film can be deposited on sapphire thin film coated substrates acting as a strengthen layer. FIG. 26 shows the structure of the sample. The doping materials need to have a considerable different in atom's size compare to aluminum, such as Chromium or Chromium oxide; Magnesium or Magnesium oxide. The distinct size of two atoms form an interlocking mechanism in the film, as a result, surface hardness of film can be promoted. This interlocking mechanism is similar to chemical strengthen glass which is using Potassium to replace Sodium in glass. The transmittance and hardness of the samples can be manipulated by the thickness, doping ratio and doping materials of the strengthen layer.

The unique doping of the aluminum oxide (sapphire) thin film can also serve as a unique identifier of the specific aluminum oxide (sapphire) thin film coating applied on a given substrate. Thus, another embodiment of the present invention provides for a means for manufacturers to track their manufactured doped sapphire coating by identifying the ratio and type of dopant used in the deposited sapphire thin film coating.

Figure 27:
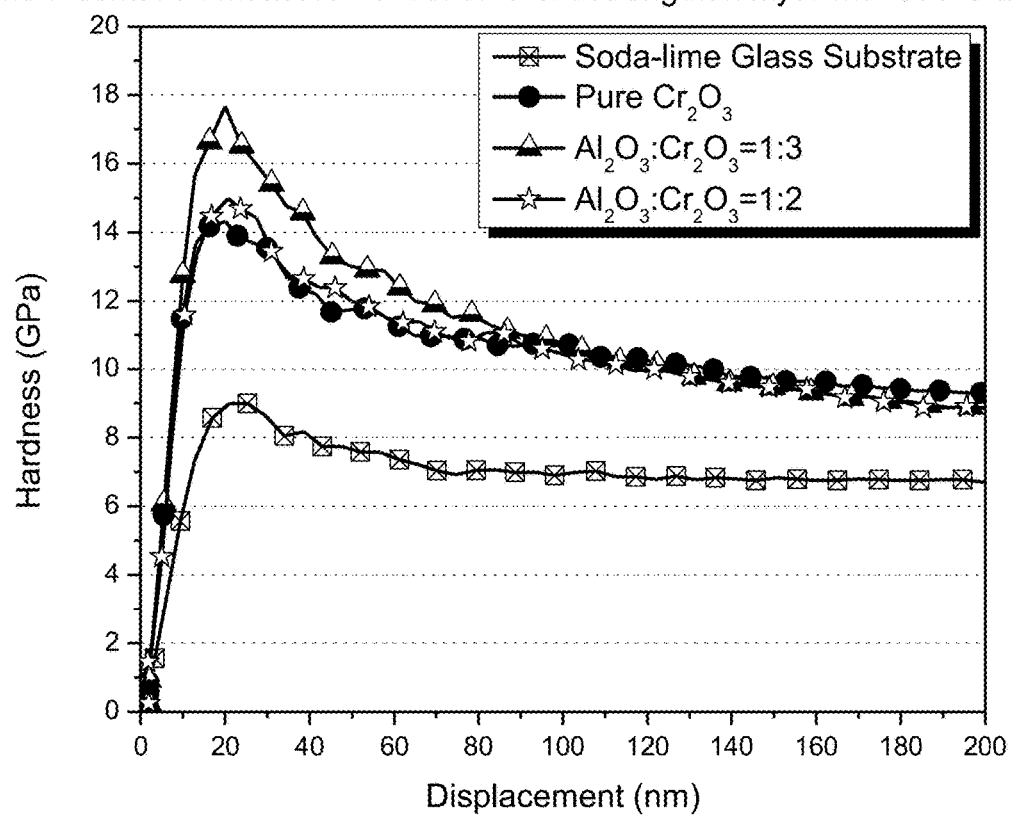
FIG. 27 shows the nano-indentation measurement of different strengthen layer with 300° C. annealing.

In one of the experiments described in the present invention, when the ratio of strengthen layer is 1:3 (aluminum oxide:chromium oxide) and thickness is around 30 nm on top of 200 nm sapphire thin film coated substrate with thermal annealing at 300° C., the present invention has achieved 17 GPa hardness in nano-indentation measurement (FIG. 27) which is equivalent to 7.2-7.5 Mohs scale.

Figure 28:
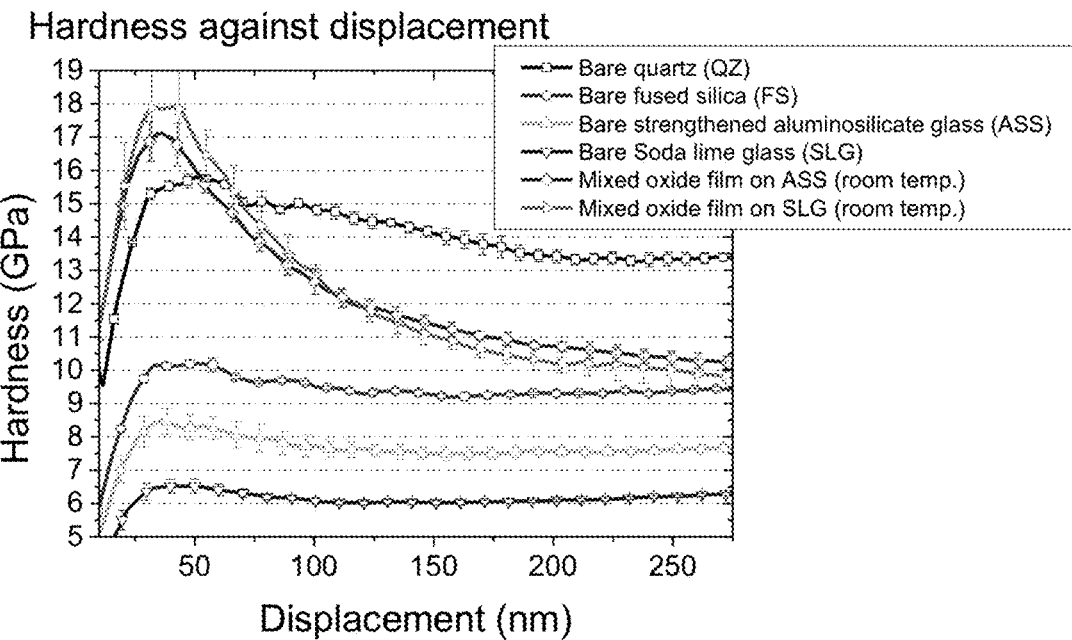
FIG. 28 shows the nano-indentation measurement of strengthen layer is 1:1 (aluminum oxide:magnesium oxide) on SLG and ASS in room temperature.

In another of the experiments described, when the ratio of strengthen layer is 1:1 (aluminum oxide:magnesium oxide) and thickness is around 30 nm on top of 200 nm sapphire thin film coated substrate no annealing at room temperature, the present invention has achieved greater than 17 GPa hardness in nano-indentation measurement (FIG. 28) which is equivalent to more than 7.2-7.5 Mohs scale. FIG. 28 presented data of strengthen layer at ratio of 1:1 (aluminum oxide:magnesium oxide) deposited in room temperature on different substrates, namely soda lime glass (SLG) and chemically strengthened aluminosilicate glass (ASS). These data are presented in Table 9.

TABLE 9

Nanoindentation measurement results for strengthen layer is 1:1 (aluminum oxide:magnesium oxide) on SLG and ASS.

| Sample | Peak hardness (GPa) | Calibrated peak hardness* (GPa) |
|---|---|---|
| Quartz (QZ) | 15.79 ± 0.24 | 14.0 |
| Fused silica (FS) | 10.21 ± 0.10 | 9.25 |
| Strengthened aluminosilicate glass (ASS) | 8.5 ± 0.44 | 7.79 |
| Soda lime glass (SLG) | 6.53 ± 0.20 | 6.12 |
| Mixed oxide on ASS (RT) | 17.13 ± 0.40 | 15.14 |
| Mixed oxide on SLG (RT) | 17.94 ± 1.20 | 15.83 |

(*The calibrated values were based on the hardness of fused silica (9.25 GPa) and quartz (14.0 GPa) respectively.)

Figure 29:
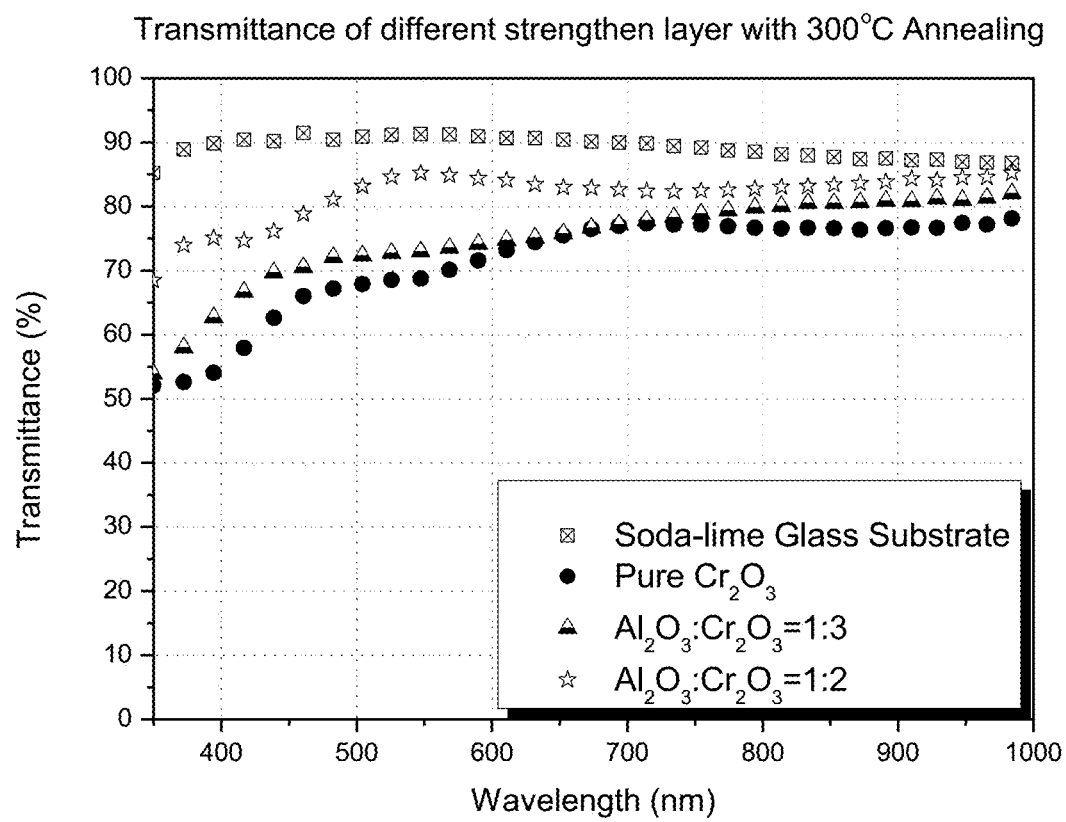
FIG. 29 shows the transmittance of different strengthen layer with 300° C. annealing.

In FIG. 29, transmission of samples with different ratio of strengthen layer has been shown. When strengthen layer's ratio is 1:2 (aluminum oxide:chromium oxide), the transmittance is around 80% in visible light range.

Figure 30:
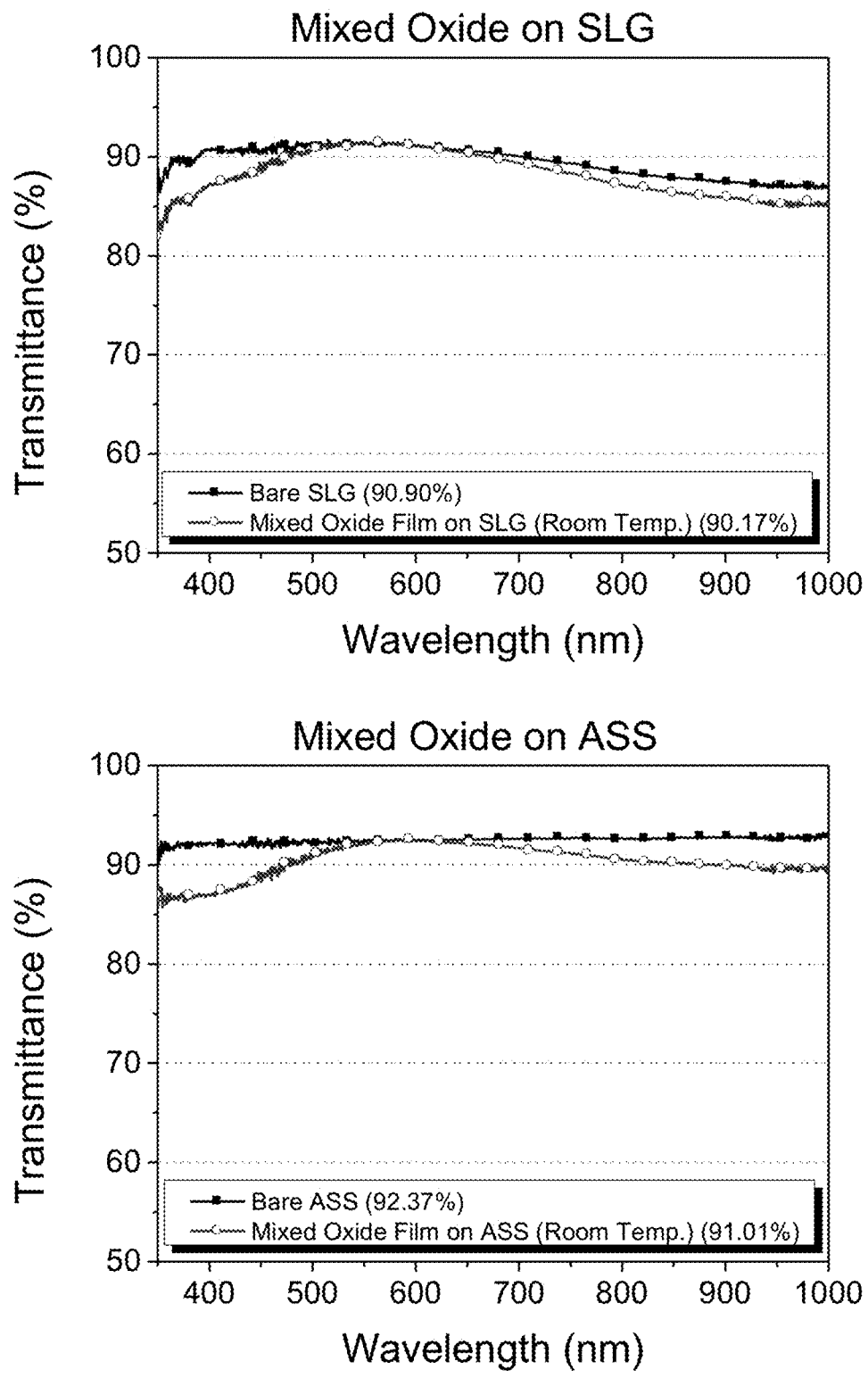
FIG. 30 shows the transmittance results of strengthen layer is 1:1 (aluminum oxide:magnesium oxide) on SLG and ASS in room temperature.

In FIG. 30, transmission of samples with 1:1 (aluminum oxide:magnesium oxide) ratio of strengthen layer deposited in room temperature over two different substrates, namely soda lime glass (SLG) and chemically strengthened aluminosilicate glass (ASS) have been shown. When strengthen layer's ratio is 1:1 (aluminum oxide:magnesium oxide), the transmittance is greater than 90% in visible light range (400 nm to 700 nm). These data are presented in Table 10.

TABLE 10

Transmission results for strengthen SLG and ASS.hen layer is 1:1 (aluminum oxide:magnesium oxide)

| Sample | Average transmittance, 400-700 nm (%) |
| --- | --- |
| Bare SLG | 90.90 |
| Bare ASS | 92.37 |
| Mixed oxide film on SLG | 90.17 |
| Mixed oxide film on ASS | 91.01 |

The hardness value of as-deposited sapphire thin film by e-beam or sputtering deposition is around 12-13 GPa which is about 5.5-6.5. After thermal annealing process, the film hardness is significantly improved. However, the softening point of glass is about 500° C. which mean that the annealing temperature cannot be high enough for sapphire to crystalline. On the other hand, strengthen glass such as Corning Gorilla glass has even lower annealing temperature to 400° C. due to the strengthen layer. After adding the doped aluminum strengthen layer, the film hardness has improved to 7.2-7.5 Mohs with 300° C. annealing temperature at specific doping ratio of strengthen layer. This method is great improvement of surface hardness and de-stress problem on strengthen glass substrate by lower the annealing temperature.

The procedure of depositing doped aluminum oxide strengthen layer on a sapphire thin film coated substrate by sputtering deposition are given as follows:

1. The deposition of Sapphire thin film follows the same procedure and experimental details of "Sapphire Thin Film Coated Substrate" of U.S. Non-Provisional patent Ser. No. 14/642,742 filed on Mar. 9, 2015, which claims priority from U.S. Provisional Patent Application No. 62/049,364 filed on Sep. 12, 2014.
2. The base vacuum of chamber is higher than $5\times10^{-6}$ mbar and the deposited vacuum keeps higher than $5\times10^{-3}$ mbar when the deposition takes place.
3. The substrates are attached onto the sample holder at a distance from the sputtering source, for example 150 mm. The sample holder is rotated at 10 RPM when the deposition takes place.
4. Co-sputtering technique is used to deposit a doped aluminum oxide layer on the sample. Two sputtering guns which are contain two different targets materials are operating simultaneously during coating. And the doping ratio is controlled by the sputtering power. E-beam deposition with similar arrangement is also possible.
5. The thickness of doped aluminum oxide layer is 10 nm to 100 nm. The deposition rate is about 1-20 nm/min which depend on the type of target used, such as oxide and metal targets. The substrate during deposition is at room temperature and active temperature is not essential. The film thicknesses can be measured by ellipsometry method or other appropriate methods with similar or better accuracy.
6. After deposited a doped aluminum oxide layer on sapphire thin film coated substrates, they are annealed in a furnace from 50° C. to 1300° C. The temperature raising gradient should be gradual for example 5° C./min and the decline gradient should also be gradual for example 1-5° C./min. The annealing time is ranged from 30 minutes to 10 hours within the specified thermal annealing temperature range. Multiple-steps annealing with different temperatures within the aforementioned range can also be used to enhance the hardness and also reduce the micro-crack of thin film.

Figure 31:
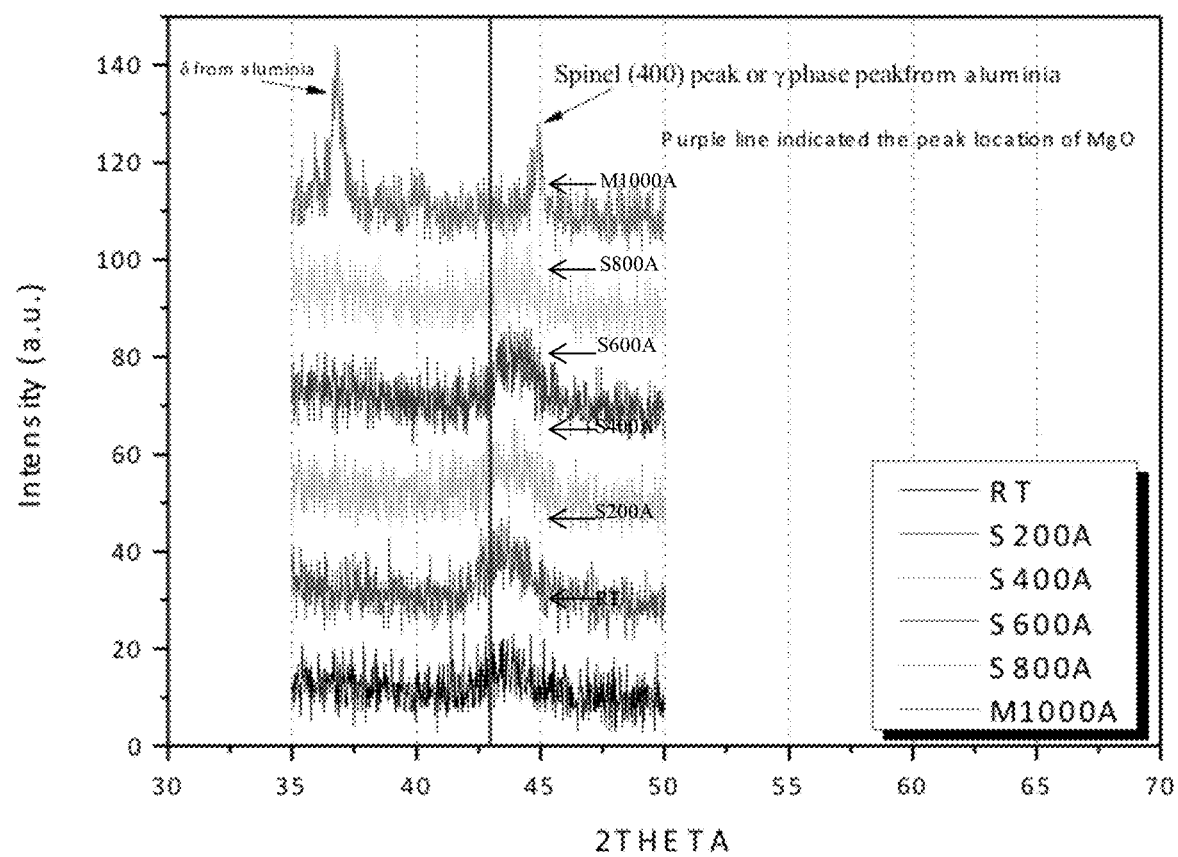
FIG. 31 shows the GID of $Al2O3$:MgO at 1:1 on field silica (FS) at different annealing temperatures.

Other possible dopants used are beryllium, beryllium oxide, lithium, lithium oxide, sodium, sodium oxide, potassium, potassium oxide, calcium, calcium oxide, molybdenum, molybdenum oxide, tungsten and tungsten oxide. In fact, an embodiment of the present invention has spinel ($MgAl_2O_4$) produced in the doped aluminum oxide (sapphire) thin film coating on a softer substrate at the ratio of aluminum oxide:magnesium oxide being 1:1. From data in FIG. 31, it is observed that when the doped aluminum oxide (sapphire) thin film with mixed oxide of MgO (at the ratio of aluminum oxide:magnesium oxide being 1:1) is deposited using a physical deposition process unto field silica (FS) substrate; and anneal at different temperatures, namely at room temperature (RT), at 200° C. (S 200A), at 400° C. (S 400A), at 600° C. (S 600A), at 800° C. (S 800A) and at 1000° C. (M 1000A), different level/concentrations of spinel is detected using XRD. Obviously, the most prominent peak of spinel is detected at 1000° C. (M 1000A). Nonetheless, even at room temperature (RT) XRD signals of spinel are detected and co-incidentally the doped sapphire thin film with MgO is at its hardest when there is no annealing, i.e. at room temperature (RT). Furthermore, at 1000° C. (M 1000A), XRD peak of alumina is also detected and under all tested annealing temperature conditions, other than 1000° C. (M 1000A), XRD peak indicating MgO is also detected. The physical deposition process used is either an e-beam deposition or sputtering, wherein the deposition is without external cooling or heating and the entire process is done at room temperature. Furthermore, from data presented in Table 11, it can be seen that the aluminum oxide (sapphire) thin film layer is acting as to provide adhesion for the MgO mixed oxide to bind to the substrate when deposited under room temperature.

TABLE 11

Thin film of aluminum oxide (sapphire):MgO (mixed oxide) at 1:1 on different substrates at different thickness.

| 1. Structure | 2. SLG | 3. ASS |
| --- | --- | --- |
| Substrate/Mixed Oxide MgO (200 nm) | Peel Off (Depend on location) | Peel Off |
| Substrate/$Al_2O_3$(340 nm)/Mixed Oxide MgO (20 nm) | OK | OK |
| Substrate/$Al_2O_3$(50 nm)/Mixed Oxide MgO (200 nm) | OK | OK |

A Further Embodiment of the Present Invention

Sapphire thin film has a high hardness mechanical property that means it is very rigid. So, when it is deposited on soft or flexible substrates, the difference in mechanical property between the sapphire and the substrates can cause the film to peel when the film is too thick or crack due to the stress between substrate and film. For example, sapphire film begins to peel off from PMMA or PET substrate when the film thickness exceeds 200 nm.

In addition, the refractive index difference of the two materials means that light transmission through the layer can get trapped between the two materials. Thus, in a further embodiment of the present invention there is presented a buffer layer to act as mechanical and optical intermediate layer. Mechanically the buffer layer would have hardness intermediate to those of the soft substrate and sapphire film such that it can relieve the high stress induced by the large hardness difference of the aforesaid two materials. With the optimum thickness range, thicker sapphire film can be grown. Thicker sapphire film is desirable because anti-scratching requires a critical thickness to prevent puncture or piercing of the film. Furthermore, the buffer layer can reduce the interfacial stress and therefore better adhesion of the thin film.

Further Invention

The embodiments of the present invention provide:
1. A buffer layer with thickness 10-100 nm is deposited on to a soft substrate such as PMMA and PET.
2. The deposition method can be thermal deposition, sputtering or e-beam and the substrate does not need to be heated, that is the deposition is without external cooling or heating.
3. The buffer layer material should have a mechanical hardness higher than the substrate and lower than that of a typical sapphire film, typical value range is 1-5.5 Mohs scale.
4. The refractive index of the buffer layer material should be higher than that of the substrate but lower than that of a typical sapphire film, typical value range is 1.45-1.65.
5. Such buffer layer can also improve the adhesion of the sapphire because it reduces the stress generated due to large difference in hardness.
6. An example of such material is silicon dioxide and $SiO_2$.

Using $SiO_2$ as buffer layer sapphire layer thickness can grow up to 300 nm on PMMA before film peeling is observed. For sapphire film without $SiO_2$, peeling is observed at thickness at 150 nm and above ('peel-off' thickness is termed as critical thickness). Therefore, the buffer layer has improved the mechanical stability of sapphire film such that the critical thickness is increased by 100% and more.

Figure 32:
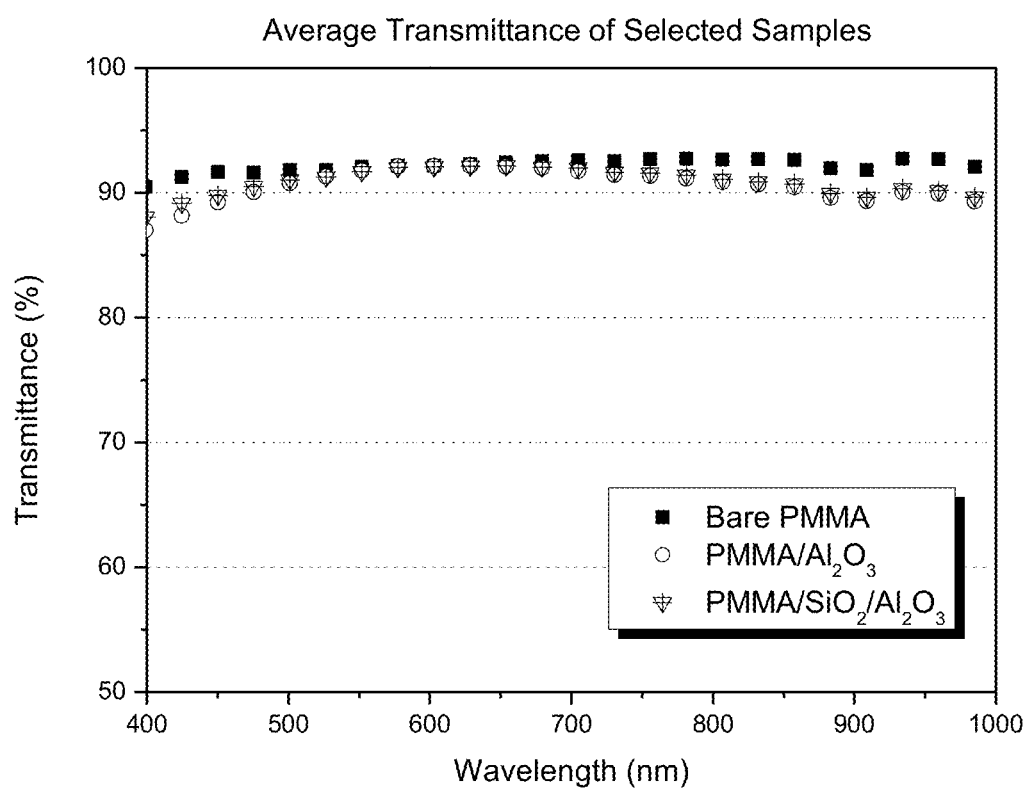
FIG. 32 shows the average transmittance of selected PMMA samples without sapphire film, with sapphire film and with sapphire film in $SiO_2$.

The introduction of $SiO_2$ as buffer layer has improved the overall optical transmission of the coated substrate by not less than 2% across the optical range. The transmission enhancement is brought about by the matching of refractive index of the buffer layer such that light can pass through from the substrate to the sapphire film with less loss. The enhancement is due to reduction of differences in refractive index value between the two material layers e.g. substrate and buffer layer, and buffer layer and sapphire film. The reduction in refractive index increases the Brewster angle which defines the amount of light can pass through from one medium to another across the interface. The bigger the Brewster angle the more light can pass through the interface. Thus, introduction of buffer layer between the substrate and sapphire film increases the amount of light transmitting through. This is shown in FIG. 32.

Figure 33:
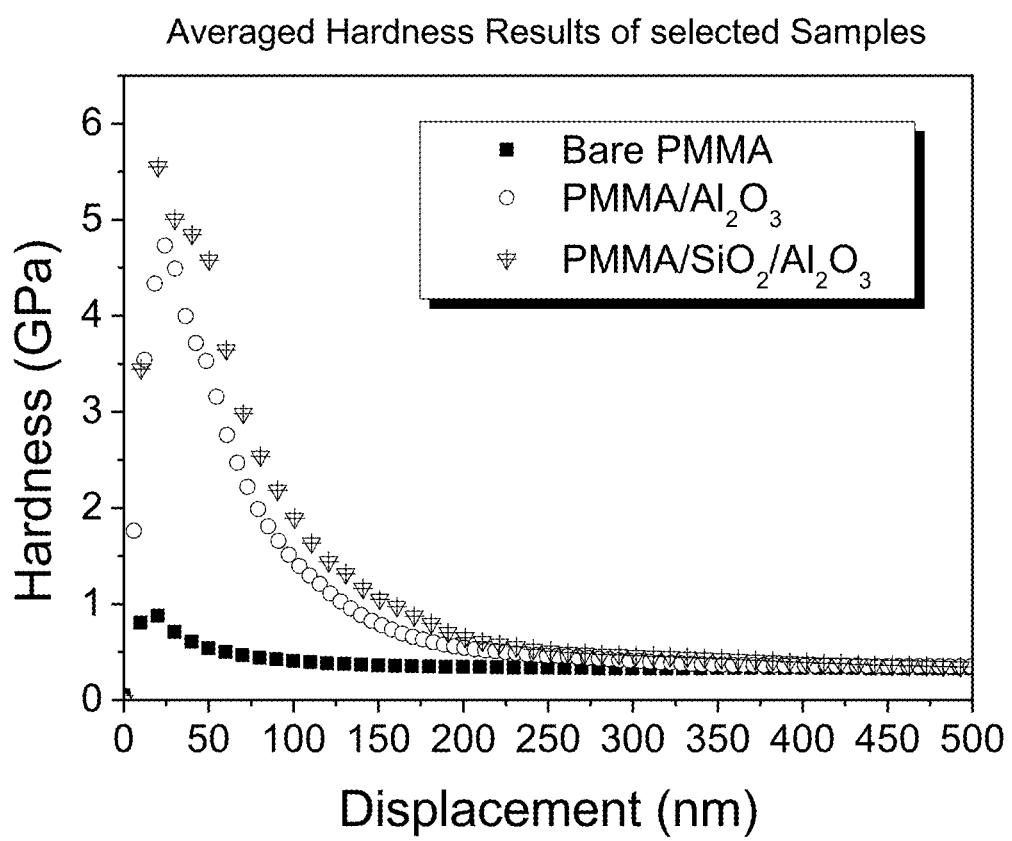
FIG. 33 shows the average hardness of selected PMMA samples without sapphire film, with sapphire film and with sapphire film in $SiO_2$.

Hardness of at least 5 GPa or higher is achieved with total thickness of 200 nm and above (buffer layer and sapphire film) when measured using a nano-indenter as shown in FIG. 33. There is considerable improvement in hardness over uncoated substrate. For example, PMMA hardness is 0.3 Gpa and the hardness achieved is at 5.5 Gpa; that means it is more than 10 times increase in hardness. This confirms that hardness and optical transmission enhancement can be achieved through introduction of buffer layer between the soft substrate and the sapphire film.

Further Embodiments of the Present Invention

The further embodiments of the present invention described herein are not to be limited in scope by any of the specific embodiments and are presented for exemplification only.

Without wishing to be bound by theory, the inventors have discovered through their trials, experimentations, and research the design of a composition of AR layer that is aimed to match the refractive index of an underlying substrate e.g. glass, chemically strengthened glass, plastics etc., so as to maximize light transmission through it. For a device with a sapphire film for anti-scratch protection, because sapphire has a different refractive index to that of the underlying substrate, existing AR layer will not function as well as it should. Not only the transmitted light is reduced in quantity, its transmitted range will be changed such that imaging or display color is compromised. Therefore, an integrated AR with sapphire film having the top most AR layer being $Al_2O_3$, which also acts as anti-scratching layer, eliminates this problem. This involves replacing one of the materials of the AR layer with $Al_2O_3$ such that the top most AR layer is $Al_2O_3$, which also acts as anti-scratching layer.

The further embodiments of the present invention provide the following characteristics:
1. Using $Al_2O_3$ to replace one of the AR film layer to achieve anti-reflecting function.
2. The at least two AR materials typically are $Al_2O_3$ and $TiO_2$ in which the difference of their refractive index should be as large as possible.
3. The top most AR layer should be $Al_2O_3$ which also acts as anti-scratching layer.
4. The number of layer range from 4-20 layers.
5. Deposition process can be RF, DC sputtering, a combination thereof, and/or e-beam deposition.
6. Annealing temperature range is 50-800° C.; and annealing serves only to further enhance the anti-scratch hardness.
7. Annealing time is from 0.5 to 2 hours.
8. The AR or anti-scratch function is not diminished in cases where annealing is absent.
9. Doped sapphire can be an added layer onto the top most sapphire layer to further enhance the hardness.
10. A buffer layer can be added to a flexible/soft substrate before the integrated AR with anti-scratch layer is deposited to improve adhesion.
11. Applicable to mobile phone, watches, lenses for cameras, binoculars, spectacles, tablets and optical sensors.

Figure 34:
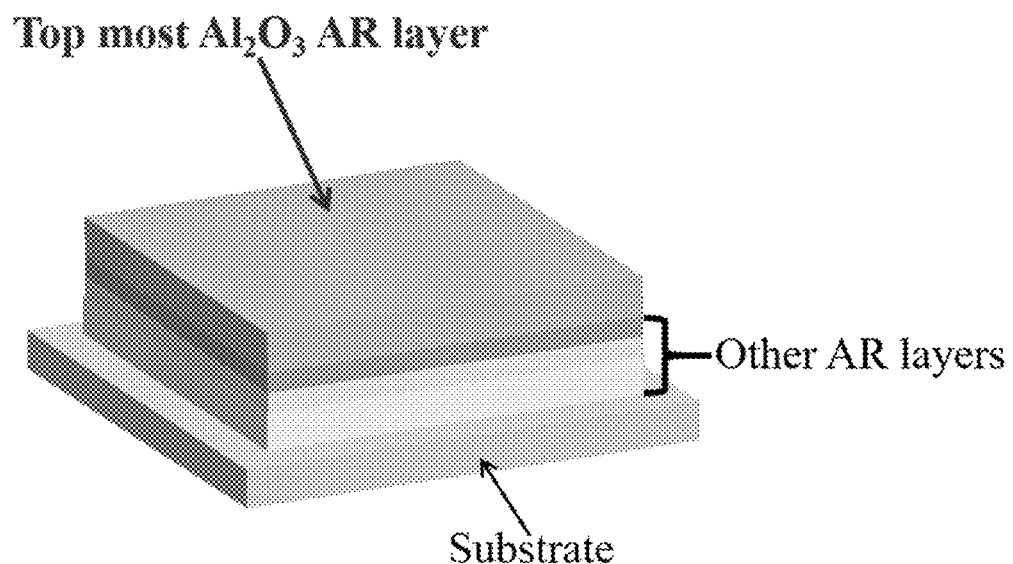
FIG. 34 shows an AR structure with top most $Al_2O_3$ AR as well as anti-scratch layer.

Using $Al_2O_3$ to Replace One of the AR Film Layer to Achieve Anti-Reflection Function FIG. 34 shows one embodiment of an AR structure using $Al_2O_3$ to replace the top most AR film layer to achieve not only anti-reflecting but also anti-scratch function. This structure can apply to all transparent substrates by matching the refractive indices of other deposited AR layers with the substrates and the top $Al_2O_3$ layer in alternatively high and low in general.

Designs of the AR Structure $2^{nd}$ Outermost Layer with n>1.75

Figure 35:
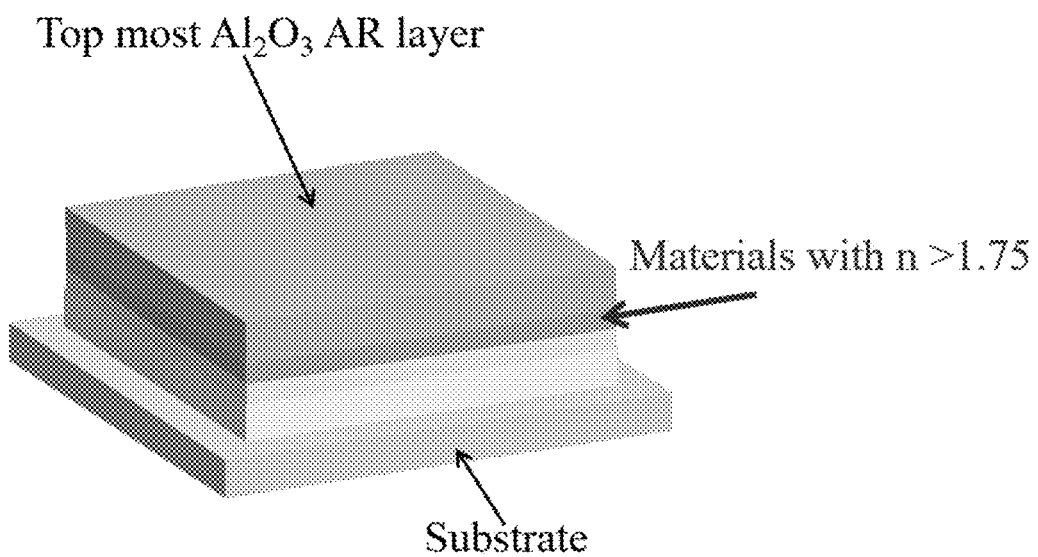
FIG. 35 shows an AR structure with $2^{nd}$ outermost materials which refractive index is higher than 1.75.
Figure 36:
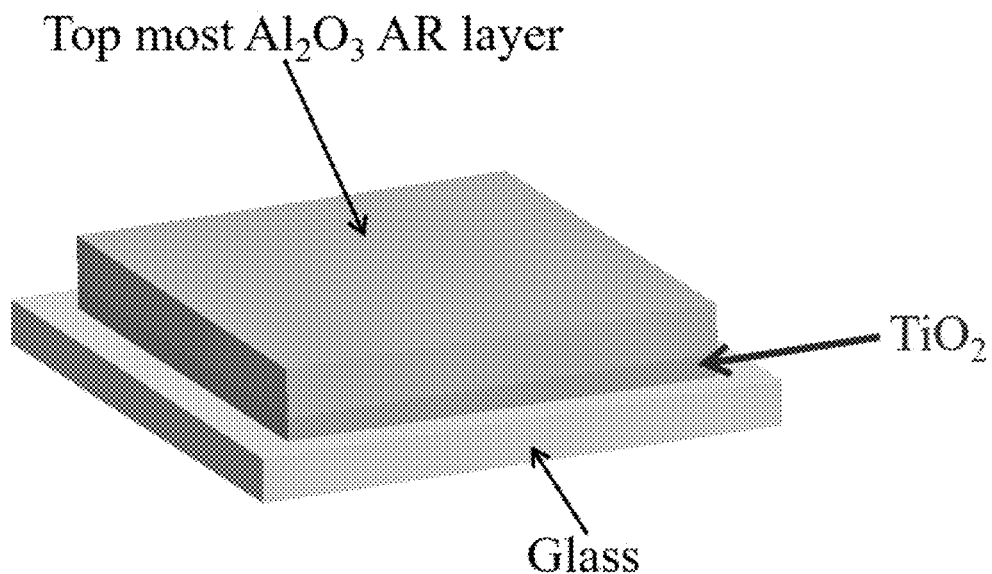
FIG. 36 shows an AR structure with $TiO_2$ on glass substrate.
Figure 37:
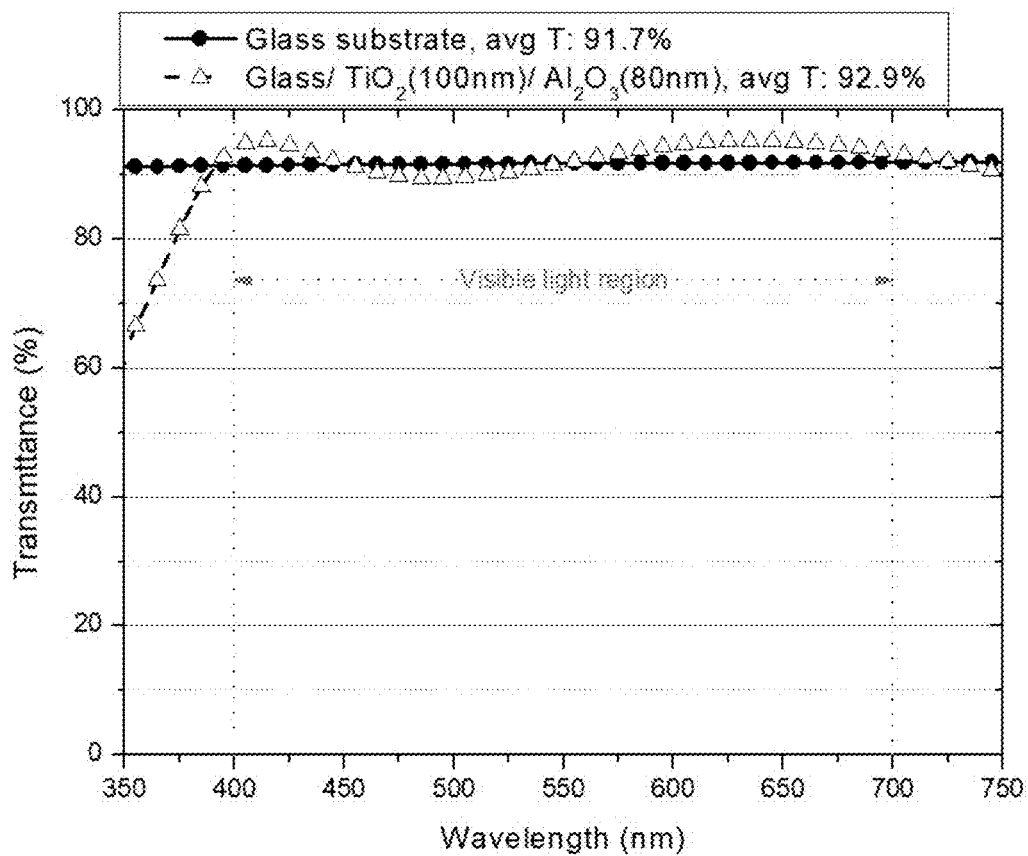
FIG. 37 shows the transmission simulation of the AR structure with $TiO_2$ on glass substrate.

The composition of an AR layer is to match the refractive indices of the top most sapphire layer and the underlying substrates. In one embodiment, the refractive index of the particular AR layer underneath the outermost sapphire layer has to be higher than that of $Al_2O_3$, which is of the range of 1.75-1.78, in visible light region as shown in FIG. 35. $TiO_2$ is a typical AR material having a refractive index higher than $Al_2O_3$. FIG. 36 and FIG. 37 show the other embodiments wherein the AR structure with $TiO_2$ on glass substrate and its transmission simulation respectively.

Figure 38:
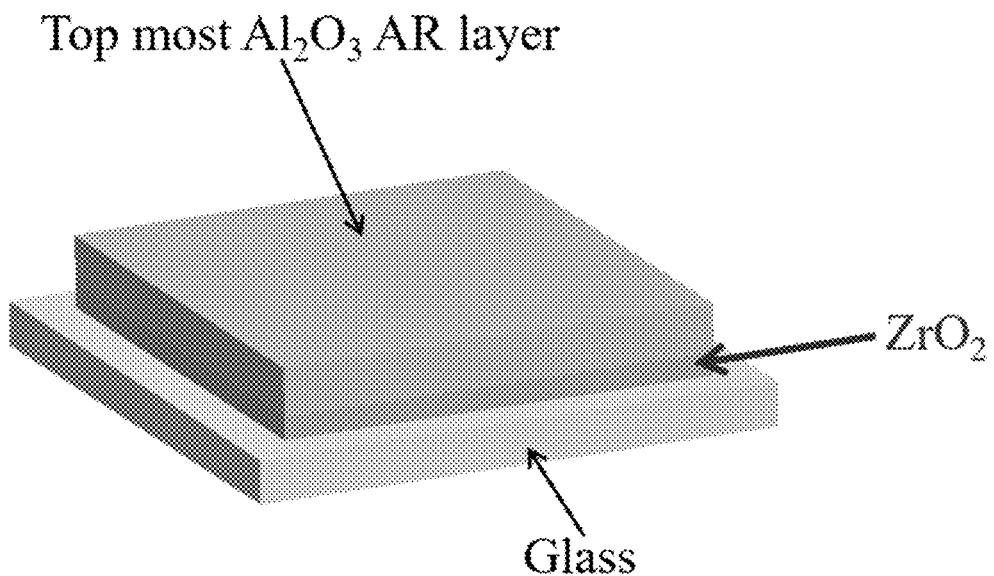
FIG. 38 shows an AR structure with $ZrO_2$ on glass substrate.
Figure 39:
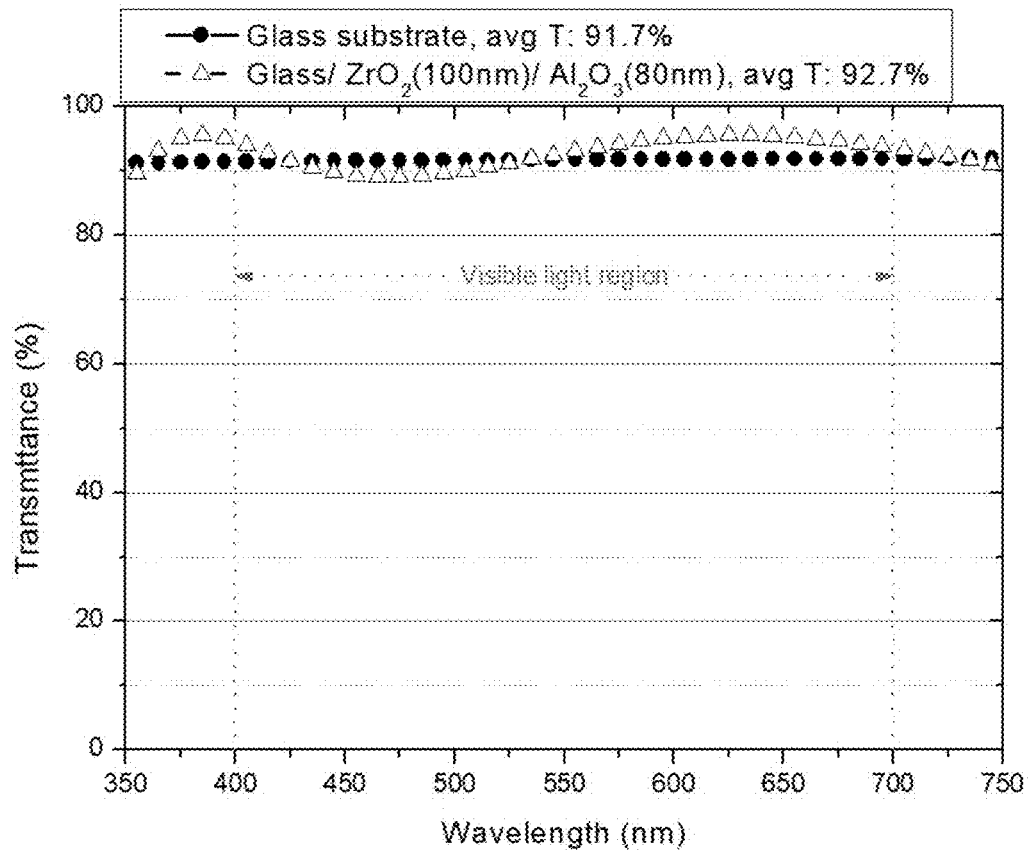
FIG. 39 shows the transmission simulation of the AR structure with $ZrO_2$ on glass substrate.
Figure 40:
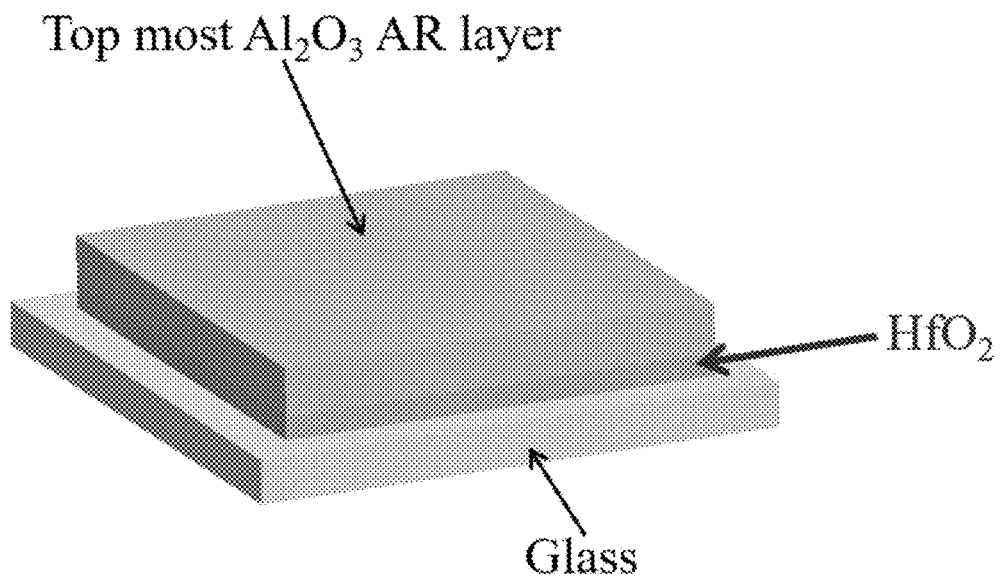
FIG. 40 shows an AR structure with $HfO_2$ on glass substrate.
Figure 41:
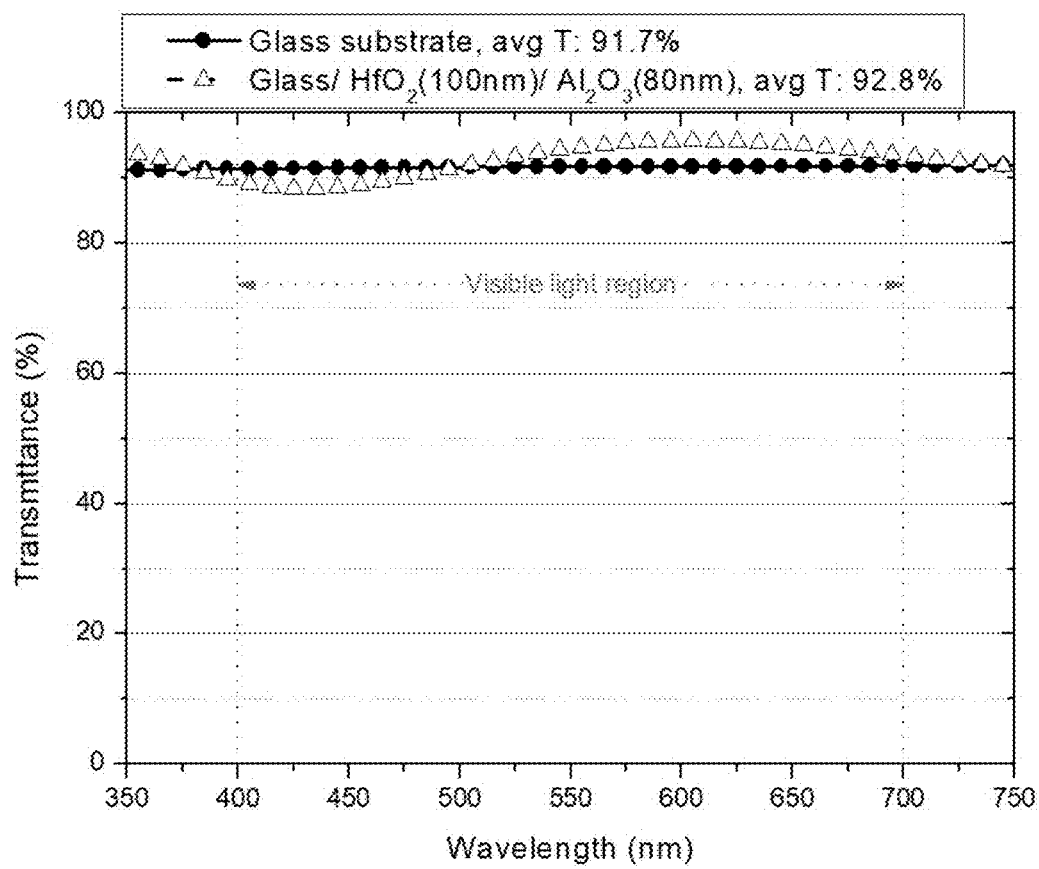
FIG. 41 shows the transmission simulation of the AR structure with HfO$_2$ on glass substrate.
Figure 42:
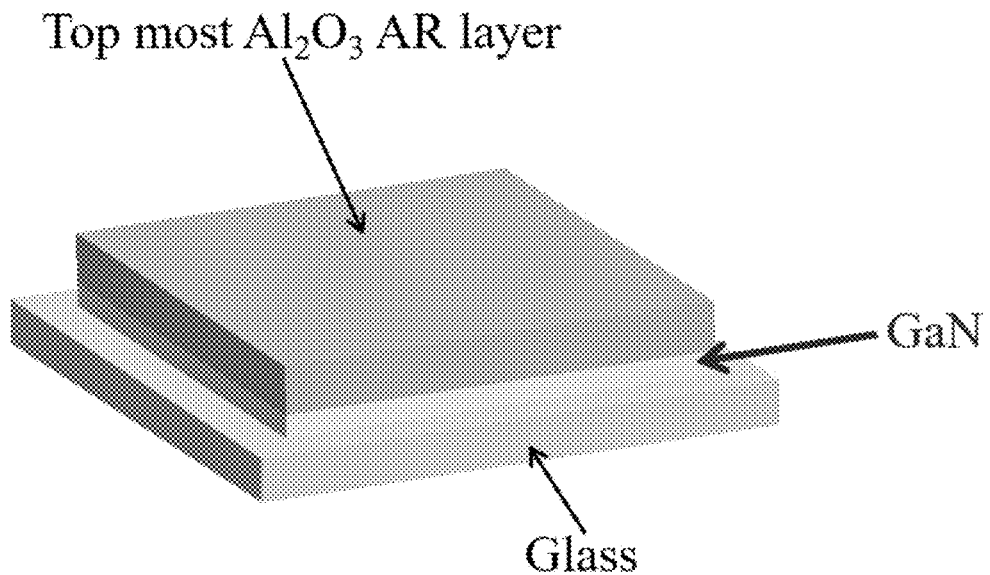
FIG. 42 shows an AR structure with GaN on glass substrate.
Figure 43:
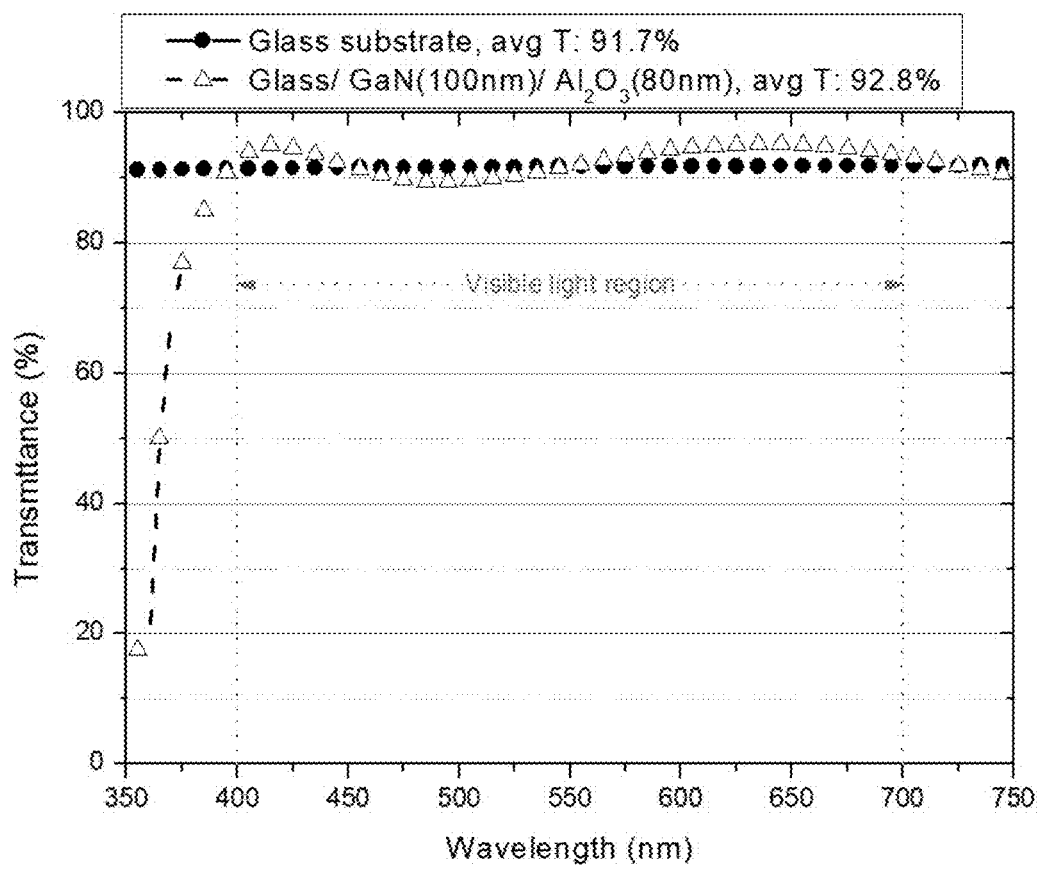
FIG. 43 shows the transmission simulation of the AR structure with GaN on glass substrate.
Figure 44:
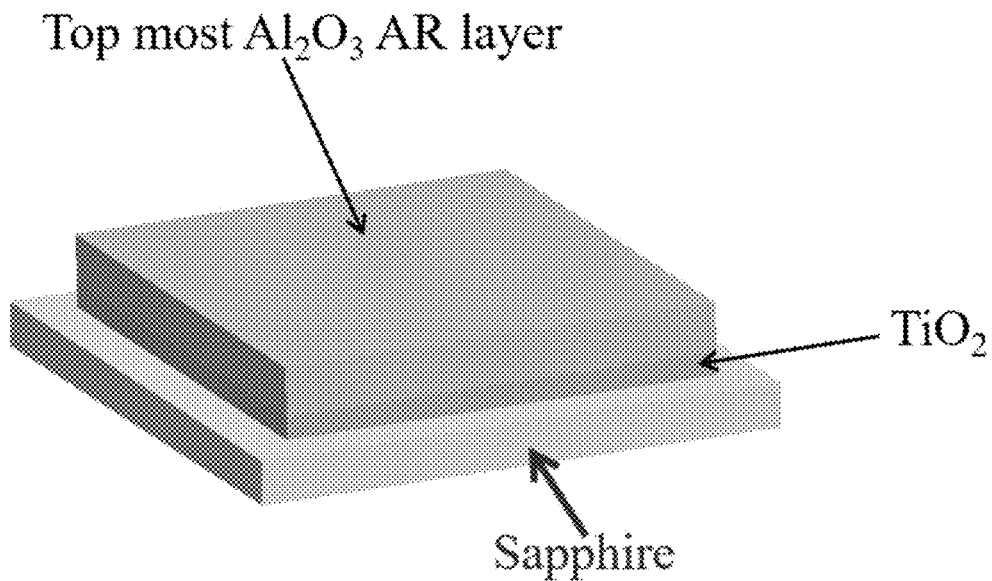
FIG. 44 shows an AR structure on sapphire substrate.
Figure 45:
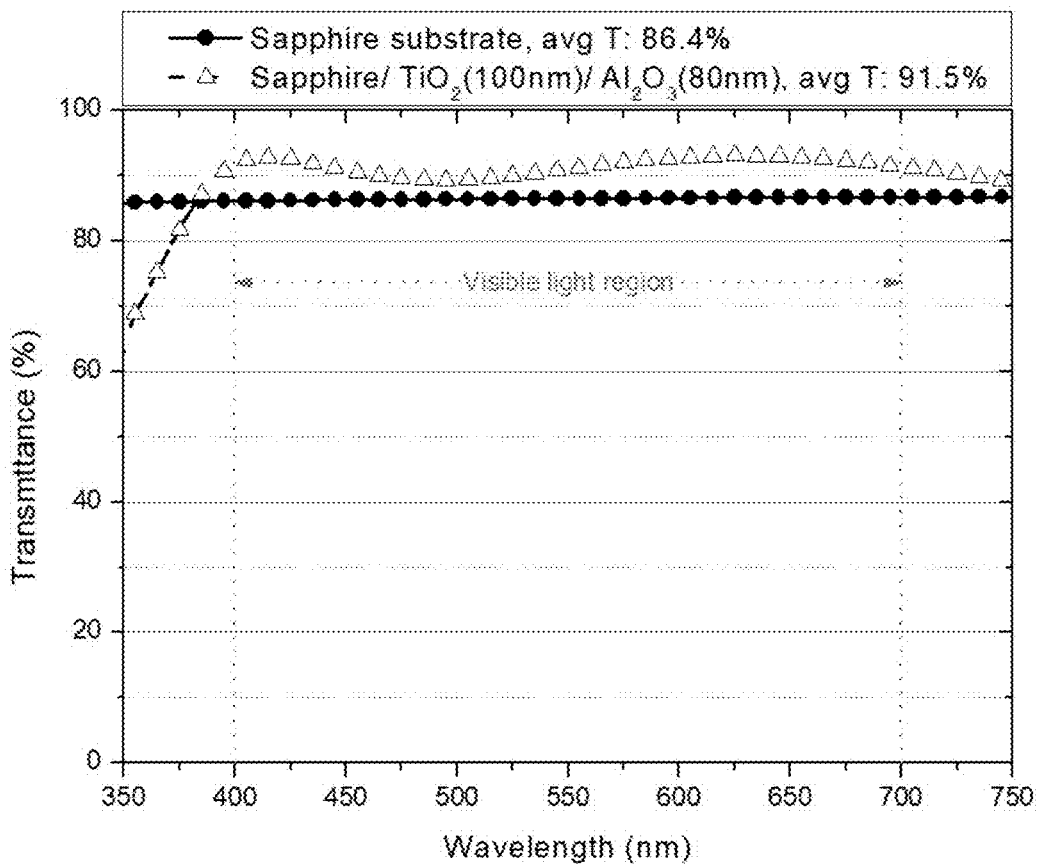
FIG. 45 shows the transmission simulation of the AR structure on sapphire substrate.
Figure 46:
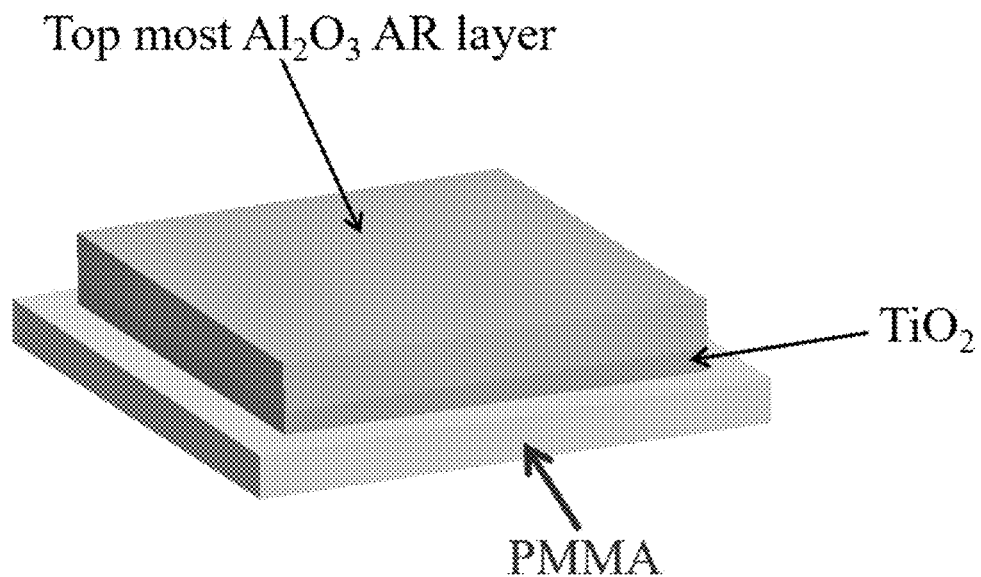
FIG. 46 shows an AR structure on PMMA substrate.
Figure 47:
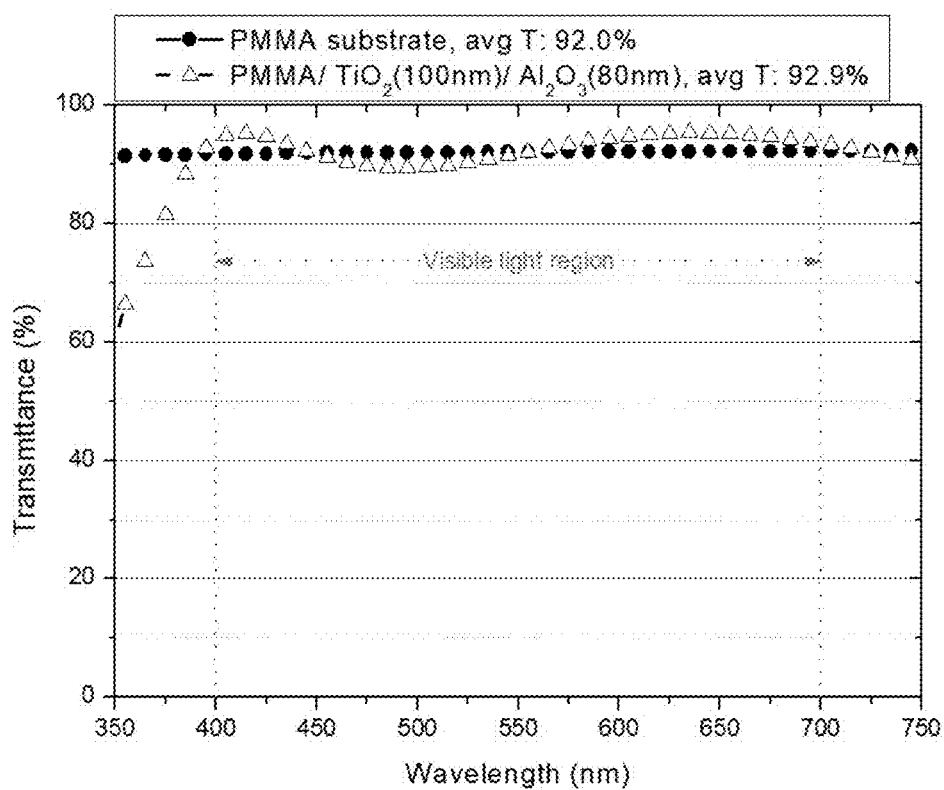
FIG. 47 shows the transmission simulation of the AR structure on PMMA substrate.

Potential Materials with n>1.75 Adopted as $2^{nd}$ Outermost Layer in AR Structure All materials with refractive index higher than 1.75 in the visible light range are considered as potential candidates for the $2^{nd}$ outermost layer in an AR structure. These materials include YAG, AlAs, $ZnSiAs_2$, AgBr, TlBr, C, $B_4C$, SiC, AgCl, TlCl, BGO, PGO, CsI, KI, LiI, NaI, RbI, $CaMoO_4$, $PbMoO_4$, $SrMoO_4$, AlN, GaN, $Si_3N_4$, $LiNbO_3$, $HfO_2$, $Nb_2O_5$, $Sc_2O_3$, $Y_2O_3$, ZnO, $ZrO_2$, GaP, $KTaO_3$ and $BaTiO_3$. FIG. 38 and FIG. 39 show yet other embodiments wherein the AR structure with $ZrO_2$ on glass substrate and its transmission simulation respectively. FIG. 40 and FIG. 41 show embodiments wherein the AR structure with $HfO_2$ on glass substrate and its transmission simulation respectively. FIG. 42 and FIG. 43 show yet other embodiments wherein the AR structure with GaN on glass substrate and its transmission simulation respectively.

AR Structure on Different Substrates

Besides depositing on glass and chemically strengthened glass substrates, AR structure can be applied to substrates of other materials such as sapphire, quartz, fused silica, plastics, etc. FIG. 44, FIG. 45, FIG. 46, and FIG. 47 show embodiments wherein the AR structure on sapphire substrate, a particular AR transmission simulation on sapphire, AR structure on PMMA substrate and a particular AR transmission simulation on PMMA respectively.

$1^{st}$ AR Layer for 3-Layer AR Structure

Figure 48:
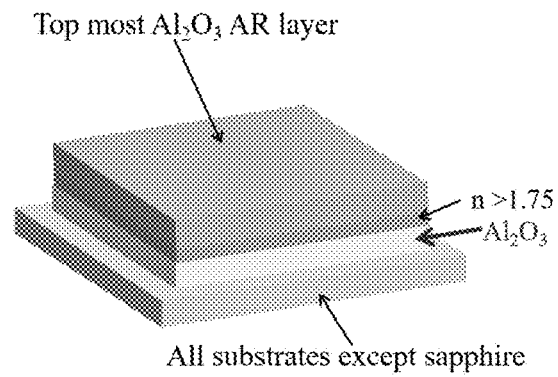
FIG. 48 shows a 3-layer AR structure on a substrate of materials other than sapphire.
Figure 49:
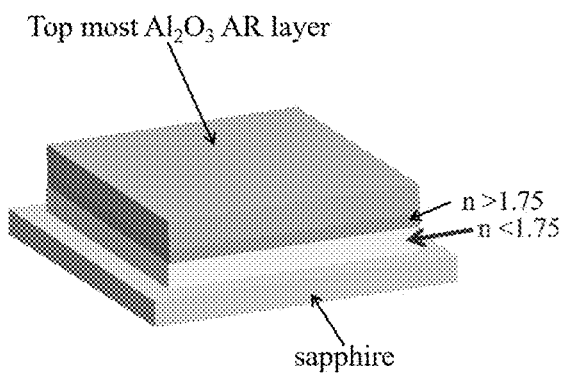
FIG. 49 shows a 3-layer AR structure on sapphire substrate.
Figure 50:
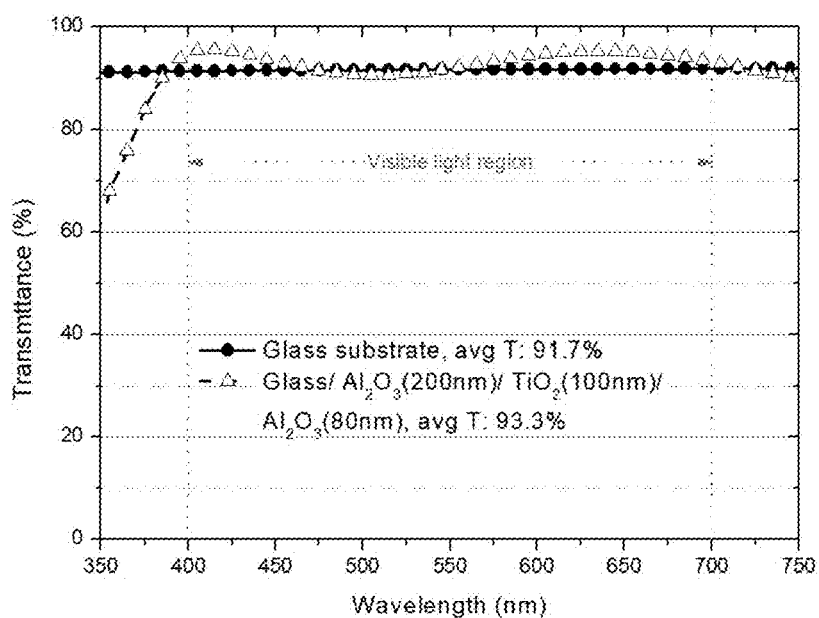
FIG. 50 shows the transmission simulation of a 3-layer AR structure on glass substrate.
Figure 51:
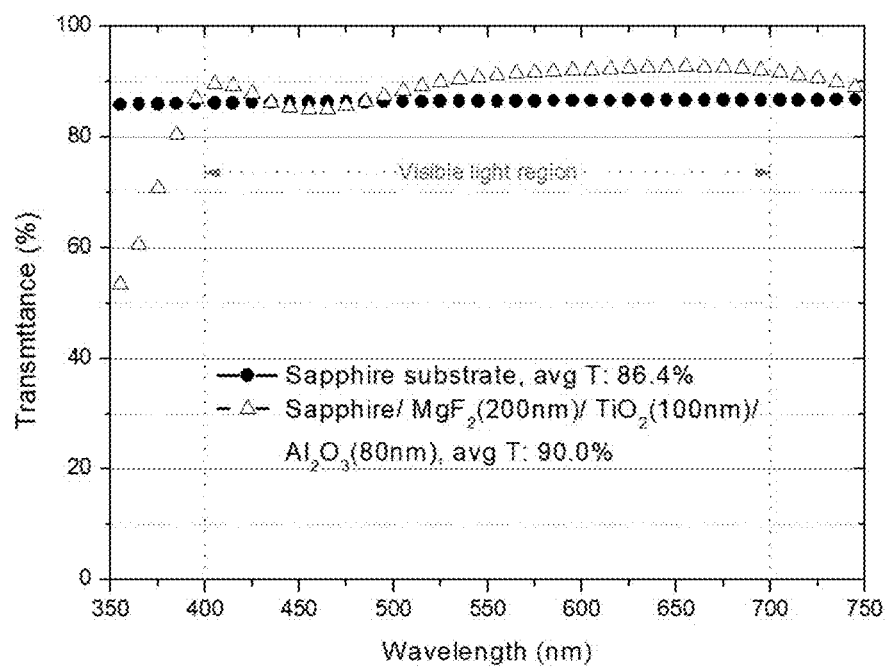
FIG. 51 shows the transmission simulation of the 3-layer AR structure on sapphire substrate.

The first AR layer being deposited is $Al_2O_3$ on substrate of materials other than sapphire, for AR structure having a total of 3 layers. For sapphire substrate, the first AR layer is of materials with refractive index lower than that of $Al_2O_3$, i.e. 1.75. A typical material with low refractive index is $MgF_2$. FIG. 48 and FIG. 49 show embodiments wherein the 3-layer AR structure on substrate of materials other than sapphire, and sapphire substrate respectively. FIG. 50 and FIG. 51 show the transmission simulation of 3-layer AR with $TiO_2$ as $2^{nd}$ outermost AR layer on glass substrate and that with $TiO_2$ as $2^{nd}$ outermost AR layer and $MgF_2$ as first AR layer on sapphire substrate respectively.

Minimum Thicknesses for AR Layers

Figure 52:
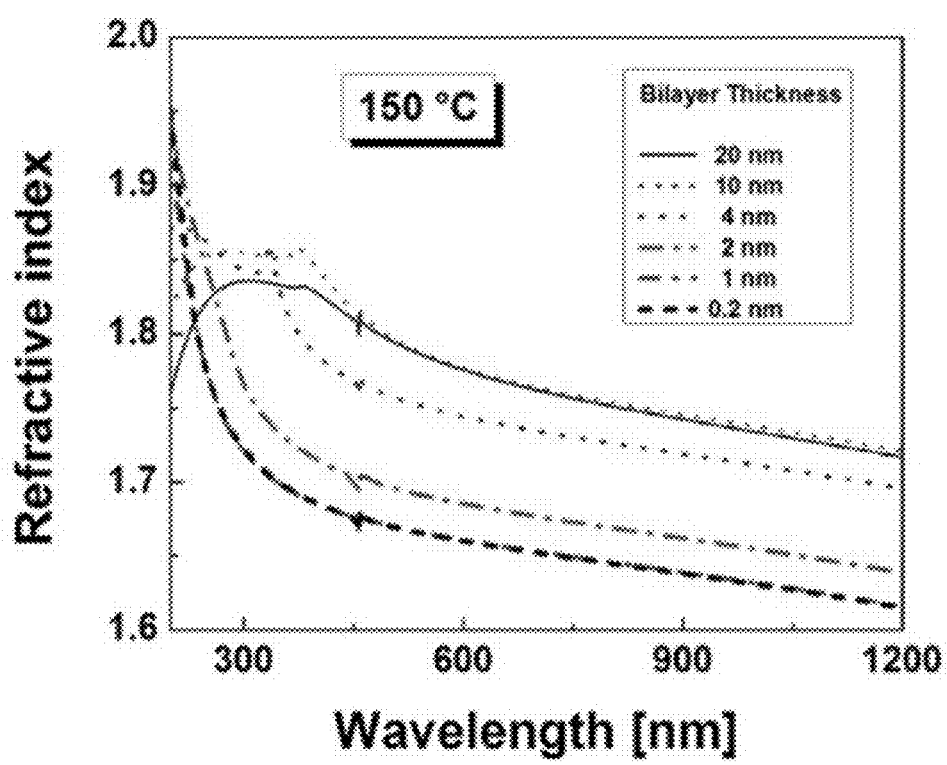
FIG. 52 shows the refractive index from J. Lopez et al. prepared at substrate temperature 150° C.

The thicknesses for each AR layers should be at least 10 nm. Film below 10 nm may not physically be a complete film. The matching of refractive index among AR layers and the substrates are affected due to the changing refractive indices in those layers. In addition, refractive index of a layer cannot be measured accurately for film thickness under 10 nm. Refractive index of ultra-thin film has a large difference to that of bulk material. This difference is narrowed when the film is equal to or more than 10 nm. FIG. 52 shows the refractive indices of bilayer structure of different film thicknesses formed alternatively by $Al_2O_3$ and ZnO. It was found that the refractive index varied less where the bilayer thickness was above 10 nm.

Maximum Thicknesses of AR Layers

Figure 53:
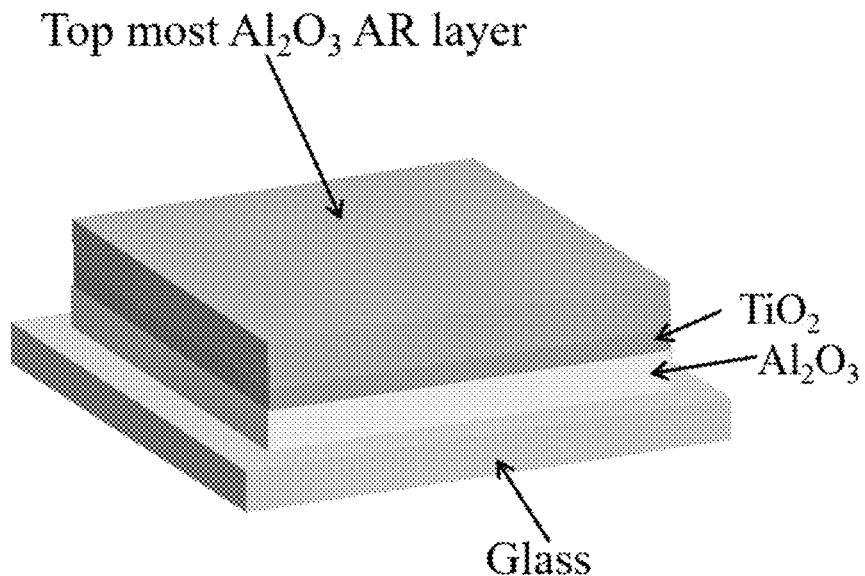
FIG. 53 shows a 3-layer AR structure with TiO$_2$ $2^{nd}$ outermost materials on glass substrate.
Figure 54:
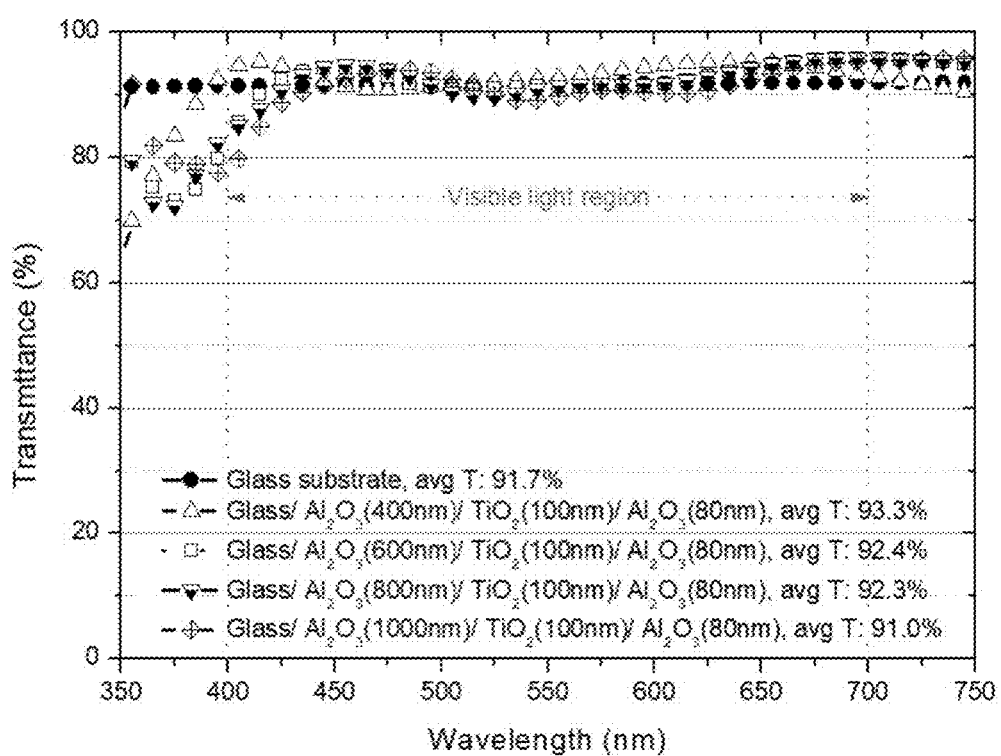
FIG. 54 shows the transmission simulation of a 3-layer AR with increasing inner Al$_2$O$_3$ thickness.

FIG. 54 depicts the transmission simulation of the structures of another embodiment, which is the 3-layer AR with $TiO_2$ as $2^{nd}$ outermost layer on glass substrate as shown in FIG. 53, with different thicknesses—thickness of $1^{st}$ AR layer of $Al_2O_3$ increased from 400 to 1000 nm. By comparing the average transmittance in visible light range of glass substrate to the AR structure with 1000 nm $1^{st}$ $Al_2O_3$ AR layer, it was found that with AR one had lower transmission eliminating the AR effect. Maximum thickness of AR layers cannot exceed 800 nm.

Figure 55:
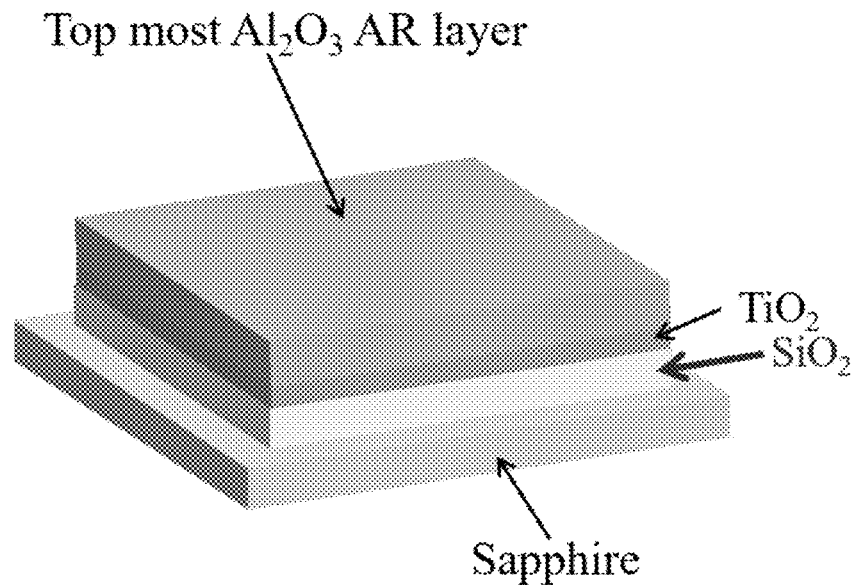
FIG. 55 shows a 3-layer AR structure with SiO$_2$ on sapphire substrate.
Figure 56:
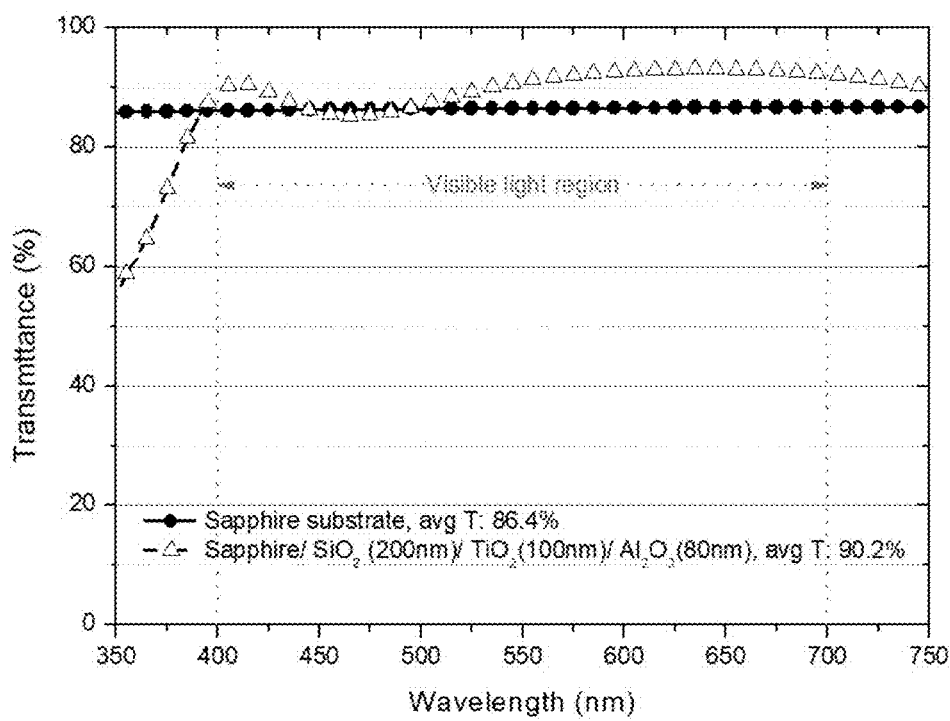
FIG. 56 shows the transmission simulation of the 3-layer AR structure with SiO$_2$ on sapphire substrate.
Figure 57:
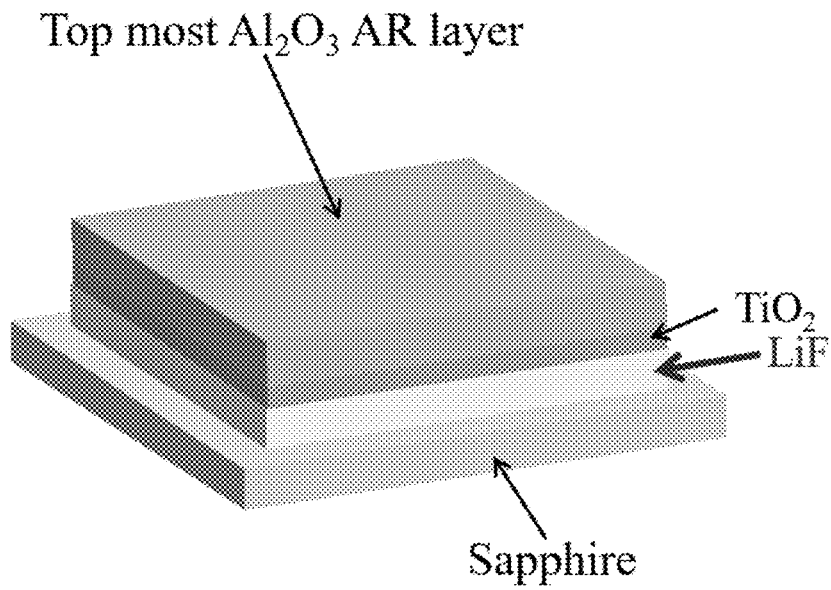
FIG. 57 shows a 3-layer AR structure with LiF on sapphire substrate.
Figure 58:
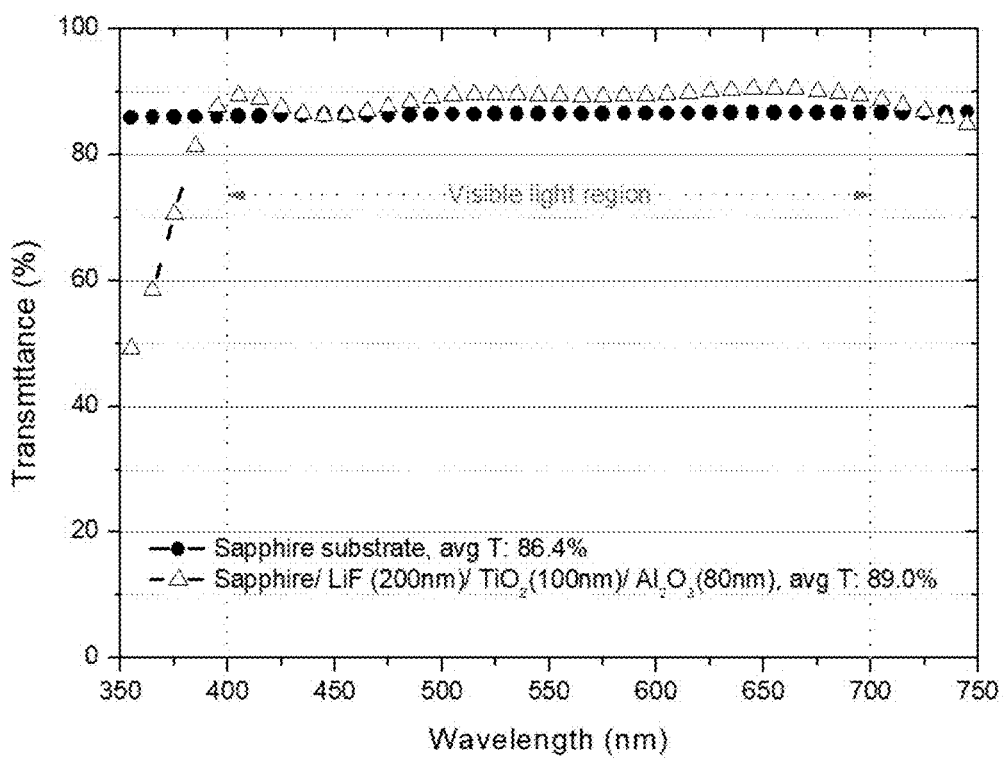
FIG. 58 shows the transmission simulation of the 3-layer AR structure with LiF on sapphire substrate.
Figure 59:
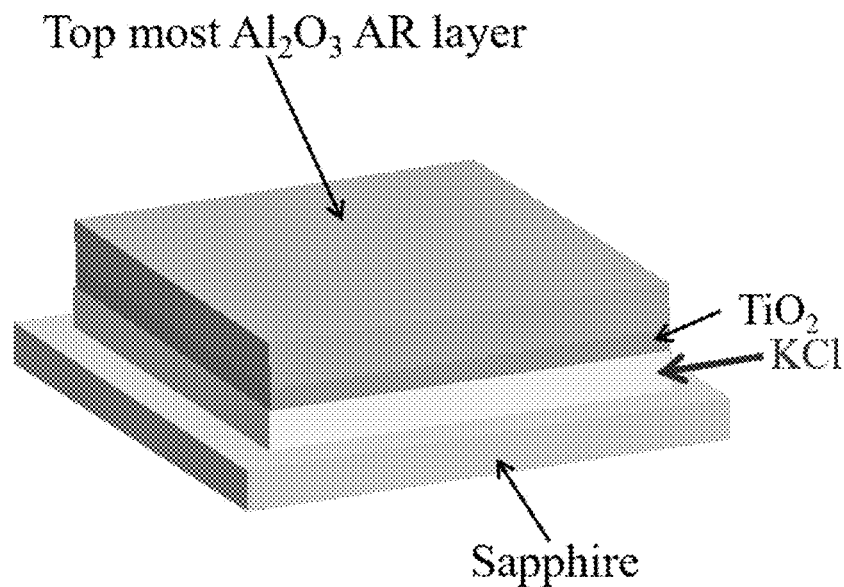
FIG. 59 shows a 3-layer AR structure with KCl on sapphire substrate.
Figure 60:
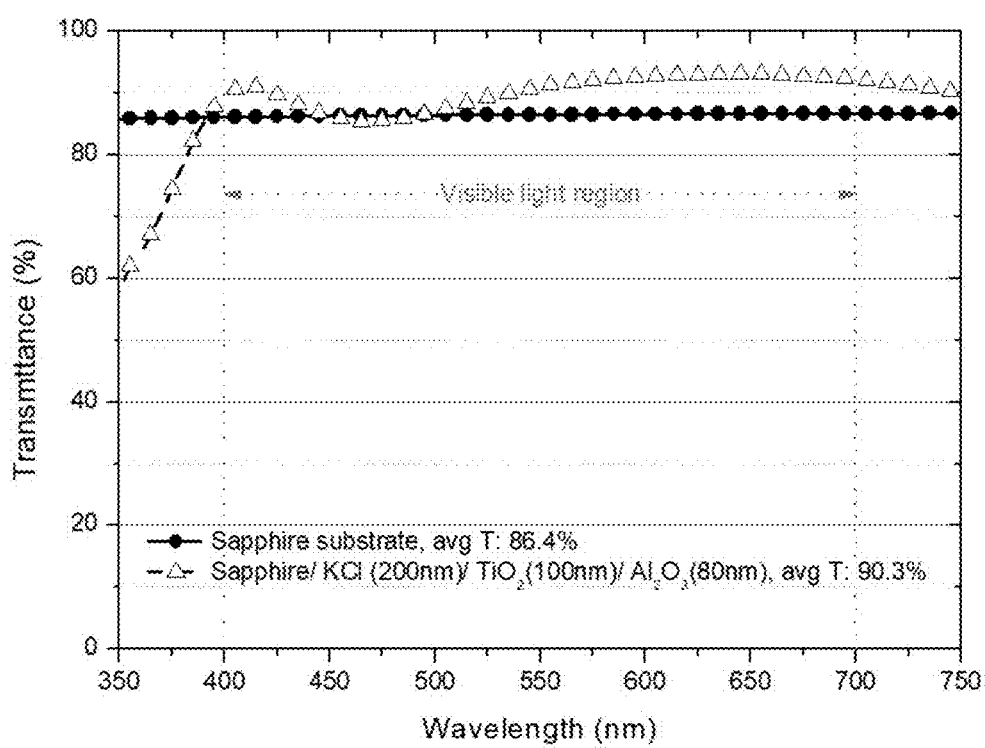
FIG. 60 shows the transmission simulation of the 3-layer AR structure with KCl on sapphire substrate.

Potential Materials with n<1.75 Adopted as Low Refractive Index Layers in AR Composition Besides $MgF_2$, all materials with refractive index lower than 1.75 in visible light range are considered as a potential candidate for the low refractive index layer in an AR structure. These materials include KCl, NaCl, RbCl, $CaF_2$, KF, $LaF_3$, LiF, $LiCaAlF_6$, NaF, RbF, $SrF_2$, $ThF_4$, $YLiF_4$, $GeO_2$, $SiO_2$, $KH_2PO_4$ and $CS_2$. FIG. 55 and FIG. 56 show the 3-layer AR structure with $SiO_2$ as $1^{st}$ AR layer on sapphire substrate and its transmission simulation respectively. FIG. 57 and FIG. 58 show further embodiments wherein the 3-layer AR structure is having LiF as the $1^{st}$ AR layer on sapphire substrate and its transmission simulation respectively. FIG. 59 and FIG. 60 show embodiments wherein the 3-layer AR structure is having KCl as the $1^{st}$ AR layer on sapphire substrate and its transmission simulation respectively.

Embodiments with AR Composition for More than 3 Total Number of AR Layers

Figure 61:
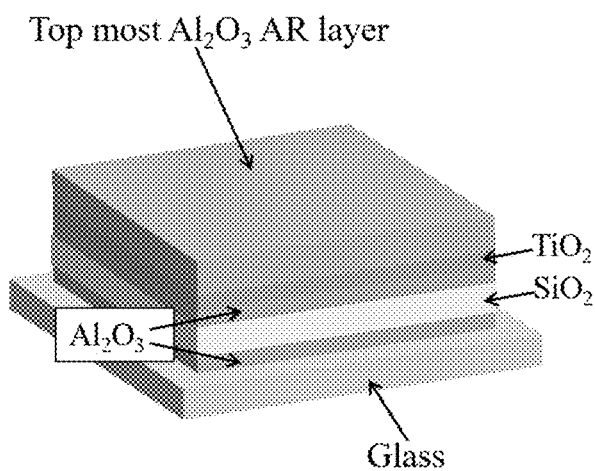
FIG. 61 shows a 5-layer AR structure on glass substrate.
Figure 62:
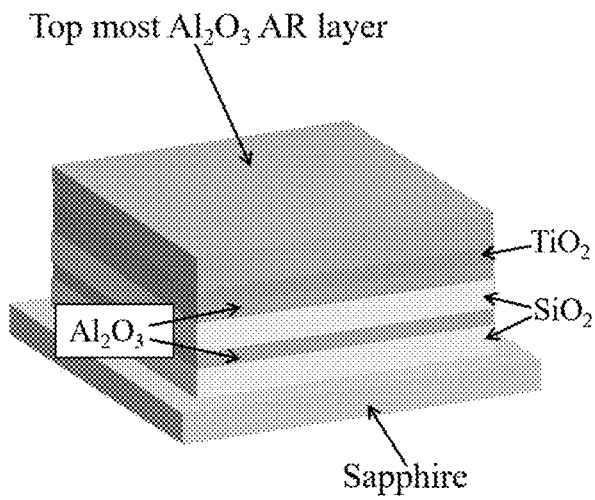
FIG. 62 shows a 6-layer AR structure on sapphire substrate.
Figure 63:
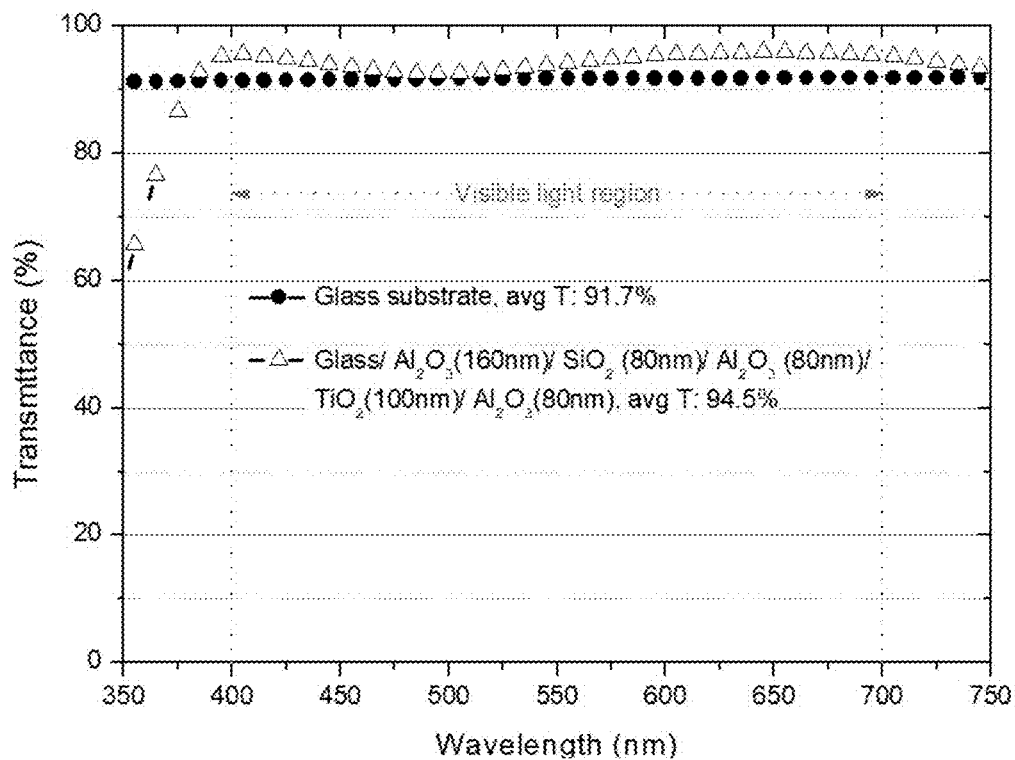
FIG. 63 shows the transmission simulation of the 5-layer AR structure on glass substrate.
Figure 64:
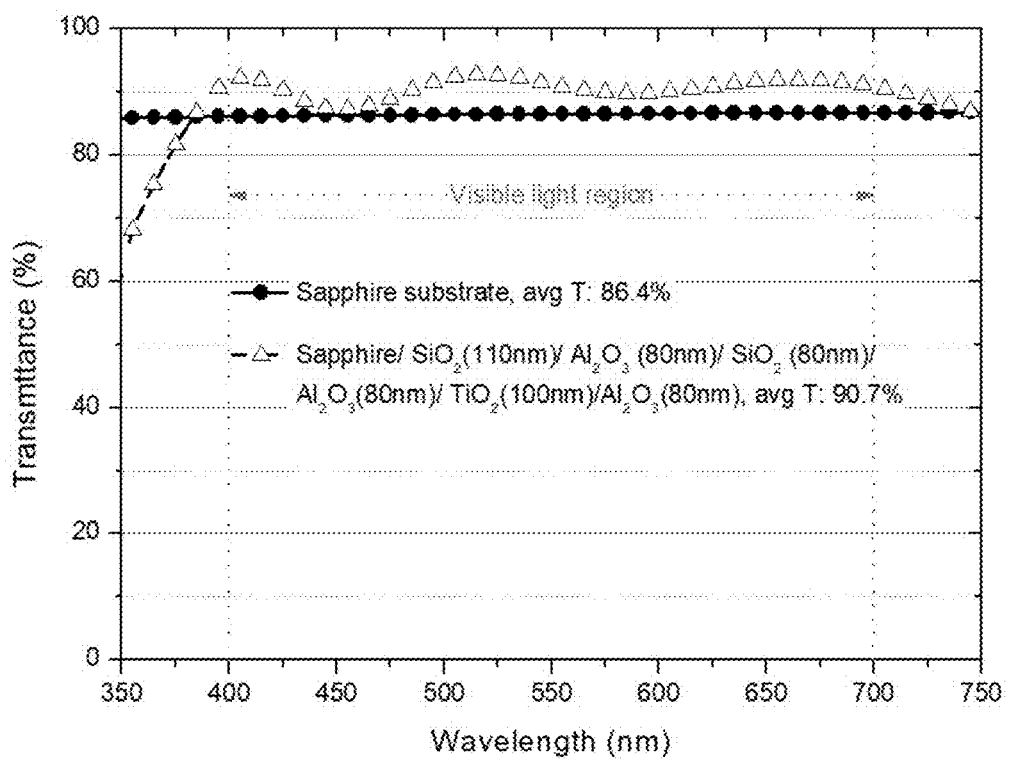
FIG. 64 shows the transmission simulation of the 6-layer AR structure on sapphire substrate.

FIG. 61 and FIG. 62 respectively show embodiments wherein the 5-layer AR structure on glass substrate and 6-layer AR structure on sapphire substrate. $SiO_2$ is regarded as the low refractive index AR layers while $TiO_2$ is adopted as the $2^{nd}$ outermost layer for both structures. Their transmission simulation spectra are shown in FIG. 63 and FIG. 64 respectively.

In general, AR layers compose of alternate $Al_2O_3$ film and low refractive index layer deposition on substrates. For substrates of materials other than sapphire, $Al_2O_3$ AR layer is firstly deposited followed by a low refractive index layer while vice versa for sapphire substrate, i.e. $Al_2O_3$ AR layer is deposited after the low refractive index layer. These sequences can be extended to a higher number of layers. A high refractive index AR layer as the $2^{nd}$ outermost layer is coated on top of the pairs of $Al_2O_3$ and low refractive index layers. Finally, the top most $Al_2O_3$ AR layer is fabricated.

Figure 65:
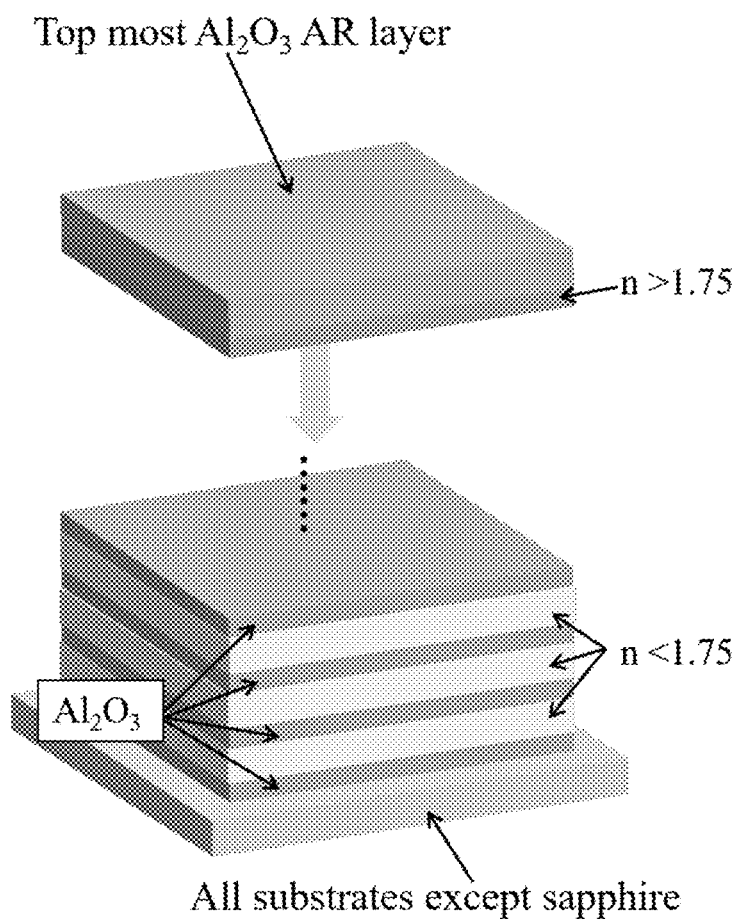
FIG. 65 shows a general AR composition on a substrate of materials other than sapphire.
Figure 66:
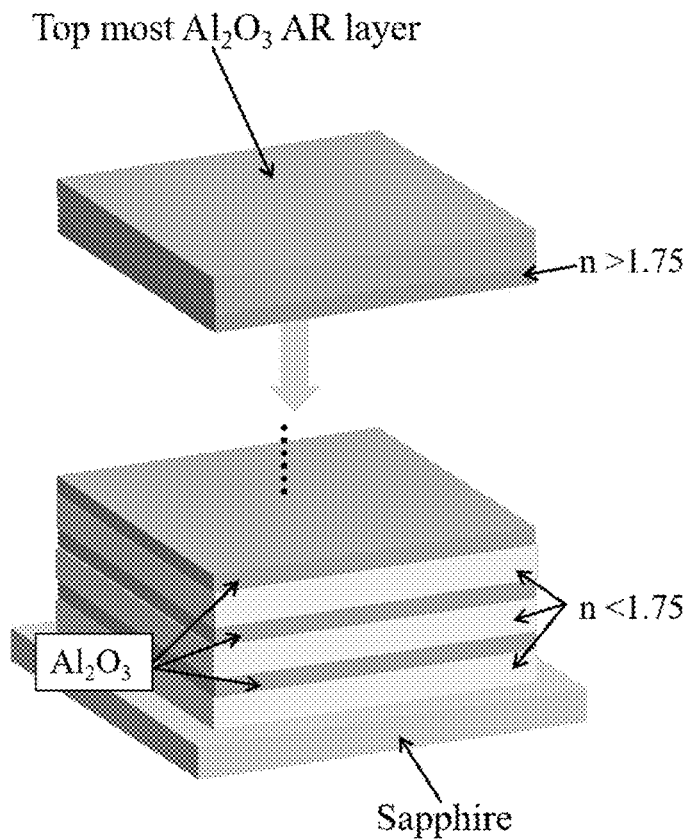
FIG. 66 shows a general AR composition on sapphire substrate.

FIG. 65 and FIG. 66 demonstrate the general embodiment of the present invention with the AR composition substrates of materials other than sapphire, and on sapphire substrates respectively.

Experimental Results Vs. Simulated Transmission

Figure 67:
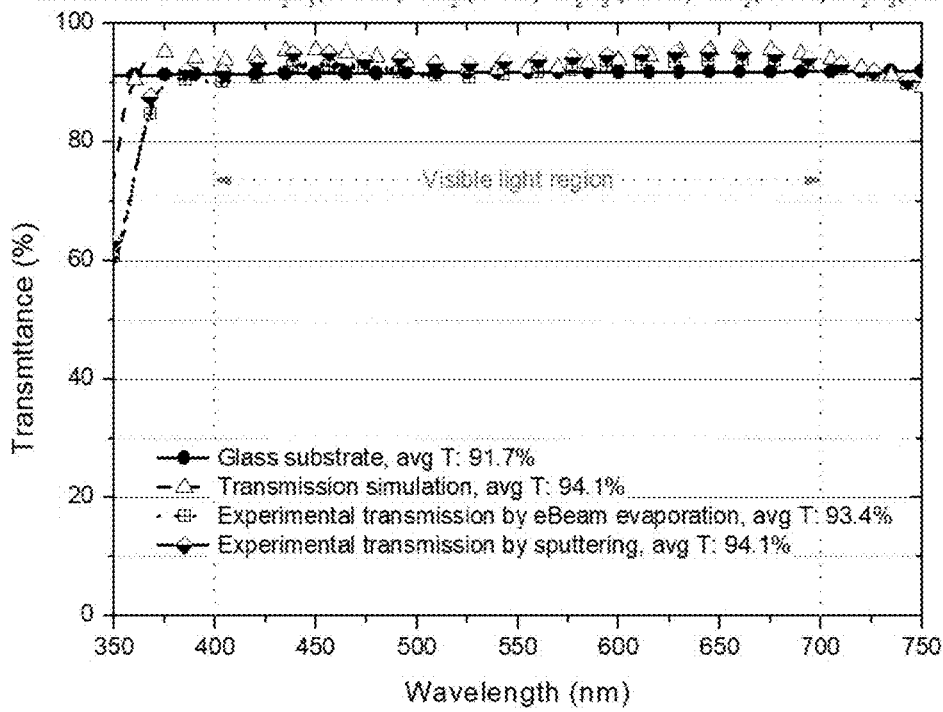
FIG. 67 shows the transmission spectra for simulated and experimental AR structure on glass.

FIG. 67 shows an embodiment with an AR structure of [glass/$Al_2O_3$ (160 nm)/LiF (75 nm)/$Al_2O_3$ (80 nm)/$TiO_2$ (96 nm)/$Al_2O_3$ (75 nm)]. There are transmissions of bare glass substrate, simulation of the particular composition, AR layers coated samples fabricated by electron beam evaporation and by sputtering. Experimental transmissions are in strong agreement with the simulated one shown in FIG. 67. The variation in average transmittance in visible light region is less than 1% by comparing experimental results and simulation data. With the AR structure, more light is transmitting through the substrates from 91.7% to ~94% in visible light range. It was also proven that the AR structure can be fabricated by different physical vapor deposition (PVD) methods such as electron beam evaporation and sputtering.

The current embodiment of the present invention can also be applied on soft, flexible substrates such as polymers, plastics, paper and fabrics.

Modifications and variations such as would be apparent to a skilled addressee are deemed to be within the scope of the present invention.

Another further embodiments of the present invention provide the following:

AR Composition with Diamond-Like Carbon (DLC) Layer

Figure 68:
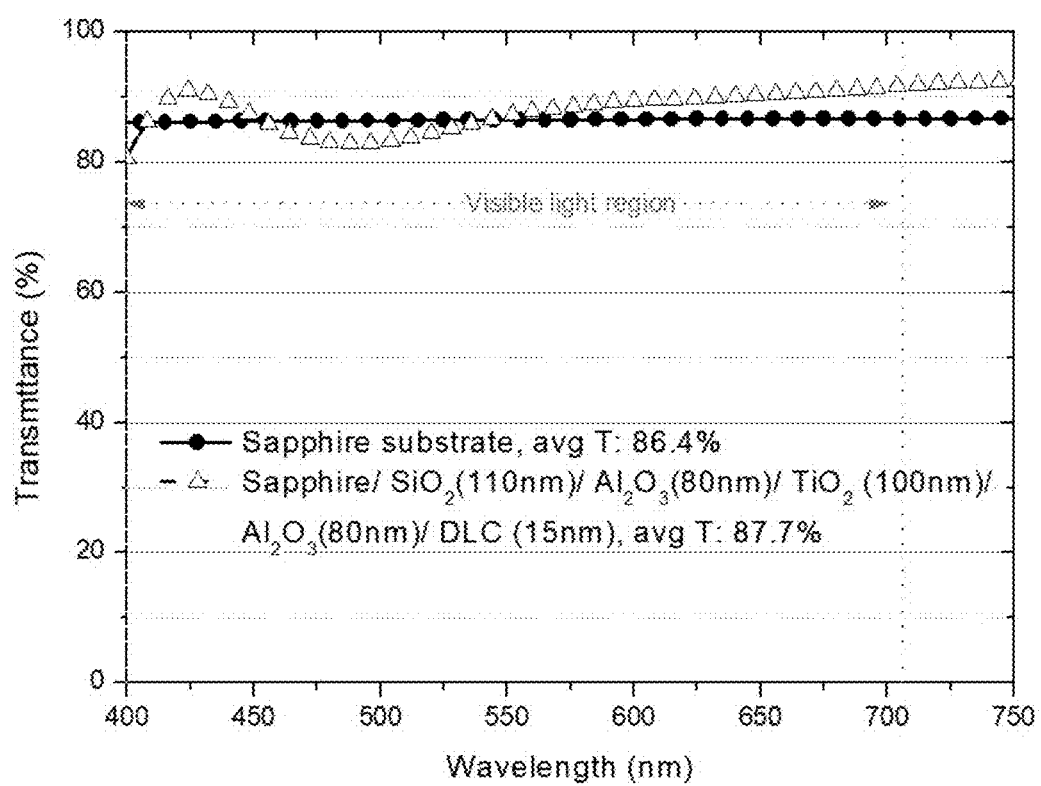
FIG. 68 shows the transmission simulation of 5-layer AR structure on glass substrate.

This AR structure can combine with diamond-like carbon (DLC) layer to have optically reduced reflection. FIG. 68 shows the transmission simulation spectra of an AR structure on sapphire substrate with diamond-like carbon layer in the composition.

Industrial Applicability

The present invention relates to a composition of AR layer that is aimed to match the refractive index of the underlying substrate, e.g. glass, chemically strengthened glass, plastics etc., so as to maximize light transmission through it. For a device having a sapphire film for anti-scratch protection, because sapphire has a different refractive index to that of the underlying substrate, existing AR layer will not function as well as it should; not only the transmitted light is reduced in quantity, its transmitted range is changed such that imaging and/or display color are compromised. Therefore, an integrated AR with sapphire film with the top most AR layer as $Al_2O_3$ which also acts as anti-scratching layer will eliminate this problem. This involves replacing one of the materials of the AR layer by $Al_2O_3$ such that the top most AR layer is $Al_2O_3$ which also acts as anti-scratching layer.

If desired, the different functions discussed herein may be performed in a different order and/or concurrently with each other. Furthermore, if desired, one or more of the above-described functions may be optional or may be combined.

Throughout this specification, unless the context requires otherwise, the word "comprise" or variations such as "comprises" or "comprising", will be understood to imply the inclusion of a stated integer or group of integers but not the exclusion of any other integer or group of integers. It is also noted that in this disclosure and particularly in the claims and/or paragraphs, terms such as "comprises", "comprised", "comprising" and the like can have the meaning attributed to it in U.S. Patent law; e.g., they can mean "includes", "included", "including", and the like; and that terms such as "consisting essentially of" and "consists essentially of" have the meaning ascribed to them in U.S. Patent law, e.g., they allow for elements not explicitly recited, but exclude elements that are found in the prior art or that affect a basic or novel characteristic of the invention.

Furthermore, throughout the specification and claims, unless the context requires otherwise, the word "include" or variations such as "includes" or "including", will be understood to imply the inclusion of a stated integer or group of integers but not the exclusion of any other integer or group of integers.

Other definitions for selected terms used herein may be found within the detailed description of the invention and apply throughout. Unless otherwise defined, all other technical terms used herein have the same meaning as commonly understood to one of ordinary skill in the art to which the invention belongs.

While the foregoing invention has been described with respect to various embodiments and examples, it is understood that other embodiments are within the scope of the present invention as expressed in the following claims and their equivalents. Moreover, the above specific examples are to be construed as merely illustrative, and not limitative of the reminder of the disclosure in any way whatsoever. Without further elaboration, it is believed that one skilled in the art can, based on the description herein, utilize the present invention to its fullest extent. All publications recited herein are hereby incorporated by reference in their entirety.

Citation or identification of any reference in this section or any other section of this document shall not be construed as an admission that such reference is available as prior art for the present application.

What is claimed is:

1. An anti-reflective coating on a substrate comprising a multilayered structure of more than three layers comprising:
   a topmost anti-reflective material layer comprising of sapphire or $Al_2O_3$ on top of one or more anti-reflective material layers with a matching refractive index that is higher than the topmost anti-reflective material layer;
   two or more middle anti-reflective material layers, wherein the middle anti-reflective material layer immediately below the topmost anti-reflective material layer is a second anti-reflective material layer and has a matching refractive index that is higher than that of the topmost anti-reflective material layer; and
   a bottommost anti-reflective material layer below the two or more middle anti-reflective material layers, wherein the bottommost anti-reflective material layer is deposited on top of the substrate;
   wherein the topmost anti-reflective material layer, the two or more middle anti-reflective material layers, and the bottommost anti-reflective material layer have alternatively higher and lower refractive indices in respect with each other,
   wherein the second anti-reflective material layer has a refractive index higher than 1.75 in visible light region, and wherein the second anti-reflective material layer comprises one or more of yttrium aluminium garnet (YAG), AlAs, $ZnSiAs_2$, AgBr, TlBr, C, $B_4C$, SiC, AgCl, TlCl, bismuth germanium oxide (BGO), lead germanium oxide (PGO), CsI, KI, LiI, NaI, RbI, CaMoCL, PbMoCL, SrMoCL, AlN, GaN, $LiNbO_3$, $Sc_2O_3$, ZnO, GaP, $KTaO_3$, and $BaTiO_3$.

2. The anti-reflective coating according to claim 1, wherein the second anti-reflective material layer has a refractive index in a range of 1.75-1.78 in visible light region.

3. The anti-reflective coating according to claim 1, wherein the second anti-reflective material layer comprises $TiO_2$.

4. The anti-reflective coating according to claim 1, wherein said second anti-reflective material layer further comprises $ZrO_2$.

5. The anti-reflective coating according to claim 1, wherein said substrate comprises one or more of glass, sapphire, quartz, fused silica, plastics, and polymethyl methacrylate (PMMA).

6. The anti-reflective coating according to claim 1,
   wherein the bottommost anti-reflective material layer of the multi-layered structure deposited on top of the substrate is $Al_2O_3$; and
   wherein the substrate is not sapphire or $Al_2O_3$.

7. The anti-reflective coating according to claim 6, wherein the multi-layered structured comprises three middle layers of anti-reflective material.

8. The anti-reflective coating according to claim 7, wherein the second anti-reflective material layer comprises $TiO_2$.

9. The anti-reflective coating according to claim 1,
   wherein the bottommost anti-reflective material layer deposited on top of the substrate is not $Al_2O_3$; and
   wherein the substrate is sapphire or $Al_2O_3$.

10. The anti-reflective coating according to claim 9, wherein the multi-layered structured comprises three middle layers of anti-reflective materials.

11. The anti-reflective coating according to claim 10, wherein the second anti-reflective material layer comprises $TiO_2$.

12. The anti-reflective coating according to claim 10, wherein the bottommost anti-reflective material layer deposited on top of the substrate comprises $MgF_2$ or $SiO_2$.

13. The anti-reflective coating according to claim 1, wherein thickness of each of the anti-reflective material layers is at least 10 nm.

14. The anti-reflective coating according to claim 1, wherein thickness of each of the anti-reflective material layers is no more than 800 nm.

15. The anti-reflective coating according to claim 1, wherein each of the anti-reflective material layers with a lower refractive index comprises one or more of $MgF_2$, KCl, NaCl, RbCl, $CaF_2$, KF, $LaF_3$, LiF, $LiCaAlF_6$, NaF, RbF, $SrF_2$, $ThF_4$, $YLiF_4$, $GeO_2$, $SiO_2$, $KH_2PO_4$, and $CS_2$.

16. The anti-reflective coating according to claim 1,
   wherein the topmost anti-reflective material layer comprises sapphire or $Al_2O_3$;
   wherein the second anti-reflective material layer comprises an anti-reflective material with a refractive index higher than that of the topmost anti-reflective material layer;
   wherein the bottommost anti-reflective material layer comprises sapphire or $Al_2O_3$ when said substrate is not sapphire or $Al_2O_3$; and
   wherein one of the middle anti-reflective material layers immediately on top of the bottommost anti-reflective material layer comprises an anti-reflective material with a refractive index higher than that of the bottommost anti-reflective material layer.

17. The anti-reflective coating according to claim 1,
   wherein the topmost anti-reflective material layer comprises sapphire or $Al_2O_3$;
   wherein the second anti-reflective material layer comprises an anti-reflective material with a refractive index higher than that of the topmost anti-reflective material layer;
   wherein the bottommost anti-reflective material layer comprises an anti-reflective material with a refractive index lower than that of the anti-reflective material layer immediately on top of the bottommost anti-reflective material layer when said substrate is sapphire or $Al_2O_3$; and
   wherein one of the anti-reflective material layers immediately on top of the bottommost anti-reflective material layer comprises an anti-reflective material with a refractive index lower than that of the substrate.

18. The anti-reflective coating according to claim 17, wherein the middle anti-reflective material layer immediately on top of the bottommost anti-reflective material layer comprises sapphire or $Al_2O_3$.

19. The anti-reflective coating according to claim 1, wherein said multi-layered structure of anti-reflective material layers is fabricated using physical vapor deposition (PVD) methods comprising one or more of electron beam evaporation and sputtering.

* * * * *